United States Patent
Suhara

(10) Patent No.: US 7,783,213 B2
(45) Date of Patent: Aug. 24, 2010

(54) METHOD AND DEVICE FOR MEASURING SURFACE POTENTIAL DISTRIBUTION, METHOD AND DEVICE FOR MEASURING INSULATION RESISTANCE, ELECTROSTATIC LATENT IMAGE MEASUREMENT DEVICE, AND CHARGING DEVICE

(75) Inventor: Hiroyuki Suhara, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/143,318

(22) Filed: Jun. 20, 2008

(65) Prior Publication Data

US 2008/0253792 A1 Oct. 16, 2008

Related U.S. Application Data

(62) Division of application No. 11/751,671, filed on May 22, 2007, now Pat. No. 7,400,839, which is a division of application No. 11/001,048, filed on Dec. 2, 2004, now Pat. No. 7,239,148.

(30) Foreign Application Priority Data

| Dec. 4, 2003 | (JP) | ............................. 2003-406002 |
| Feb. 9, 2004 | (JP) | ............................. 2004-031910 |
| Mar. 29, 2004 | (JP) | ............................. 2004-094245 |
| Sep. 17, 2004 | (JP) | ............................. 2004-272069 |

(51) Int. Cl.
*G03G 15/00* (2006.01)

(52) U.S. Cl. ............................... 399/48; 399/50; 399/51

(58) Field of Classification Search ................... 399/48, 399/50, 51
See application file for complete search history.

(56) References Cited

U.S. PATENT DOCUMENTS

| 3,373,353 | A | * | 3/1968 | Harris |
| 3,891,316 | A | | 6/1975 | Whited |
| 5,969,355 | A | * | 10/1999 | Fujii et al. |
| 6,118,122 | A | * | 9/2000 | Koyama et al. |
| 6,150,824 | A | | 11/2000 | Mishra et al. |
| 6,477,338 | B2 | | 11/2002 | Hisano et al. |
| 7,054,565 | B2 | * | 5/2006 | Shin |

FOREIGN PATENT DOCUMENTS

| JP | 53-074470 | | 7/1978 |
| JP | 56096260 A | * | 8/1981 |
| JP | 60207164 A | | 10/1985 |
| JP | 63009807 A | * | 1/1988 |

(Continued)

*Primary Examiner*—Susan S Lee
(74) *Attorney, Agent, or Firm*—Oblon, Spivak, McClelland, Maier & Neustadt, L.L.P.

(57) ABSTRACT

A surface potential distribution measurement method and device including setting a sample having a surface with a surface potential distribution in a sample installation unit wherein both an electric field intensity formed on the sample surface and a potential bias component of the sample are variable, and scanning the sample surface in a one-dimensional or two-dimensional manner by irradiating a charged particle beam to the sample. The method also includes obtaining a detection signal from charged particles generated by the scanning, to measure the surface potential distribution of the sample by varying the electric field intensity and the potential bias component in order to control a quantity of the detection signal obtained from the charged particles.

10 Claims, 42 Drawing Sheets

FOREIGN PATENT DOCUMENTS

| | | |
|---|---|---|
| JP | 3-49143 | 3/1991 |
| JP | 10221867 A * | 8/1998 |
| JP | 10-294345 | 11/1998 |
| JP | 11-184188 | 7/1999 |
| JP | 3009179 | 12/1999 |
| JP | 2000113845 A * | 4/2000 |
| JP | 2001-93892 | 4/2001 |
| JP | 2002341607 A * | 11/2002 |
| JP | 2003-295696 | 10/2003 |
| JP | 2003-305881 | 10/2003 |
| JP | 2004-251800 | 9/2004 |

* cited by examiner

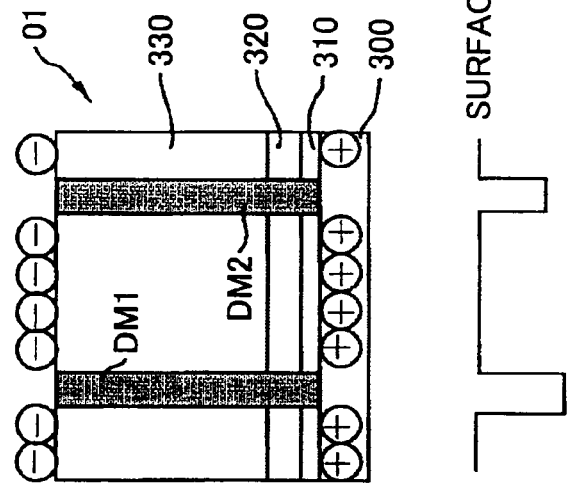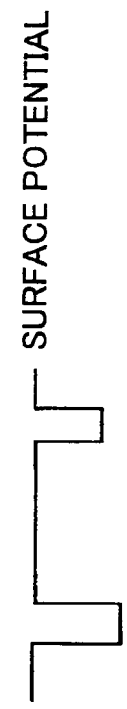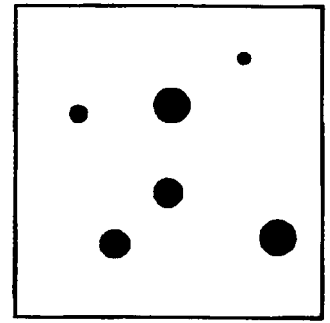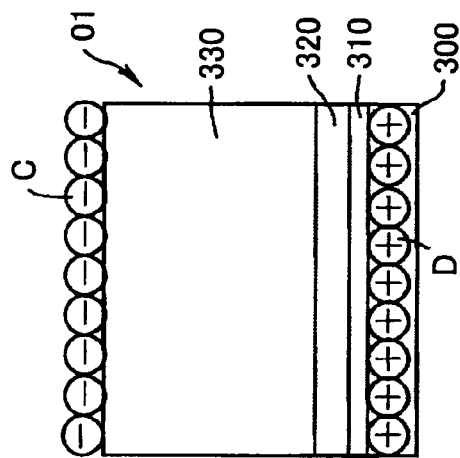

1.2%

0.4%

METHOD AND DEVICE FOR MEASURING SURFACE POTENTIAL DISTRIBUTION, METHOD AND DEVICE FOR MEASURING INSULATION RESISTANCE, ELECTROSTATIC LATENT IMAGE MEASUREMENT DEVICE, AND CHARGING DEVICE

CROSS-REFERENCE TO RELATED APPLICATIONS

The present application is a divisional of U.S. application Ser. No. 11/751,671 filed May 22, 2007 now U.S. Pat. No. 7,400,839, which is a divisional of U.S. application Ser. No. 11/001,048 filed Dec. 2, 2004 now U.S. Pat. No. 7,239,148, and in turn claims priority to JP 2003-406002 filed Dec. 4, 2003, JP 2004-031910 filed Feb. 9, 2004, JP 2004-094245 filed Mar. 29, 2004 and JP 2004-272069 filed Sep. 17, 2004 the entire contents of each of which are hereby incorporated herein by reference.

BACKGROUND OF THE INVENTION

1. Field of the Invention

The present invention relates to a method and device for measuring a surface potential distribution, a method and device for measuring an insulation resistance, an electrostatic latent image measurement device, and a charging device.

2. Description of the Related Art

FIG. 12 shows the composition of an electrophotographic image forming apparatus in which an electrostatic latent image is formed on the photoconductor drum by the imaging process. To output an image by the electrophotographic image forming apparatus, including the copiers and the laser printers, the following imaging process is usually carried out.

As shown in FIG. 12, the image forming apparatus comprises the charging unit 101, the exposure unit 102, the development unit 103, the transfer unit 104, the fixing unit 105, the cleaning unit 106, and the electric erasing unit 107 which are arranged around the photoconductor drum 108. And the imaging process which includes the following steps (1) to (7) is repeated for every image formation:

(1) Charging: the photoconductor is charged uniformly.

(2) Exposure: light is irradiated to the photoconductor, the electric charge is removed partially, and the electrostatic latent image is formed on the photoconductor.

(3) Development: the electrostatic latent image is converted into the visible image by using the charged particles (toner).

(4) Transferring: the visible image developed is transferred to paper or other recording material.

(5) Fixing: the transferred image is heated and is fixed to the recording material.

(6) Cleaning: the remaining toner on the photoconductor is cleaned.

(7) Electric Erasing: the residual charge on the photoconductor is eliminated.

Each process factor and process quality in each of the above steps of the imaging process affect the final output image quality greatly. In recent years, in addition to high image quality, the demands for increasing the durability, the stabilization, and the energy saving, are made, and it is necessary to raise the process quality of each of the above imaging process steps.

In the imaging process, the electrostatic latent image formed on the photoconductor by the exposure is the factor which directly affects the action of the toner particles, and it is necessary to measure accurately the surface potential distribution on the photoconductor surface. For this reason, it is important to evaluate the quality of the electrostatic latent image on the photoconductor. The process quality of each of the imaging process steps can be improved by measuring the electrostatic latent image of the photoconductor and feeding back to the design.

The method of observing or measuring a surface potential distribution on the surface of an object by the scanning of electron beam is known (for example, Japanese Laid-Open Patent Application No. 03-049143).

In this method, the electron beam is scanned on the measurement sample having a surface potential distribution, and the secondary electron generated on the measurement sample associated with the scanning of the electron beam is detected so that the surface potential distribution is observed or measured. The measurement sample used as a candidate for measurement must be, for example, an LSI chip which is capable of retaining electric charge on its surface for a sufficiently long time.

The electrostatic latent image which is formed on the photoconductor drum in the analog or digital electrophotographic copiers or laser printers by the charging and exposure is a factor which directly affects the action of the toner particles, and, for this reason, the quality evaluation of the electrostatic latent image on the photoconductor is important.

If the electrostatic latent image on the photoconductor is measured and the result of measurement can be fed back to the design of the copiers or the printers, then it is possible to attain improvement in process quality in the charging process or the exposure process. Consequently, the further improvement in the quality of image, the durability and stability, or the energy saving can be expected.

However, the electrostatic latent image formed on the photoconductor may disappear for a short time (about dozens seconds) due to the dark decaying of the photoconductor, and there is little time which can be used for the measurement. If the method of Japanese Laid-Open Patent Application No. 03-049143 is used to measure the surface potential distribution, the electrostatic latent image on the photoconductor will disappear in the preparation stage of the measurement, and practically the measurement cannot be performed.

Furthermore, there is proposed the technique of measuring the electrostatic latent image on the photoconductor having the dark decaying (for example, see Japanese Patent Applications No. 2003-295696 and No. 2004-251800 which are assigned to the assignee of the present invention).

The well-known method of measuring the surface potential distribution uses the sensor head, such as the cantilever, which is brought close to the sample having the surface potential distribution, and the electrostatic attraction and induced current produced at that time as the interaction are measured, and the measured current is converted into the potential distribution. For example, the electrostatic-attraction type is marketed as the SPM (Scanning Probe Microscope). And there are some known techniques of the induced current type (for example, Japanese Patent No. 3009179 and Japanese Laid-Open Patent Application No. 11-184188).

However, in order to use the known method, it is necessary to bring the sensor head close to the sample. In order to obtain the 10-micrometer spatial resolution in this case, it is necessary to set the distance between the sensor and the sample to 10 micrometers or less.

When taking into consideration the proximity conditions, there are the following problems. Although the method can be uses for other applications, it cannot practically be used for the measurement of the electrostatic latent image. Namely, the distance measurement is needed absolutely, the measurement takes time and the latent-image state changes during the measurement, the electric discharge and adsorption take place, and the sensor itself disturbs the electric field.

For this reason, the method of visualizing the electrostatic latent image is usually taken as the practical measurement method. That is, the electric charge is given to the toner in the form of colored powder-like particles, the development is performed by the Coulomb force which works between the charged toner and the electrostatic latent image, and the surface potential distribution of the electrostatic latent image is measured by transferring this toner image to the paper or the recording tape.

However, according to the above method, there is the problem that it does not mean the measurement of the surface potential distribution of the electrostatic latent image itself since the measurement is performed after the processes of development and transferring are performed, As mentioned above, practically the electrostatic latent image cannot be measured by the method of irradiating the electron beam to the sample which is capable of retaining electric charge on its surface (the LSI chip), and the method of bringing the sensor head, such as the cantilever, close to the sample, and measuring the electrostatic attraction and the induced current.

To overcome the above problem, there is proposed the technique of measuring the electrostatic latent-image distribution in which the charged particle beam or electron is irradiated, in advance, to the sample (for example, Japanese Laid-Open Patent Applications No. 2003-295696 and No. 2003-305881 which are assigned to the assignee of the present invention). In addition, the electrostatic latent image means the image in the state where the electric charge is distributed over the dielectric substance.

Namely, in the proposed technique, if the potential distribution occurs on the surface of the sample when the electron is irradiated, the electric field distribution according to the surface potential distribution is formed in space. For this reason, the secondary electron generated by the incident electron is put back by the electric field, and the quantity of the secondary electron which reaches the detector is decreased.

By using the above-described feature, the portion with the high field intensity becomes dark and the portion with the low field intensity becomes bright so that the contrast is formed, and the contrast image according to the surface potential distribution can be detected. Therefore, the exposed portion becomes black and the non-exposed portion becomes white after the exposure, so that the thus formed electrostatic latent image can be measured.

FIG. 13 shows the relation between the measured electric field intensity obtained by detecting the secondary electron generated by the incident electron and the light-and-dark image produced according to the surface potential distribution.

It is possible to measure the electrostatic latent image by using the above method. However, as shown in FIG. 13, even if the electric field intensity is high, the contrast image will not necessarily become the luminance signal proportional to the electric field intensity, and the contrast image is likely to become the light-and-darkness image with the tendency of the binary signal.

In addition, it is assumed that, concerning the electric field intensity described, the sign of the electric field vector on the side of the incidence electron in the direction perpendicular to the sample surface is positive.

As for the contrast image of lightness and darkness, as illustrated, the threshold level is in the vicinity of the level where the electric field intensity is zero. However, there is the electric field intensity (Eth) which is required for attachment of the charged particles (toner) in the actual electrophotographic printing process, and it is important to measure the diameter of the latent image at the level of Eth.

If the electric field intensity distribution can be approximated with a smooth curve like the Gaussian distribution, it is possible to compute the diameter of the latent image at the Eth level. However, the error components may be contained in the actual case, and it does not usually become the smooth curve like the Gaussian distribution. Acquiring directly the image as the contrast image at the Eth level is necessary for the practical case.

Moreover, FIG. 14 shows the image acquisition method (Japanese Laid-Open Patent Application No. 03-049143) in which the back bias voltage is applied in the composition of the sample and the electrode. In this image acquisition method, the voltage of the back bias is applied to the back surface of the sample 32 in order to obtain a proper potential distribution, and the electrostatic latent image according to the applied electron beam is acquired.

However, in this method, the electric field intensity on the front surface of the sample is not affected even when the voltage of the back bias is applied to the back surface of the sample 32. The effect that the threshold level of the potential distribution is changed cannot be produced. In addition, in the composition of FIG. 14, the reference numeral 33 denotes the conductor, 34 denotes the secondary electron detector, 35 denotes the power supply, and 37 denotes the objective lens, respectively.

SUMMARY OF THE INVENTION

An object of the present invention is to provide an improved surface potential distribution measuring technique in which the above-described problems are eliminated.

Another object of the present invention is to provide a surface potential distribution measurement method and device which can measure the surface potential distribution of an object with high precision without being influenced by the secondary electron.

Another object of the present invention is to provide a surface potential distribution measurement method and device which can measure the surface potential distribution of the electrostatic latent image formed on the photoconductor having the dark decaying with high precision.

Another object of the present invention is to provide a surface potential distribution measurement method and device which can measure the surface potential distribution on the surface of the dielectric substance with high resolution in the order of micrometers.

Another object of the present invention is to provide a surface potential distribution measurement method and device which can measure the electrostatic latent image on the surface of the photoconductor with high precision in the order of micrometers.

Another object of the present invention is to provide an insulation resistance measurement method and device which can measure the insulation resistance of a sample, such as a photoconductor, with high precision in the order of micrometers.

Another object of the present invention is to provide a charging device which efficiently charges the sample surface to the desired potential with high precision.

Another object of the present invention is to provide an electrostatic latent image measurement device which efficiently charges the surface of a latent-image support object to the desired potential with high precision.

The above-mentioned objects of the present invention are achieved by a method of measuring a surface potential distribution, the method comprising the steps of: scanning a sample having a surface with a surface potential distribution using a charged particle beam in a two-dimensional manner; obtaining a detection signal caused by the two-dimensional scanning, to measure the surface potential distribution; and detecting charged particles, other than charged particles of the charged particle beam incident to the sample surface by the two-dimensional scanning, with which components of an incidence velocity vector of the charged particles in a direction perpendicular to the sample surface are reversed, so that a detection signal indicating an intensity according to the detected charged particles is obtained in correspondence with a position on the sample surface.

The above-mentioned objects of the present invention are achieved by a device for measuring a surface potential distribution, the device comprising: a charged particle beam scanning unit scanning a sample having a surface with a surface potential distribution using a charged particle beam in a two-dimensional manner; a capture unit capturing charged particles, other than charged particles of the charged particle beam incident to the sample surface by the two-dimensional scanning, with which components of an incidence velocity vector of the charged particles in a direction perpendicular to the sample surface are reversed; and a measurement unit obtaining a detection signal indicating an intensity according to the captured charged particles in correspondence with a position on the sample surface, so that the surface potential distribution is measured with the detection signal.

According to the preferred embodiment of the present invention, the charged particle detected is the charged particle which constitutes the charged particle beam which scans the sample surface, and is not the secondary electron generated on the sample surface. Since the secondary electron does not arise, it is possible to measure the surface potential distribution easily and accurately. Moreover, the measurement appropriate for the electrostatic latent image formed on the photoconductor sample can be performed.

The above-mentioned objects of the present invention are achieved by a method of measuring a surface potential distribution, the method comprising the steps of: setting a sample having a surface with a surface potential distribution in a sample installation unit wherein both an electric field intensity formed on the sample surface and a potential bias component of the sample are variable; scanning the sample surface in a one-dimensional or two-dimensional manner by irradiating a charged particle beam to the sample; and obtaining a detection signal from secondary charged particles generated by the scanning, to measure the surface potential distribution of the sample, wherein the measurement is performed by varying the electric field intensity and the potential bias component in order to control a quantity of the detection signal obtained from the secondary charged particles.

The above-mentioned objects of the present invention are achieved by a method of measuring a surface potential distribution, the method comprising the steps of: setting a sample having a surface with a surface potential distribution in a sample installation unit wherein both an electric field intensity formed on the sample surface and a potential bias component of the sample are variable; scanning the sample surface in a one-dimensional or two-dimensional manner by irradiating a charged particle beam to the sample; obtaining a detection signal from secondary charged particles generated by the scanning, to measure the surface potential distribution of the sample, wherein the measurement is performed repeatedly by varying the electric field intensity and the potential bias component at a plurality of times in order to control a quantity of the detection signal obtained from the secondary charged particles, so that a profile of the surface potential distribution is computed based on a plurality of measurement results thus obtained.

The above-mentioned objects of the present invention are achieved by a device for measuring a surface potential distribution in which a sample having a surface with a surface potential distribution is set in a sample installation unit, wherein both an electric field intensity formed on the sample surface and a potential bias component of the sample are variable, the device comprising: a charged particle beam scanning unit scanning the sample surface in a one-dimensional or two-dimensional manner by irradiating a charged particle beam to the sample; a detector capturing secondary charged particles generated in conformity with the surface potential distribution of the sample by the scanning; a measurement unit obtaining a detection signal, indicating an intensity according to the captured secondary charged particles, in correspondence with a position on the sample surface, to measure the surface potential distribution of the sample; an electric field intensity control unit varying the electric field intensity in order to control a quantity of the detection signal obtained; and a potential bias control unit varying the potential bias component in order to control a quantity of the detection signal obtained.

The above-mentioned objects of the present invention are achieved by a device for measuring an electrostatic latent image distribution of a photoconductor, the device comprising: a charging unit creating an electric charge on a surface of a photoconductor sample by irradiating an electron beam to the photoconductor sample; an optical-system unit scanning the surface of the sample by irradiating light to the sample so that an electrostatic latent image is formed on the sample surface; a sample installation unit in which the sample is set, wherein both an electric field intensity formed on the sample surface and a potential bias component of the sample are variable; a detector capturing secondary charged particles generated in conformity with an electrostatic latent-image distribution of the sample by the scanning; a measurement unit obtaining a detection signal, indicating an intensity according to the captured secondary charged particles, in correspondence with a position on the sample surface, to measure the electrostatic latent-image distribution of the sample; an electric field intensity control unit varying the electric field intensity in order to control a quantity of the detection signal obtained; and a potential bias control unit varying the potential bias component in order to control the quantity of the detection signal obtained.

According to the preferred embodiment of the present invention, the surface potential distribution in the vertical direction of the dielectric-substance sample can be measured with high resolution in the order of micrometers.

The above-mentioned objects of the present invention are achieved by an insulation resistance measuring method comprising the steps of: charging a surface of a sample to give an electric field intensity in a thickness direction of the sample; scanning the charged surface of the sample in a two-dimensional manner by irradiating a charged particle beam to the sample; obtaining a detection signal generated by the scanning; and measuring a dielectric intensity of the sample based on the detection signal obtained.

The above-mentioned objects of the present invention are achieved by an insulation resistance measurement device comprising: a support unit holding a sample whose dielectric intensity is to be measured; a charging unit charging a surface of the sample held by the support unit and giving an electric field intensity in a thickness direction of the sample; a scanning unit scanning the charged surface of the sample in a two-dimensional manner by irradiating a charged particle beam to the sample; a signal-detection unit obtaining a detection signal generated by the scanning of the scanning unit; and a measurement unit measuring the dielectric intensity of the sample based on the detection signal obtained by the signal-detection unit.

The above-mentioned objects of the present invention are achieved by a latent-image support object having a dielectric intensity measured by an insulation resistance measuring method, wherein the insulation resistance measuring method comprises the steps of: charging a surface of the latent-image support object to give an electric field intensity in a thickness direction of the latent-image support object; scanning the charged surface of the latent-image support object in a two-dimensional manner by irradiating a charged particle beam to the latent-image support object; obtaining a detection signal generated by the scanning; and measuring the dielectric intensity of the latent-image support object based on the detection signal obtained, wherein the latent-image support object has a percentage of an insulation resistance region which is 99% or more when the electric field intensity given in the thickness direction of the latent-image support object is above 30 V/micrometer and below 40 V/micrometer and an amount of electric charge irradiated to the latent-image support object is above 1E-8 coulomb/mm$^2$.

According to the preferred embodiment of the present invention, it is possible to measure the insulation resistance of the photoconductor, with high precision in the order of micrometers.

The above-mentioned objects of the present invention are achieved by a charging device which creates electric charge on a beam-irradiation-side surface of a sample by irradiating a negative charged particle beam, including electrons or negative charged ions, to the sample, wherein the charging device is provided to meet the conditions E1>E0−Vg, E0>0, and E1>0 where E0 is an acceleration voltage of electrons at which a secondary-electron-emission ratio of the same is equal to 1 when a back surface of the sample opposite to the beam-irradiation-side surface is grounded, E1 is an acceleration voltage for accelerating negative charged particles of the beam, and Vg is a back potential applied to the back surface, so that a desired negative charging potential is formed on the sample.

The above-mentioned objects of the present invention are achieved by an electrostatic latent-image measurement device comprising: a charging device creating electric charge on a beam-irradiation-side surface of a sample by irradiating a negative charged particle beam, including electrons or negative charged ions, to the sample; and an exposure optical system irradiating light to the charged surface of the sample so that an electrostatic latent image according to an electric charge distribution of the sample surface is formed, wherein the charging device is provided to meet the conditions E1>E0−Vg, E0>0 and E1>0 where E0 is an acceleration voltage of electrons at which a secondary-electron-emission ratio of the same is equal to 1 when a back surface of the sample opposite to the beam-irradiation-side surface is grounded, E1 is an acceleration voltage for accelerating negative charged particles of the beam, and Vg is a back potential applied to the back surface, so that a desired negative charging potential is formed on the sample.

According to the preferred embodiment of the present invention, it is possible to efficiently charge the sample surface to the desired potential with high precision by setting up the back potential Vg appropriately.

BRIEF DESCRIPTION OF THE DRAWINGS

Other objects, features and advantages of the present invention will be apparent from the following detailed description when reading in conjunction with the accompanying drawings.

FIG. 28A, FIG. 28B and FIG. 28C are diagrams for explaining the leakage of the electric charge by the breakdown in the photoconductor of function separation type.

DETAILED DESCRIPTION OF THE PREFERRED EMBODIMENTS

A description will now be given of the preferred embodiments of the invention with reference to the accompanying drawings.

Figure 1A:
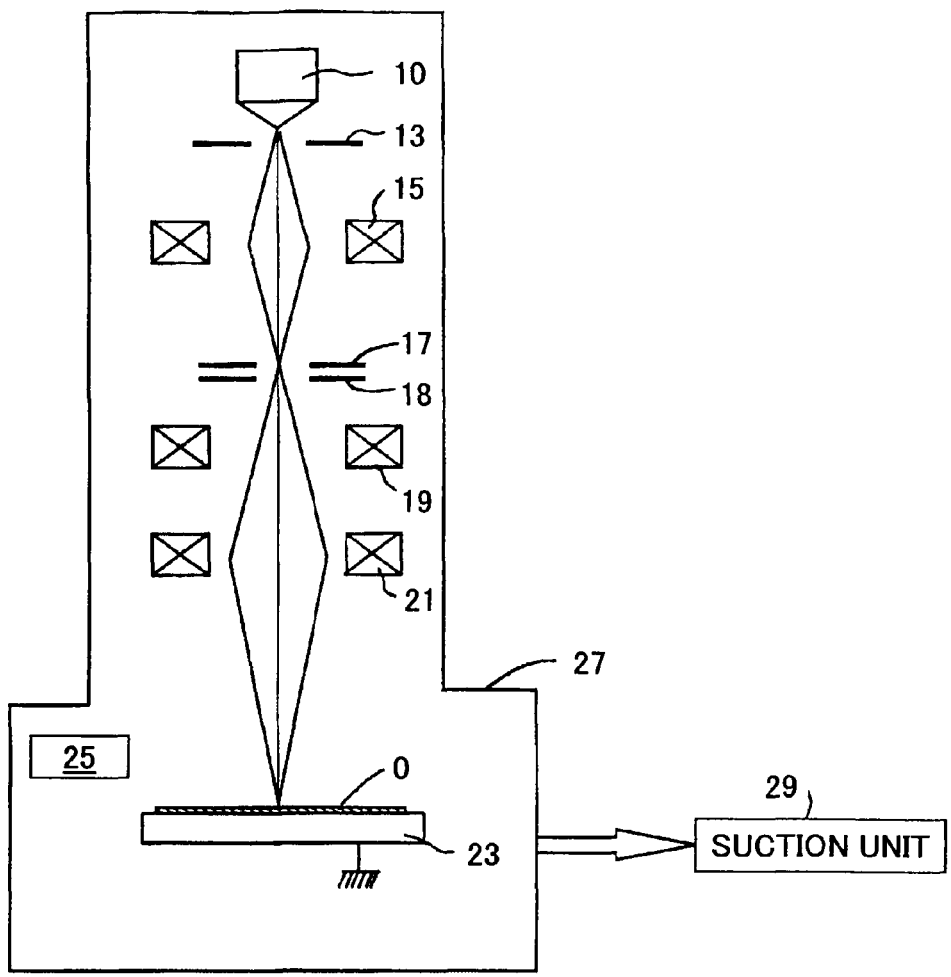
FIG. 1A and FIG. 1B are diagrams showing the composition of the surface potential distribution measurement device in the preferred embodiment of the invention.

FIG. 1A shows the composition of the surface potential distribution measurement device in the preferred embodiment of the invention. The surface potential distribution measurement device is provided to measure the surface potential distribution of the sample 0. The respective components of this device are accommodated in the sealed casing 27, and the inside of the sealed casing 27 can be decompressed to the substantially vacuum state by using the suction unit 29.

When the sample 0 is the electrophotographic photoconductor (photoconductive sample), the electrostatic latent-image formation unit which will be described later is also arranged in the sealed casing 27.

In the example of FIG. 1A, it is assumed that a surface potential distribution is formed on the sample 0, and the inside of the sealed casing 27 is decompressed.

In the present embodiment, the electron beam is used as a charged particle beam which scans the sample 0 in a two-dimensional manner. Namely, the electron beam is generated by the electron gun 10, and it passes through the beam monitor 13. The electron beam further passes and is converged at the position of the aperture 17 and the beam blanker 18 by the condenser lens 15, and it is deflected in a two-dimensional manner by the scanning lens 19 of the deflecting coil. The thus deflected electron beam is converged at the surface of the sample 0 by the objective lens 21.

The beam monitor 13 is provided to monitor the intensity of the electron beam emitted by the electron gun 10. The aperture 17 is provided to control the current density (the number of irradiation particles per unit time) of the electron beam irradiated to the sample 0. The beam blanker 18 is provided to switch on and off the irradiation of the electron beam.

The respective parts which are arranged around the irradiation path of the electron beam between the electron gun 10 and the sample 0 are electrically connected to the power supply which is not illustrated, and these are controlled by the control unit, such as the computer which is not illustrated.

With the above composition of the surface potential distribution measurement device, the electron beam which is deflected in a two-dimensional manner by the scanning lens 19 scans the surface of the sample 0 in a two-dimensional manner.

In the example of FIG. 1A, the surface or near the surface of the sample 0 having the surface potential distribution is charged to negative polarity, and the sample 0 has the surface potential distribution according to the charged state.

As shown in FIG. 1A, the back surface of the sample 0 is supported by the support part 23. The support part 23 is made of a conductive plate-like material, and it is grounded. The surface potential distribution of the sample 0 forms the potential barrier which causes a strong restitution to act on each electron of the electron beam in the close vicinity of the surface of the sample 0.

Figure 1B:
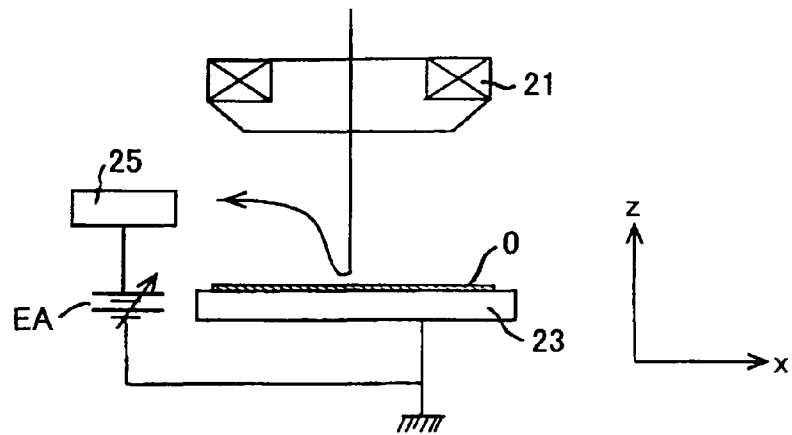

As shown in FIG. 1B, it is assumed that the direction of z is taken to be perpendicular to the surface of the sample 0, the x axis and the y-axis are taken to be parallel to the sample surface, and the coordinates (x, y) are set on the surface of the sample 0. The direction of y is taken to be perpendicular to the surface of the drawing.

At this time, if the region S which is scanned by the electron beam in a two-dimensional manner is represented by S (x, y) using the 2-dimensional coordinates, the conditions: 0 mm≦x≦1 mm. 0 mm≦y≦1 mm are set. The surface potential distribution currently formed in this region S (x y) is represented by V (x, y) (<0).

Assuming that T is the time between the start T0 and the end TF of the 2-dimensional scanning of the sample 0 by the electron beam, the condition T0≦T≦TF is set, and there is the one-to-one correspondence between the time: T the scanning is performed and each scanning position of the scanning region: S (x y).

FIG. 1B is a diagram for explaining the situation in the vicinity of the sample surface. The size of the scanning region S of the sample 0 is variable with the setting of the magnification of the scanning lens 19. For example, the size of the scanning region S may be varied from the low magnification of about 5 mm by 5 mm to the high magnification of about 1 micrometer by 1 micrometer. The situation of the scanning region S is observable with the arbitrary magnification.

The speed of the electron beam emitted by the electron gun 10 is set to v, and the components of the speed v in the directions x, y, z are set to vx, vy, vz, respectively. Strictly speaking, the speed components vx, vy, and vz of each electron in the electron beam vary in connection with the scanning of the electron beam. However, in the size of the actual measurement device, the distance from the objective lens 21 to the surface of the sample 0 is some hundreds millimeters, and the scanning region of the sample 0 is the size of about 5 mm×5 mm. Under such conditions, it is possible to consider vx=vy=0 and vz=v substantially.

At this time, the kinetic energy of each electron which hits the surface of the sample 0 in the electron beam scanned is represented by $mv^2/2$ where m is the mass of the electron. It is equal to the product of the acceleration voltage Va of the accelerator provided in the electron gun 10 and the electron charge e, and the equation: $mv^2/2=eVa$ is met.

The surface potential distribution V (x, y) currently formed in the scanning region S (x, y) of the sample 0 has the same polarity as the electron and acts as the potential barrier to the electron. If the condition: $mv^2/2=eVa>-eV(x, y)$ is met, then the electron of the electron beam passes the potential barrier and arrives at the surface of the sample 0.

On the contrary, if the condition: $mv^2/2=eVa<-eV(x. y)$ is met, then the electron of the electron beam is slowed down by the potential barrier, the speed:vz of the electron is set to 0, and the electron is pushed back in the direction of incidence by the surface potential of the sample 0. That is, the speed:vz of the electron pushed back in this way (which is the components of the incidence velocity vector of the charged particle beam in the direction perpendicular to the sample surface) is reversed from the direction at the time of incidence to the opposite direction.

Figure 2A:
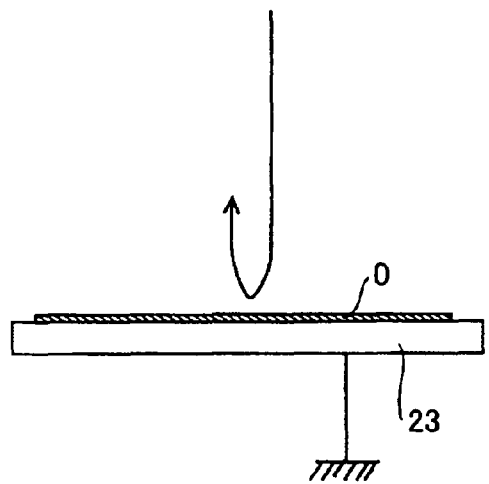
FIG. 2A and FIG. 2B are diagrams for explaining the principle of measurement of surface potential distribution.
Figure 2B:
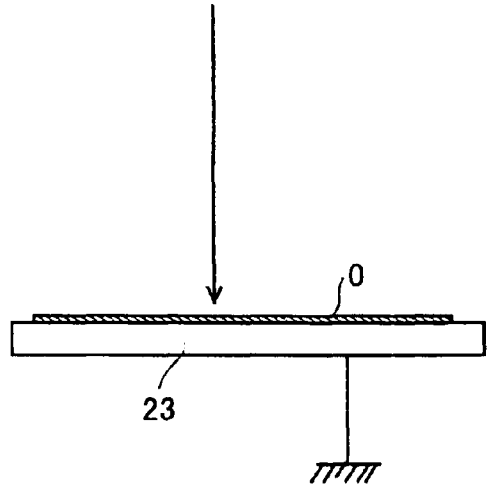

FIG. 2A and FIG. 2B are diagrams for explaining the above-mentioned situations. FIG. 2A shows the case where the electronic speed vz is reversed from the direction at the time of incidence under the condition: Va<−V (x, y). FIG. 2B shows the case where the electron of the electron beam passes the potential barrier and arrives at the surface of the sample 0 under the condition: Va>−V (x, y).

In the above-described surface potential distribution measurement device, the electron (which is called the speed components reversal electron) whose components vz of the incidence velocity vector in the direction (the direction of z) perpendicular to the sample surface are reversed by the restitution of the surface potential distribution: V (x y) is captured by the detector 25 (FIG. 1B).

As shown in FIG. 1B, the drawing-in voltage of the reverse polarity (positive polarity) to the polarity of the electron is applied to the detector 25 by the power supply EA, and the speed components reversal electron is captured with this drawing-in voltage.

The captured speed components reversal electron is amplified by the electron multiplier etc., and is converted into a detection signal according to the intensity (the number of the speed components reversal electrons captured per unit time).

Since the speed components reversal electron captured by the detector 25 is opposed by the surface potential distribution: V (x y) of the sample 0, the intensity F (T) of the speed components reversal electron captured at time T has the correspondence relation with the surface potential distribution: V{x (T), y (T)} having the parameter of the time T.

In the above-described example, the speed components reversal electron captured by the detector 25 satisfies the condition Va<−V(x, y), the measurement result means that the surface potential distribution: V (x y) of the sample 0 is divided into two regions with the acceleration voltage Va of the electron gun 10 being considered a threshold of measurement.

Namely, among the scanning region S (x, y), the region where the speed components reversal electron is captured is the region of the surface potential distribution under the condition: −V(x y)>Va, and the region where the speed components reversal electron is not captured is the region of the surface potential distribution under the condition: −V(x y)<Va.

Therefore, by sampling the detection signal outputted from the detector 25 at a suitable interval, it can be determined whether −V (x y) for every small region corresponding to the sampling is larger than the threshold Va or not.

In the above-described embodiment, the case where the electron beam is used as the charged particle beam has been described. Alternatively, if a liquid-metal ion gun which generates an ion beam is used instead of the electron gun 10 of the above embodiment, it is possible to perform the measurement in which the ion beam is used as the charged particle beam.

In the case of the surface-potential distribution of the sample 0 under the condition V(x, y)>0, what is necessary is just to use the ions or protons of the positive polarity, such as gallium, as the charged particles of the charged particle beam.

Generally, when the maximum of the absolute value of the surface potential distribution V (x, y) is set to Max|V(x, y)|, the scanning of the charged particle beam is performed on the condition that the acceleration voltage Va is Max|V(x, y)|, and it can be determined where the measured surface potential V (x y) is larger than the threshold Va of measurement.

Figure 3:
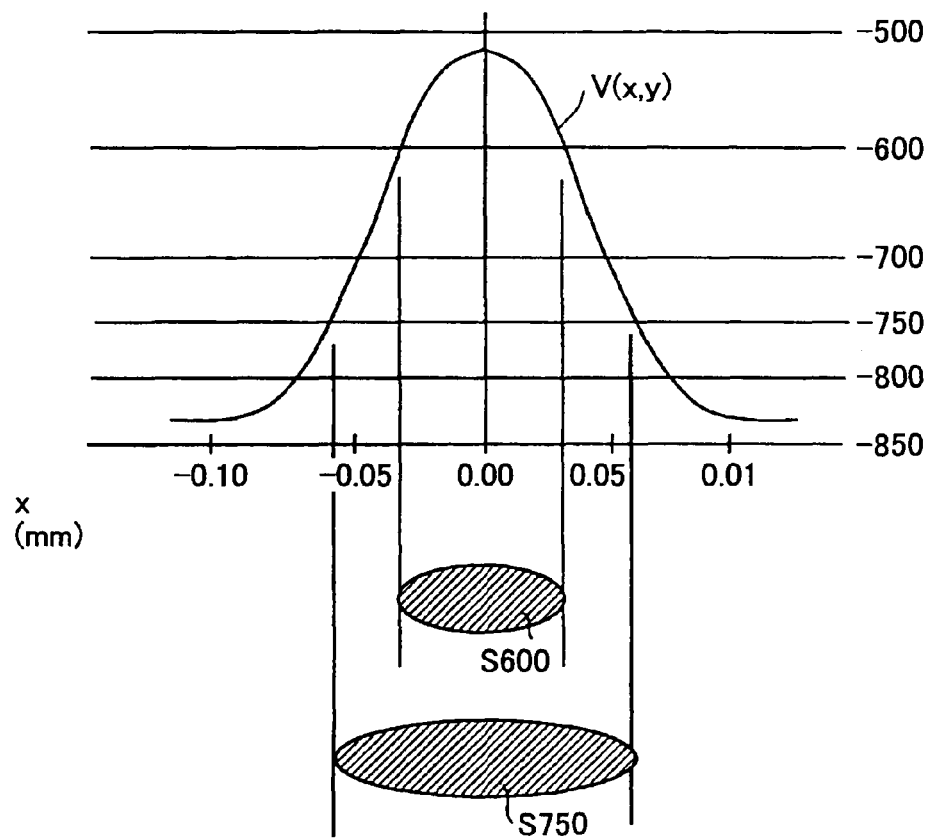
FIG. 3 is a diagram for explaining the measurement of surface potential distribution.

In the surface potential distribution V (x, y) (negative polarity) of FIG. 3, the potential distribution of the surface of the sample 0 when the back surface of the support part 23 which supports the sample 0 is grounded is illustrated. The surface potential at the center of the potential distribution (x=0) is about −520V, and the surface potential becomes large in the minus direction and is equal to about −830V in the circumference region that is distant from the center 0.01 mm or more.

In FIG. 3, the region S600 of the surface-potential distribution under the condition V(x y)>−600V as a result of the measurement which is performed by setting the acceleration voltage Va to −600V, and the region S750 of the surface-potential distribution under the condition V(x y)>−750V as a result of the measurement which is performed by setting the acceleration voltage Va to −750V are illustrated. In these regions S600 and S750, there are very few electrons which are detected by the detector 25.

If the measurement is performed repeatedly by varying the acceleration voltage Va in a plurality of steps, the regions into which the surface potential distribution V (x y) is divided are obtained for every acceleration voltage Va (or the threshold of measurement) for every measurement, the overall state of the surface potential distribution V (x y) can be determined based on the plurality of measurement results. It is a matter of course that, if the step in which the acceleration voltage Va is varied is made fine and the number of repeated measurements is increased, accurate measurement is attained.

In the above embodiment, the acceleration voltage Va of the accelerator provided in the electron gun 10 is varied, so that the threshold of measurement (the voltage used to separate the charged particles whose speed components of the charged particle beam in the direction perpendicular to the surface of the sample are reversed, from the charged particles which are not reversed and are incident to the sample surface) is varied.

Alternatively, it is possible to use another method of changing the threshold of measurement according to the invention, and in this alternative method a uniform bias potential is applied to the surface potential distribution on the surface of the sample.

Figure 4:
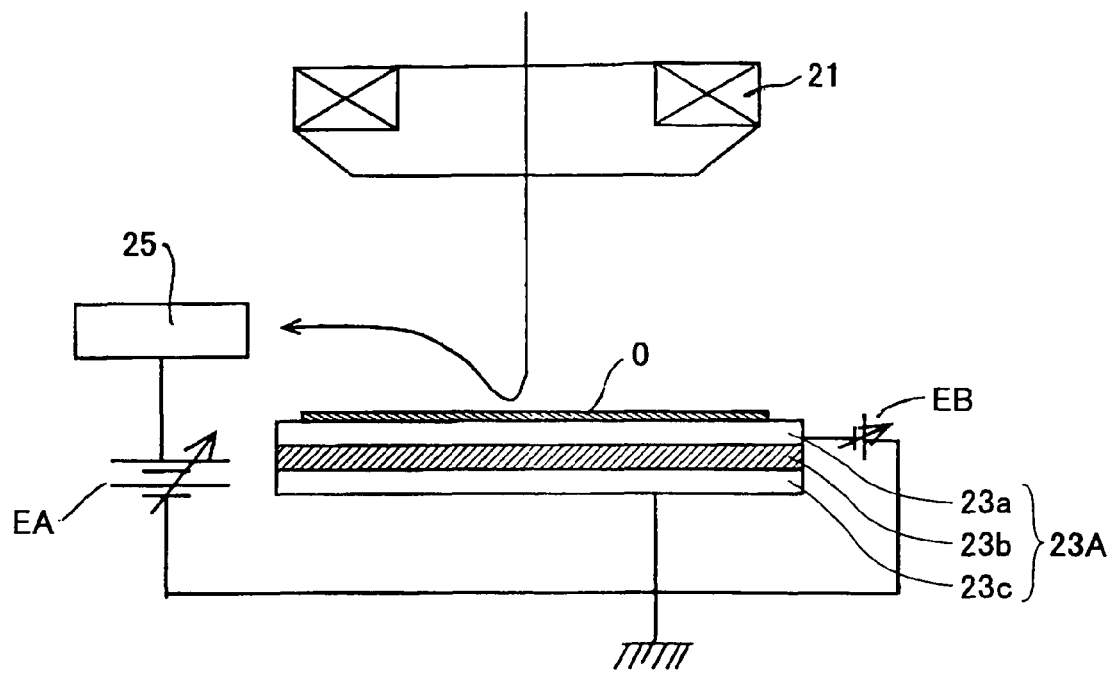
FIG. 4 is a diagram for explaining the application of uniform bias potential to the surface potential distribution on the surface of the sample.

FIG. 4 shows the application of uniform bias potential to the surface potential distribution on the surface of the sample in the preferred embodiment of the invention. In FIG. 4, the support part 23A which supports the back surface of the sample 0 has the three layer structures in which the dielectric layer 23b is inserted between the electric conduction layers 23a and 23c, and the electric conduction layer 23c is grounded and the bias voltage from the variable direct current power supply EB is applied to the electric conduction layer 23a.

If the bias voltage is applied to the electric conduction layer 23a, the surface potential distribution on the surface of the sample 0 is changed to the state in which the uniform bias potential is superimposed to the surface potential distribution of the sample 0.

In the case where the electron beam is used as the charged particle beam, the acceleration voltage Va of the electron beam is enlarged beforehand and the polarity of the bias voltage applied to the electric conduction layer 23a is set to the negative polarity, so that the bias potential which repels the electrons that are incident as the electron beam is formed.

If the potential which is superimposed by the application of the bias voltage is set to VB (<0) and the actual surface potential distribution of the sample 0 is indicated by V (x, y), the electric field which acts on the incidence electrons in the vicinity of the surface of the sample 0 is set to V(x, y)+VB. If the acceleration voltage Va (which value is assumed to be fixed) is smaller than −{V (x, y)+VB}, the electrons will be the speed components reversal electrons, and will be detected by the detector 25. On the contrary, if the acceleration voltage Va is larger than −{V (x, y)+VB}, the electrons will arrive at the surface of the sample 0.

For example, if the acceleration voltage Va=1.6 kV is set up and −1000V is applied as the bias voltage VB in the example of FIG. 3, the region S600 of FIG. 3 which is the region where the speed components reversal electrons which are repelled by the sample surface are not detected is obtained. If the bias voltage VB is set to −850V, the region S750 of FIG. 3 is obtained as the region where the speed components reversal electrons are not detected. Alternatively, if the acceleration voltage Va is varied from 1.6 kV to 1.75 kV and the bias voltage VB is maintained at −1000V, the region S750 can be obtained also.

In addition, when measuring the potential distribution by the conductor pattern in the case where the sample is the electric conduction object, it is possible to use either the method of applying the bias voltage to the back surface, or the method of applying the bias voltage to the voltage of the conductor itself.

When changing the threshold of measurement by changing the bias voltage and/or the acceleration voltage while applying the bias voltage, and the electric charge polarity of the charged particle in the charged particle beam and the polarity of the surface potential of the sample 0 are reverse polarity, the measurement of the surface potential distribution is attained.

For example, in the case of the surface potential distribution V(x y) of the sample >0, the acceleration voltage Va of the electron beam and the bias voltage: VB (<0), depending on whether the condition Va<V(x, y)−VB or the condition Va>V (x, y)−VB is met, it is determined whether the speed components of the incidence electron in the direction of z are reversed.

Thus, at least one of the acceleration voltage Va and the bias voltage Vb is varied in this way, and the threshold of measurement is varied. Measurement of the surface potential distribution is repeatedly performed every time the threshold of measurement is varied. Therefore, the whole image (the profile) of the surface potential distribution can be obtained based on the plurality of measurement results. The result of computation can be easily displayed as a 3-dimensional figure on the display monitor.

Figure 5:
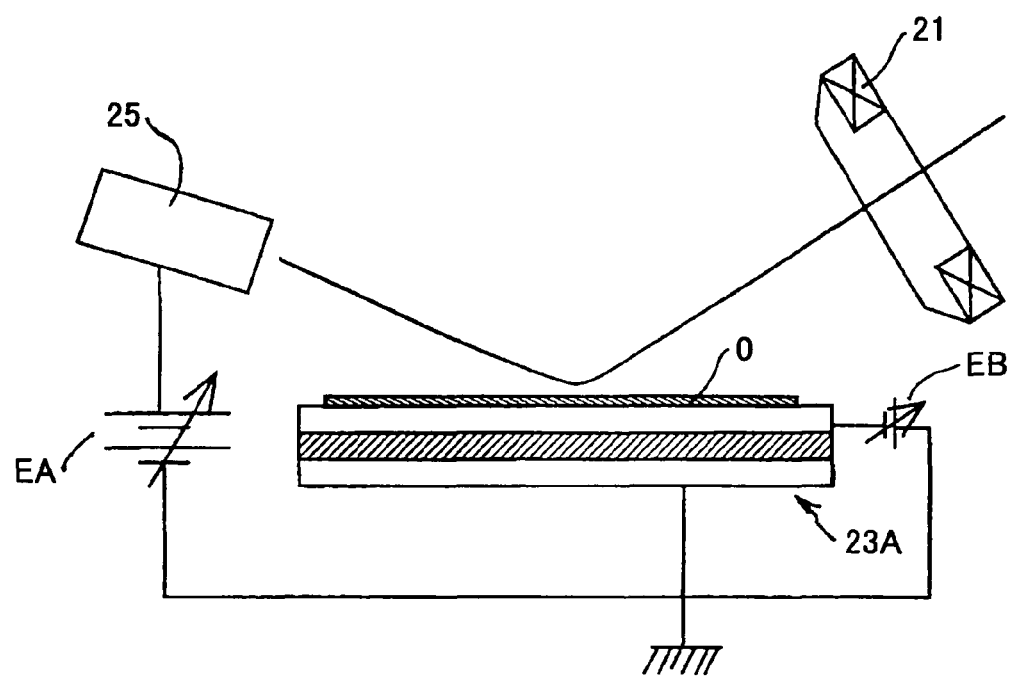
FIG. 5 is a diagram for explaining the embodiment in which the charged particle beam is incident to the scanning region of the sample having the surface potential distribution from the inclined direction to the vertical direction.

In the embodiment of FIG. 5, the case where the direction of incidence of the charged particle beam which scans the sample 0 in the two-dimensional manner is substantially perpendicular to the sample surface has been explained. Alternatively, the charged particle beam (which is the electron beam in the example of FIG. 5) may be incident to the scanning region of the sample 0 in a slanting direction to the sample surface.

Also, in such alternative example, the charged particles with which the components vz of the incidence velocity vector in the direction perpendicular to the sample surface are reversed (i.e., the speed components reversal particles), other than the charged particles incident to the sample surface, can be detected by the detector 25.

In the composition of FIG. 5, the number of the speed components reversal particles is varied sensitively to a slight change of the bias voltage applied to the electric conduction layer 23a, there is the advantage for the measurement.

Moreover, the drawing-in voltage of the detector 25 can be made small, and the separation with the secondary electrons generated in the sample 0 is easily realized. Furthermore, the threshold of measurement can also be changed by changing the degree of the incident angle of the charged particle beam to the sample 0. Moreover, the flexibility of the layout of each part of the measurement device is also increased.

Figure 6:
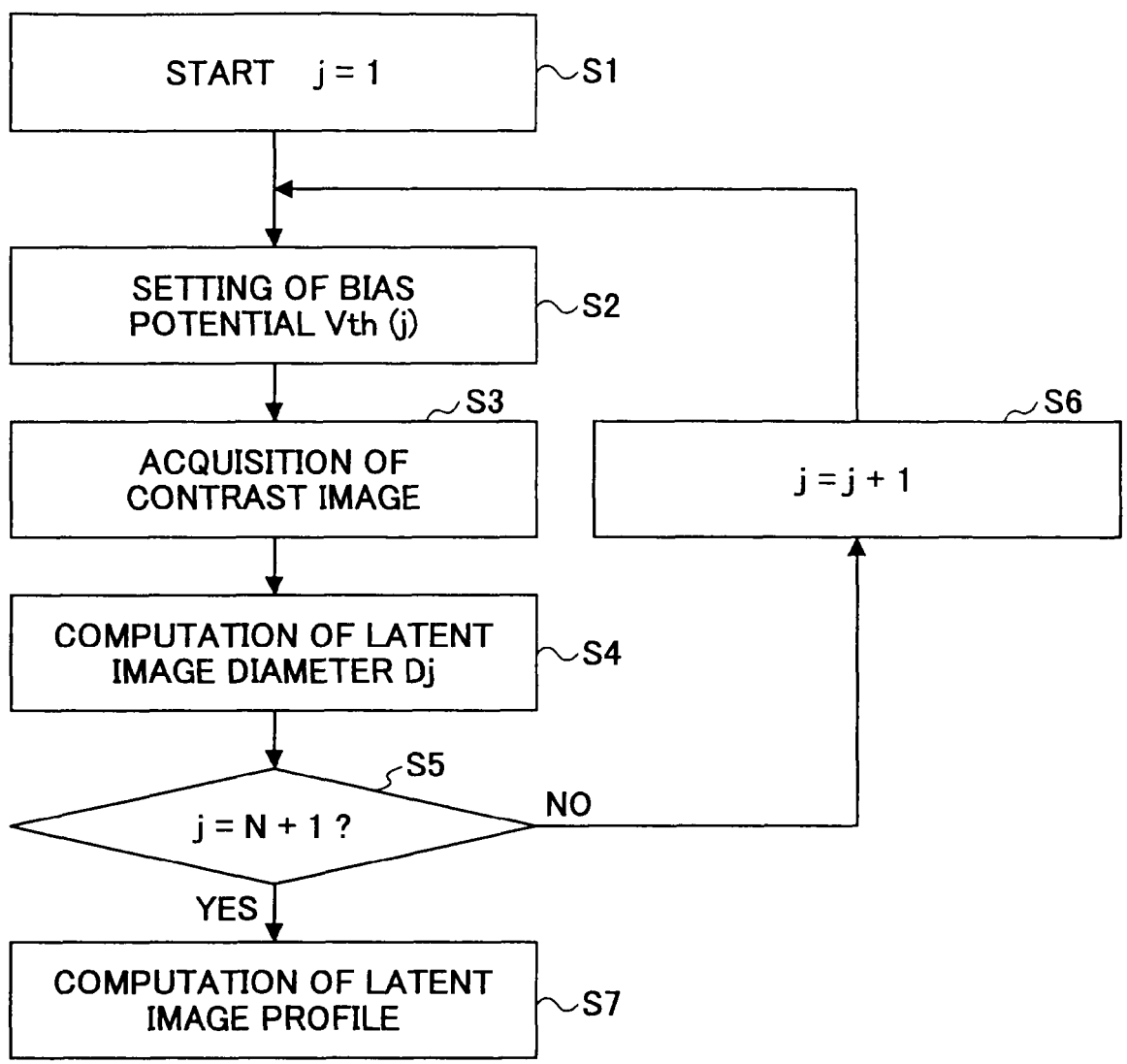
FIG. 6 is a flowchart for explaining the procedure of measuring the latent-image profile.

FIG. 6 is a flowchart for explaining the procedure of measuring the latent-image profile. In the flowchart of FIG. 6, the case where the surface potential distribution shown in FIG. 3 is made into the latent image, and the latent-image profile is measured as the profile (V (x, y) of FIG. 3) which is seen from the direction of y (which is perpendicular to the surface of the drawing).

For the sake of convenience of explanation, it is assumed in this example that the threshold of measurement is changed by changing the bias potential, and the threshold of measurement is changed in the plurality of N stages.

Upon starting of the procedure of FIG. 6 (step S1), the sample is placed in the measurement device, and the bias potential Vth (j=1) of the 1st step A=1) is set by using the parameter j which indicates the number of times of measurement as j=1 (step S2).

Then, the acquisition of the contrast image is performed (step S3). The contrast image means the region into which the surface potential distribution V (x y) is divided for every threshold and for every measurement, such as the regions S600 and S750 shown in FIG. 3. The contrast image is subjected to the binary processing, and the resulting digital data is obtained, and it is transferred to the computer which is the computation unit.

Then, the diameter Dj of the latent image, i.e., the diameter of the contrast image in the direction of x, is computed based on the received digital data (step S4).

Next, it is determined at step S5 whether the value of the parameter j exceeds the maximum number N of times of measurements (j=N+1?).

When the result at the step S5 is negative, the parameter j is incremented (step S6). The control is returned to the above steps S2 to S5, and a new measurement threshold is set up, and the acquisition of the contrast image and the calculation of the diameter of the latent image are performed.

When the result at the step S5 is affirmative, the plurality of values of the latent image diameters D1 to DN are obtained in correspondence with the plurality of measurement thresholds Vth (1) to Vth (N) at the N stages. Thus, the latent-image profile is computed based on the plurality of measurements results using the computer (step S7).

A description will be given of the detector 25 which is shown in FIG. 1A, FIG. 4, and FIG. 5. The detector 25 is formed from a combination of the scintillator (phosphor) and the photoelectron multiplier tube. Since the speed components reversal electrons repelled by the surface potential distribution of the sample 0 have a low energy, they are captured by the scintillator with the electric field of the drawing-in voltage applied to the surface of the scintillator by the power supply EA, and converted into the scintillation light by the scintillator. The scintillation light passes through the light pipe and is amplified into the current by the photoelectron multiplier tube, so that the current signal is taken out as a detection signal.

Usually, the drawing-in voltage applied to the scintillator is about 10 kV, and the electric field which is formed near the surface of the sample 0 by the drawing-in voltage is in a range of between $10^4$ and $10^6$ V/m. In the region where the electric field by the surface potential distribution of the sample 0 is larger, the electrons near the sample surface tend to be influenced by the electric field by the surface potential distribution of the sample 0.

Since the secondary electrons generated on the sample 0 by the electron beam for scanning the sample 0 have a small energy, most of them are pulled back to the surface of the sample 0, and the ratio of the electrons captured by the detector 25 is very small.

Especially in the composition of FIG. 5, the detector 25 is arranged on the side of the sample opposite to the direction of incidence through the scanning region where the electron beam is incident to the sample surface in the slanting direction. The speed components reversal electrons can be efficiently captured with the composition of FIG. 5, and the ratio of the secondary electrons, generated by the sample 0 and serving as the measurement noise, captured by the detector 25 can be reduced further, and the S/N ratio of measurement can be raised.

Alternatively, it is possible to use the micro channel plate (MCP) instead of the scintillator. When using MCP, it is possible to collect the current and amplify the electron captured by MCP by the current collection electric field by which it was applied in the input side of the MCP, and it is possible to increase by the thousands times, and the good detection signal can be acquired.

By using the above-described embodiment, the surface potential distribution measurement method can be realized. In the measurement method, the sample 0 having a surface with a surface potential distribution is scanned using a charged particle beam in a two-dimensional manner. A detection signal is obtained by the two-dimensional scanning to measure the surface potential distribution of the sample 0. The charged particles, other than charged particles of the charged particle beam incident to the sample surface by the two-dimensional scanning, with which the components vz of an incidence velocity vector of the charged particles in a direction perpendicular to the sample surface are reversed, are detected so that a detection signal indicating an intensity according to the detected charged particles is obtained in correspondence with a position on the sample surface.

Moreover, a uniform bias potential may be applied to the surface of the sample with respect to the surface-potential distribution in the above-mentioned measurement method by using the embodiments shown in FIG. 3 and FIG. 4. Moreover, the uniform bias potential VB applied to the surface of the sample with respect to the surface-potential distribution may be varied, and every time the bias potential VB is varied, the surface potential distribution is measured, so that a profile of the surface potential distribution is computed based on a plurality of measurement results thus obtained.

Moreover, in the above-mentioned measurement method, an acceleration voltage Va applied to create the charged particle beam for the two-dimensional scanning of the sample 0 may be varied, and every time the acceleration voltage Va is varied the surface potential distribution is measured, so that a profile of the surface potential distribution is computed based on a plurality of measurement results thus obtained.

Moreover, in the above-mentioned measurement method, at least one of the uniform bias potential VB applied to the sample surface with respect to the surface potential distribution and the acceleration voltage Va applied to create the charged particle beam for the two-dimensional scanning of the sample may be varied, and every time the at least one of the uniform bias voltage VB and the acceleration voltage Va is varied the surface potential distribution is measured, so that a profile of the surface potential distribution is computed based on a plurality of measurement results thus obtained.

Moreover, in the above-mentioned measurement method, an electron beam may be used as the charged particle beam for the two-dimension scanning to the sample 0 having the surface with the surface potential distribution. Alternatively, in the above-mentioned measurement method, an ion beam may be used as the charged particle beam for the two-dimension scanning to the sample having the surface with the surface potential distribution.

Moreover, by using the above embodiment of FIG. 5, the charged particle beam may be incident to the scanning region of the sample 0 having the surface with the surface potential distribution in a slanting direction to the sample surface.

Furthermore, by using the above-described embodiment of FIG. 1A, the surface potential distribution measurement device can be realized. This measurement device comprises the charged particle beam scanning unit (the elements 10 to 21 in FIG. 1A), the capture unit 25, and the measurement unit (such as the computer not illustrated). The charged particle beam scanning unit scans the sample 0 having a surface with a surface potential distribution using a charged particle beam in a two-dimensional manner. The capture unit 25 captures the charged particles, other than the charged particles of the charged particle beam incident to the sample surface by the two-dimensional scanning, with which the components of an incidence velocity vector of the charged particles in a direction perpendicular to the sample surface are reversed. The measurement unit obtains a detection signal indicating an intensity according to the captured charged particles in correspondence with a position on the sample surface, so that the surface potential distribution is measured with the detection signal.

Moreover, by using the embodiments of FIG. 4 and FIG. 5, the above-mentioned measurement device may further comprise a bias potential application unit (the support part 23A and the power supply EB) which applies a uniform bias potential to the surface of the sample 0 with respect to the surface potential distribution. Moreover, the above-mentioned measurement device may further comprise a bias potential varying unit EB which varies the bias potential applied by the bias potential application unit, and a computation unit (for example, the computer which is not illustrated) which computes the profile of the surface potential distribution based on the plurality of measurement results which are obtained by measuring the surface potential distribution every time the bias potential is varied.

Moreover, the above-mentioned surface potential distribution measurement device may further comprise an acceleration voltage varying unit (for example, the accelerator provided in the electron gun 10) which varies the acceleration voltage applied to create the charged particle beam for the two-dimensional scanning, and a computation unit (for example, the computer which is not illustrated) which computes the profile of the surface potential distribution based on the plurality of measurement results which are obtained by measuring the surface potential distribution every time the acceleration voltage is varied.

Moreover, by using the embodiments of FIG. 4 and FIG. 5, the above-mentioned measurement device may further comprise the bias potential varying unit (the power supply EB) which varies the uniform bias potential applied to the sample surface by the bias potential application unit (the support part 23A and the power supply EB). Moreover, the above-mentioned measurement device may further comprise a computation unit (for example, the computer which is not illustrated) which computes the profile of the surface potential distribution based on the plurality of measurement results which are obtained by measuring the surface potential distribution every time the bias potential and/or the acceleration voltage is varied.

Moreover, as described above, in the above-mentioned measurement device, the electron gun 10 which generates an electron beam may be provided so that the electron beam is used as the charged particle beam for the two-dimensional scanning to the sample 0 having the surface with the surface potential distribution. Moreover, in the above-mentioned measurement device, a liquid-metal ion gun which generates an ion beam may be provided so that the ion beam is used as the charged particle beam for the two-dimensional scanning to the sample 0 having the surface with the surface potential distribution.

Moreover, by using the embodiment of FIG. 5, in the above-mentioned measurement device, the charged particle beam scanning unit may be arranged so that the charged particle beam is incident to the scanning region of the sample having the surface with the surface potential distribution, and the capture unit 25 provided in the measurement unit may be arranged through the scanning region on the side opposite to the direction of incidence of the charged particle beam.

Moreover, in the above-described measurement method, the sample may be an electrophotographic photoconductor, and the surface potential distribution of the sample may be measured as a surface potential distribution concerning an electrostatic latent image formed on the photoconductor. Next, a description will be given of the above case.

As previously described in the foregoing, the electrophotographic photoconductor has the tendency of the dark decaying, and the time in which the electrostatic latent image formed on the photoconductor can be measured is only about dozens seconds. For this reason, when the sample 0 is the electrophotographic photoconductor, the electrostatic latent-image formation unit must be arranged in the sealed casing 30.

Figure 7:
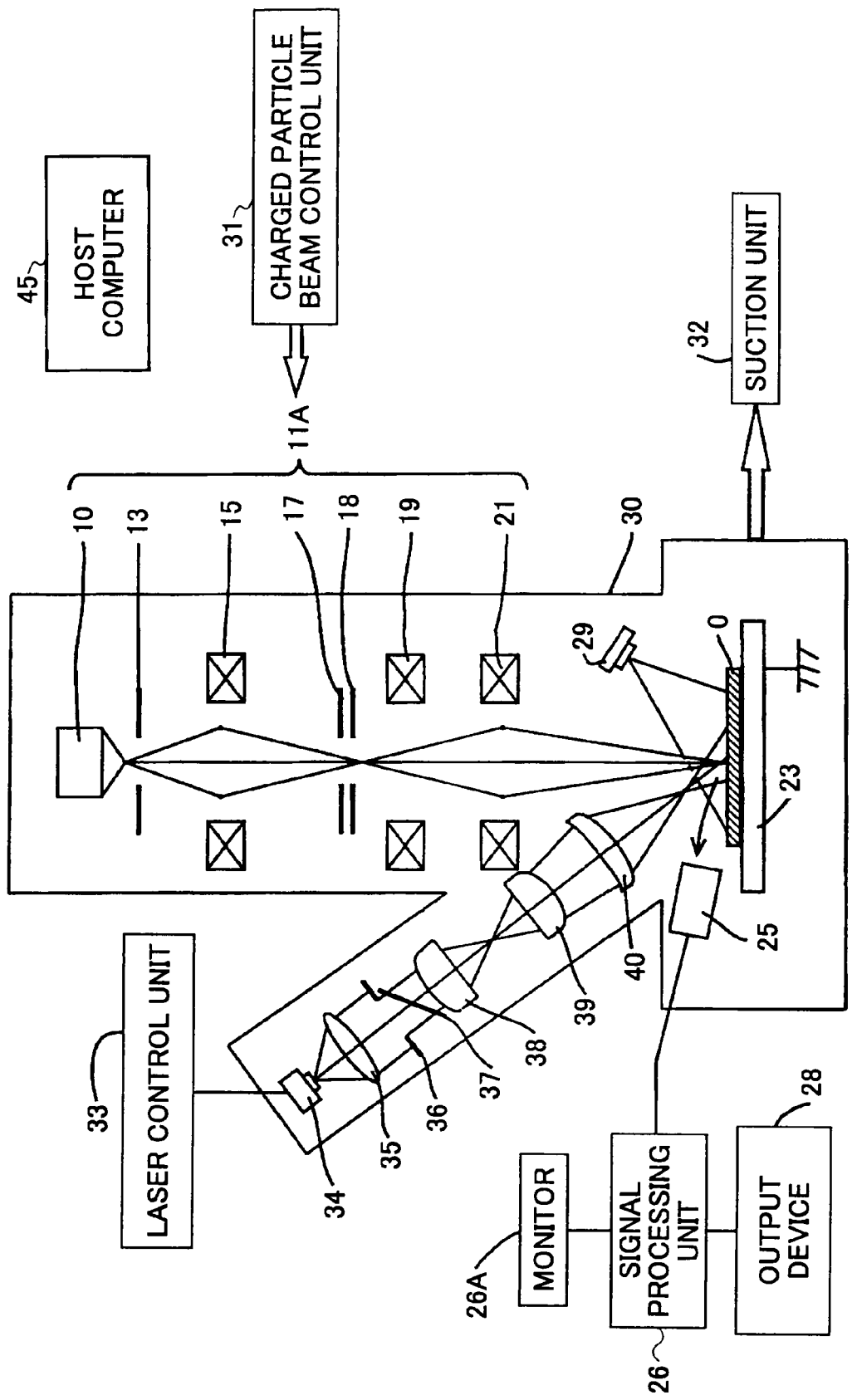
FIG. 7 is a diagram showing the composition of the surface potential distribution measurement device in the preferred embodiment of the invention which measures the electrostatic latent image formed on the photoconductive sample.

FIG. 7 shows the composition of the surface potential distribution measurement device in the preferred embodiment of the invention, which includes the electrostatic latent-image formation unit.

In FIG. 7, the electron gun 10, the beam monitor 13, the condenser lens 15, the aperture 17, the beam blanker 18, the scanning lens 19, the objective lens 21, and the support part 23 are essentially the same as corresponding elements in FIG. 1A, and a description thereof will be omitted for the sake of convenience.

In addition, the electron gun 10, the beam monitor 13, the condenser lens 15, the aperture 17, the beam blanker 18, the scanning lens 19, and the objective lens 21 constitute the charged particle beam irradiation unit 11A, the respective components of the charged particle beam irradiation unit 11A are controlled by the charged particle beam control unit 31, and the charged particle beam irradiation unit 11A and the charged particle beam control unit 31 constitute the charged particle beam scanning unit.

In the present embodiment, the sample 0 is the electrophotographic photoconductor, the back surface of the sample 0 is supported by the upper surface of the conductive support part 23, and the conductive support part 23 is grounded.

Moreover, in FIG. 7, the reference numeral 34 denotes the semiconductor laser which is the light source, the reference numeral 35 denotes the collimator lens, the reference numeral 36 denotes the aperture, the reference numeral 37 denotes the mask, and the reference numerals 38, 39 and 40 denotes the lenses which constitute the imaging lens. These elements constitute the image irradiation unit, and the image irradiation unit, the semiconductor laser control unit 33 and the image irradiation control unit which is not illustrated constitute the exposure unit.

The image irradiation control unit which is not illustrated is capable of performing the focusing and magnification conversion by adjustment of the positional relation between the imaging lenses 38, 39 and 40 and the mask 37.

In FIG. 7, the reference numeral 25 denotes the detector (the capture unit), 26 denotes the signal processing unit, 26A denotes the monitor, and 28 denotes the output device, such as the printer, respectively. The detector 25, the signal processing unit 26, the monitor 26A, and the output device 28 constitute the measurement unit. In addition, the reference numeral 29 denotes the light emitting device for electric erasing.

As shown in FIG. 7, the respective parts of the above-mentioned measurement device are accommodated in the casing 30, and the inside of the casing 30 can be decompressed to the substantially vacuum state by using the suction unit 32. That is, the casing 30 functions as a vacuum chamber.

Moreover, the whole measurement device is controlled by the host computer 45 (which is the control unit controlling the measurement device synthetically). The charged particle beam control unit 31 and the signal processing unit 26 may be incorporated in the host computer 45 as a part of the function.

In the condition shown in FIG. 7, the sample 0 having the uniformly charged surface is placed on the support part 23, and the inside of the casing 30 is decompressed to the substantially vacuum state.

In such condition, the semiconductor laser 34 is turned on and the image of the mask 37 is focused on the uniformly changed surface of the sample 0. The pattern of the electrostatic latent image according to the image irradiated to the sample 0 by this exposure is formed.

Thus, the surface in which the pattern of the electrostatic latent image is formed is scanned in a two-dimensional manner by the electron beam, and the speed components reversal electrons repelled by the barrier potential generated by the surface potential of the sample 0 are captured by the detector 25. A detection signal indicating the intensity according to the captured electrons outputted by the detector 25 is obtained and converted into the electric signal.

Similar to the previous embodiment, the acceleration voltage Va is varied, and every time the acceleration voltage Va is varied the measurement is repeated, so that the latent-image profile of the electrostatic latent image can be computed by the signal processing unit 26 which is the computation unit controlled by the host computer 45. The result of the computation from the signal processing unit 26 is outputted to the output device 28.

In order to form the pattern of the electrostatic latent image on the sample 0 which is the photoconductive sample, the surface of the sample 0 must be charged uniformly prior to the exposure of the image.

In the embodiment of FIG. 7, charging by the electron beam is performed on the sample surface using the charged particle beam scanning unit 11A.

Namely, if the electron beam is irradiated to the sample 0, the secondary electron will occur from the photoconductive sample SP with the impact of the irradiated electron. However, if the ratio of the amount R1 of the electrons irradiated to the sample 0 to the amount R2 of the secondary electrons discharged is larger than 1, the amount of the electrons irradiated exceeds the amount of the secondary electrons discharged. The difference between the amount R1 and the amount R2 is accumulated in the photoconductive sample SP, and the surface of the sample 0 is thus charged.

Therefore, the quantity and acceleration voltage of the electrons emitted from the electron gun 10 are adjusted, and the condition in which the ratio R1/R2 is larger than 1 is set up, and the two-dimensional scanning of the electron beam is applied to the sample 0. Thus, uniform charging of the surface of the sample 0 can be carried out.

Such adjustment of the amount of the discharge electrons and the acceleration voltage is carried out by using the charged particle beam control unit 31.

Moreover, switching on and off of the irradiation of the electron beam in accordance with the scanning of the electron beam is performed by controlling the beam blanker 18 by the charged particle beam control unit 31.

As an alternative charging unit, the contact charging, the pouring charging, and the ion irradiation charging may also be used instead.

Figure 8:
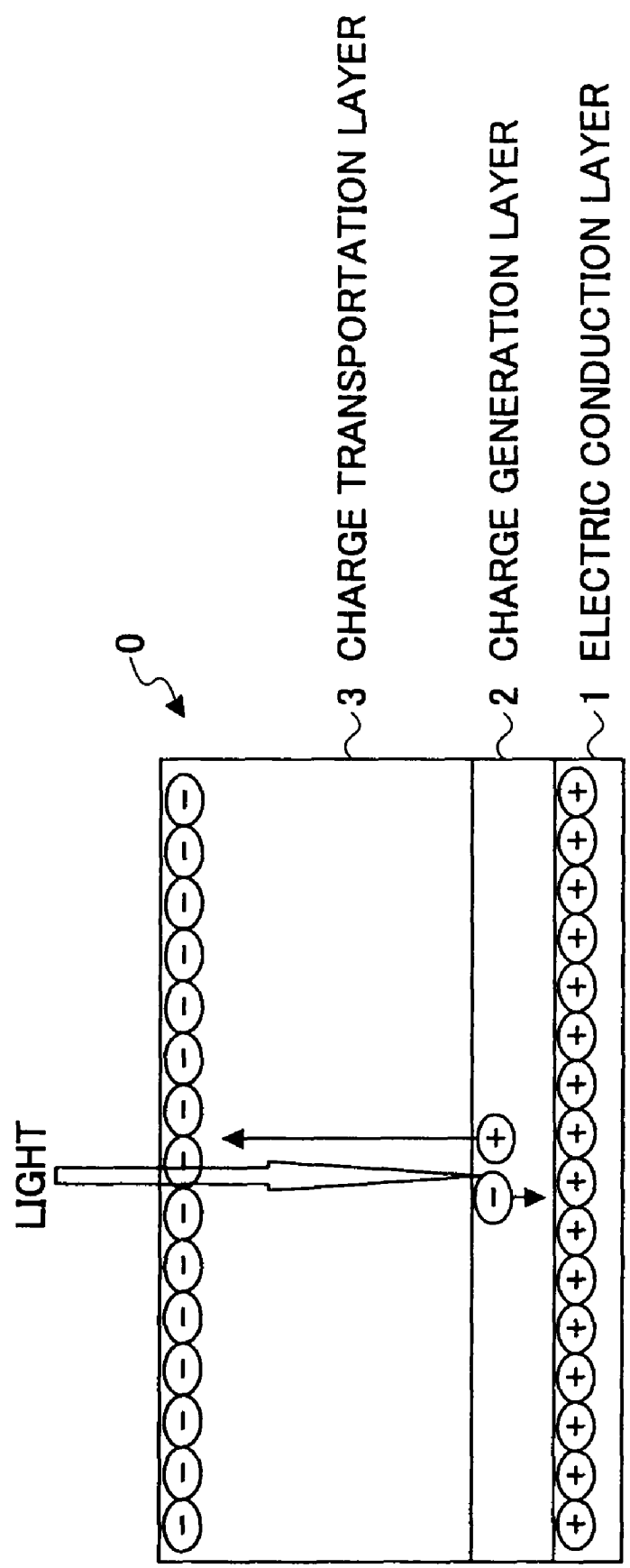
FIG. 8 is a diagram for explaining the formation of the electrostatic latent image on the photoconductive sample.

FIG. 8 shows the state where the surface of the sample 0 is charged by the electron beam as described above.

It is called function separated photoconductor to be shown in FIG. 8 as a sample 0 which is the photoconductive sample, it forms the electric charge generation layer 2 on the electric conduction layer 1, and forms the electric charge transportation layer 3 on it.

The electron irradiated by the electron gun 10 is fired into the surface of the electric charge transportation layer 3, is captured by the electron course of the electric charge transportation layer material molecule in the surface of the electric charge transportation layer 3, and where the molecule is ionized, it stops at the surface unit of the electric charge transportation layer 3.

This state is in the state where the sample 0 was charged.

Thus, if the exposure light is irradiated by the sample 0 in the state where it is charged, the irradiated light will penetrate the electric charge transportation layer 3, will result in the electric charge generation layer 2, and will generate the positive and negative electric charge carrier in the electric charge generation layer 2 by the energy.

The negative carrier moves to the electric conduction layer 1 among the generated positive and negative electric charge carriers in the action of the restitution by the minus electric charge of the surface of the electric charge transportation layer 3, and the electric charge transportation layer 3 is conveyed to the right carrier, and it sets off against the minus electric charge (captured electron) of the surface unit of this layer 3, and suits.

Thus, in the portion irradiated with the exposure light in the sample 0, the charging electric charge and the potential distribution according to the intensity distribution of the exposure light is formed.

The surface potential distribution by the pattern of this potential distribution is the pattern of the electrostatic latent image, and it is the candidate for measurement.

As described above, the image is exposed to the uniformly charged surface of the sample 0 and the pattern of the electrostatic latent image is formed. The above-mentioned exposure unit (FIG. 7) carries out this exposure. That is, the semiconductor laser 34 is turned on and the imaging of the mask 37 to the surface of the sample 0 is carried out by the action of the imaging lenses 38, 39, and 40.

The semiconductor laser 34 which has a luminescence wavelength in the wavelength region where the sample 0 is sensitive is used. Since the exposure energy is equal to the time quadrature of the optical power on the surface of the sample 0, the lighting time of the semiconductor laser 34 is controlled by the LD control unit 33. In this way, the exposure at the desired exposure energy on the sample 0 can be carried out.

Figure 9:
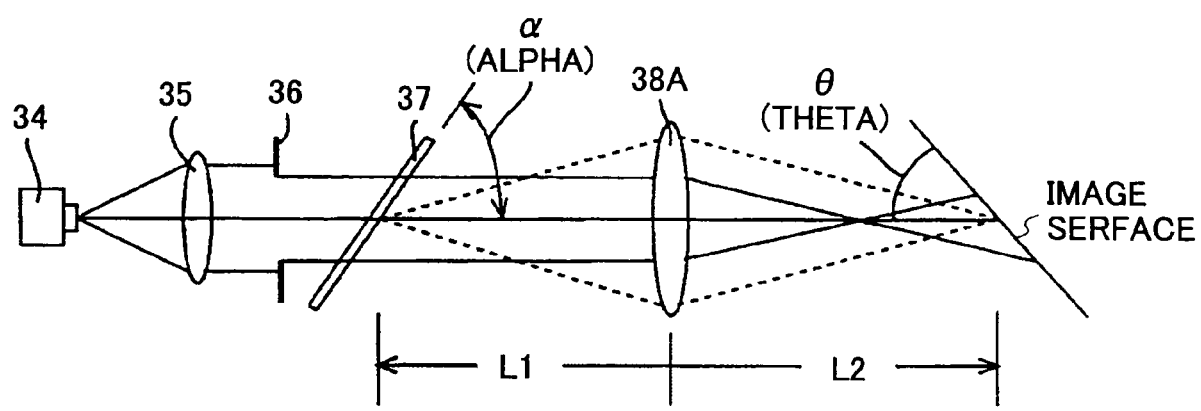
FIG. 9 is a diagram for explaining an example of the irradiation of the optical image to the photoconductive sample surface in the surface potential distribution measurement device of FIG. 7.

FIG. 9 shows an example of the irradiation of the optical image to the photoconductive sample surface by the image irradiation unit in the surface potential distribution measurement device of FIG. 7.

In FIG. 9, the reference numeral 34 denotes the semiconductor laser which is the light source, the reference numeral 35 denotes the collimator lens, the reference numeral 36 denotes the aperture, and the reference numeral 37 denotes the mask, respectively. The reference numeral 38A denotes the imaging lens which includes the three lenses 38, 39 and 40 as in FIG. 7.

The light beam emitted from the semiconductor laser 34 is converted into the parallel light beam by the collimator lens 35, and the diameter of the light beam is regulated by the aperture 36, so that the light beam is incident to the mask 37.

With the light beam which passes through the mask 37, the image of the mask pattern in the mask 37 is focused on the image surface by the action of the imaging lens 38A. In the present embodiment, the image surface is the uniformly charged surface of the sample 0 laid on the support part 23.

In this way, the exposure of the sample 0 is performed and the pattern of the electrostatic latent image corresponding to the mask pattern is formed on the surface of the sample 0.

As shown in FIG. 9, if the object distance of the mask 37 in the imaging lens 38A is set to L1 and the image distance is set to L2, the imaging magnification (beta) in the direction perpendicular to the optical axis of the imaging lens 38A is L2/L1, and the imaging of the mask pattern image according to this magnification will be carried out.

The imaging lens 38A is arranged so that the mask 37 and the surface of the photoconductive sample may serve as the conjugate. Since the imaging magnification beta and the size of the mask pattern are known beforehand, the size of the mask pattern image formed on the surface of the photoconductive sample can be computed. Thus, it is possible to form the desired electrostatic latent-image pattern on the surface of the photoconductive sample.

In order to set up the optical path for exposure in the exposure unit outside the region where the charged particle beam for the two-dimensional scanning of the photoconductive sample passes, the optical axis of the imaging lens 38A is inclined to the normal perpendicular to the uniformly charged surface of the photoconductive sample.

Therefore, as shown in FIG. 9, the mask 37 is also inclined to the optical axis of the imaging lens 38A, and the image of the mask pattern with the imaging lens 38A is arranged so that it matches with the surface of the photoconductive sample.

The inclination angles alpha and theta of the mask 37 and the photoconductive sample surface to the optical axis of the imaging lens 38A are respectively set up as alpha=theta=45 degrees in the present embodiment. This is because the imaging magnification beta (=L2/L1) in the present embodiment is equal to 1 (L1=L2).

In the present embodiment, the image of the mask pattern formed on the surface of the photoconductive sample is magnified by the square root of 2 on the surface parallel to the drawing in the direction perpendicular to the drawing of FIG. 9, and the mask pattern can be designed by taking into consideration this.

In the general case where the imaging magnification is not equal to 1, the equation: L1 tan(alpha)=L2 tan(theta) where L1 is the object distance, L2 is the image distance, alpha is the inclination angle of the mask, and theta is the inclination angle of the sample surface, should be considered.

The mask pattern in the mask 37 is the mask pattern for resolution inspection. In the present embodiment, the mask pattern is also the negative pattern, the portion corresponding to the portion by which optical irradiation is carried out on the occasion of formation of the electrostatic latent image is light-transmission nature, and other portions are shading nature so that the negative latent image can be formed in photoconductivity data.

In order to lean to FIG. 7 in the surface potential distribution measurement device in which the present embodiment is shown to the normal which the optical axis of the imaging in the exposure unit stood to the surface of the sample 0 and to make parallel the image of the mask 37 by which the imaging is carried out on the sample surface for this reason, the device for inclining the mask 37 to the optical axis is required.

Figure 10:
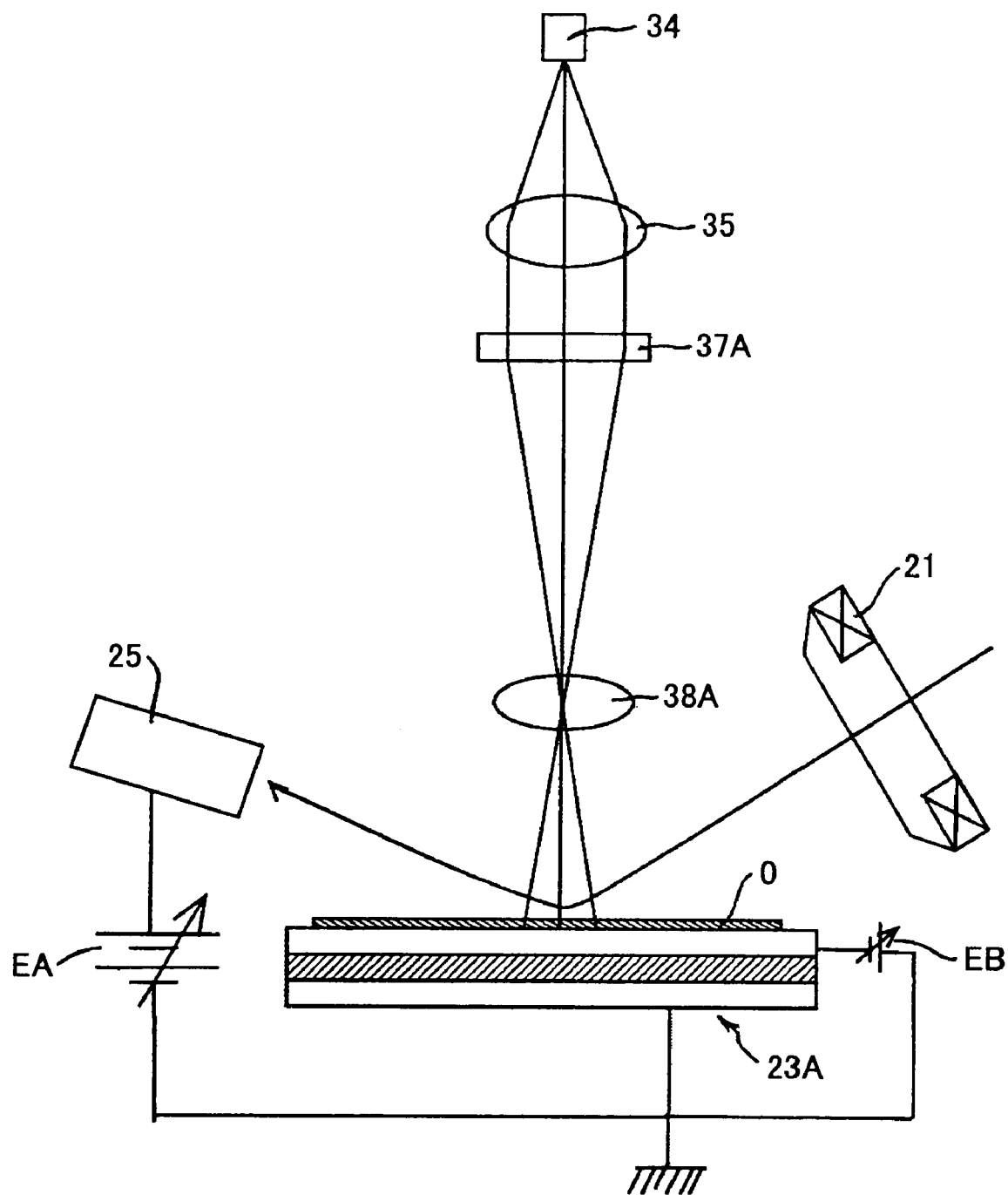
FIG. 10 is a diagram for explaining another example of the irradiation of the optical image to the photoconductive sample surface.

As shown in FIG. 5, in setting up the irradiation direction of the charged particle beam with inclination to the sample surface, similar to the embodiment of FIG. 10, the collimator lens 35 from the semiconductor laser 34, the mask 37A, the surface of the sample 0 and the optical path which reaches the surface of the sample 0 through imaging lens 38A can be made to be able to cross at right angles, the surface of the sample 0 can be made to be able to carry out the imaging of the image of mask 37A by imaging lens 38A, and mask 37A can be installed in the sample surface and parallel in this case.

Figure 11:
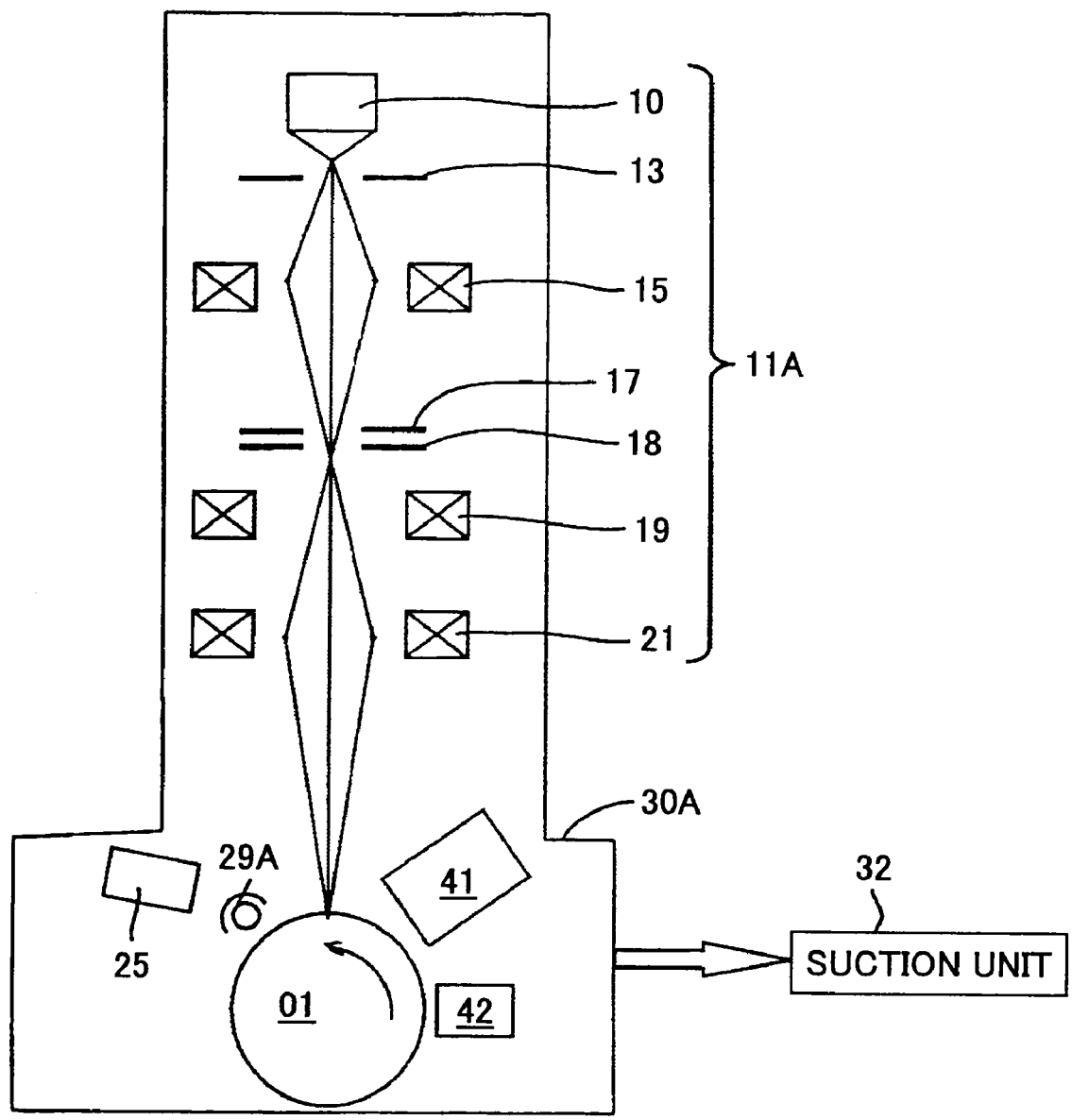
FIG. 11 is a diagram showing the composition of the surface potential distribution measurement device in another preferred embodiment of the invention which measures the electrostatic latent image formed on the photoconductive sample.
Figure 12:
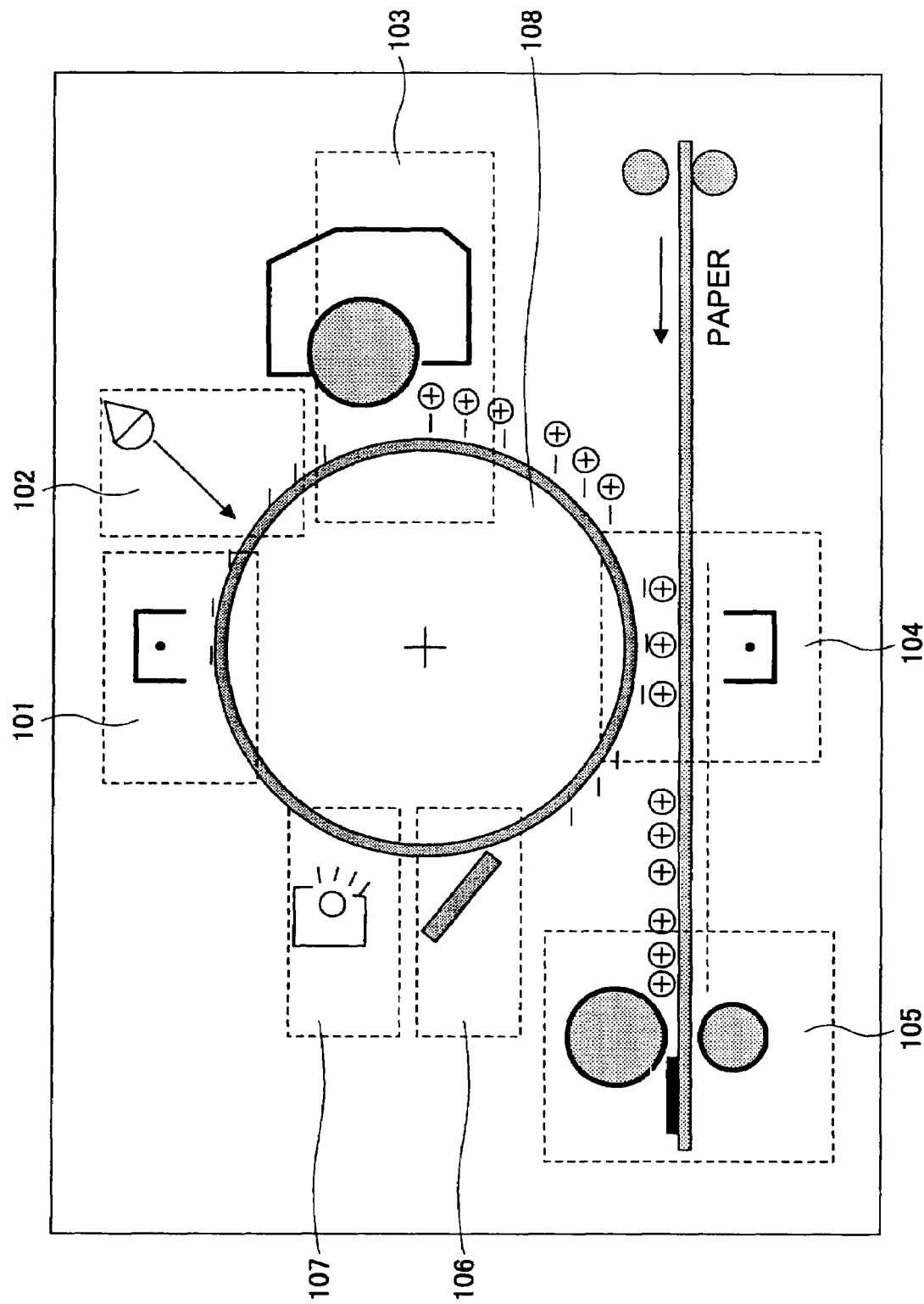
FIG. 12 is a diagram showing the composition of an electrophotographic image forming apparatus in which an electrostatic latent image is formed on the photoconductor drum by the imaging process.
Figure 13:
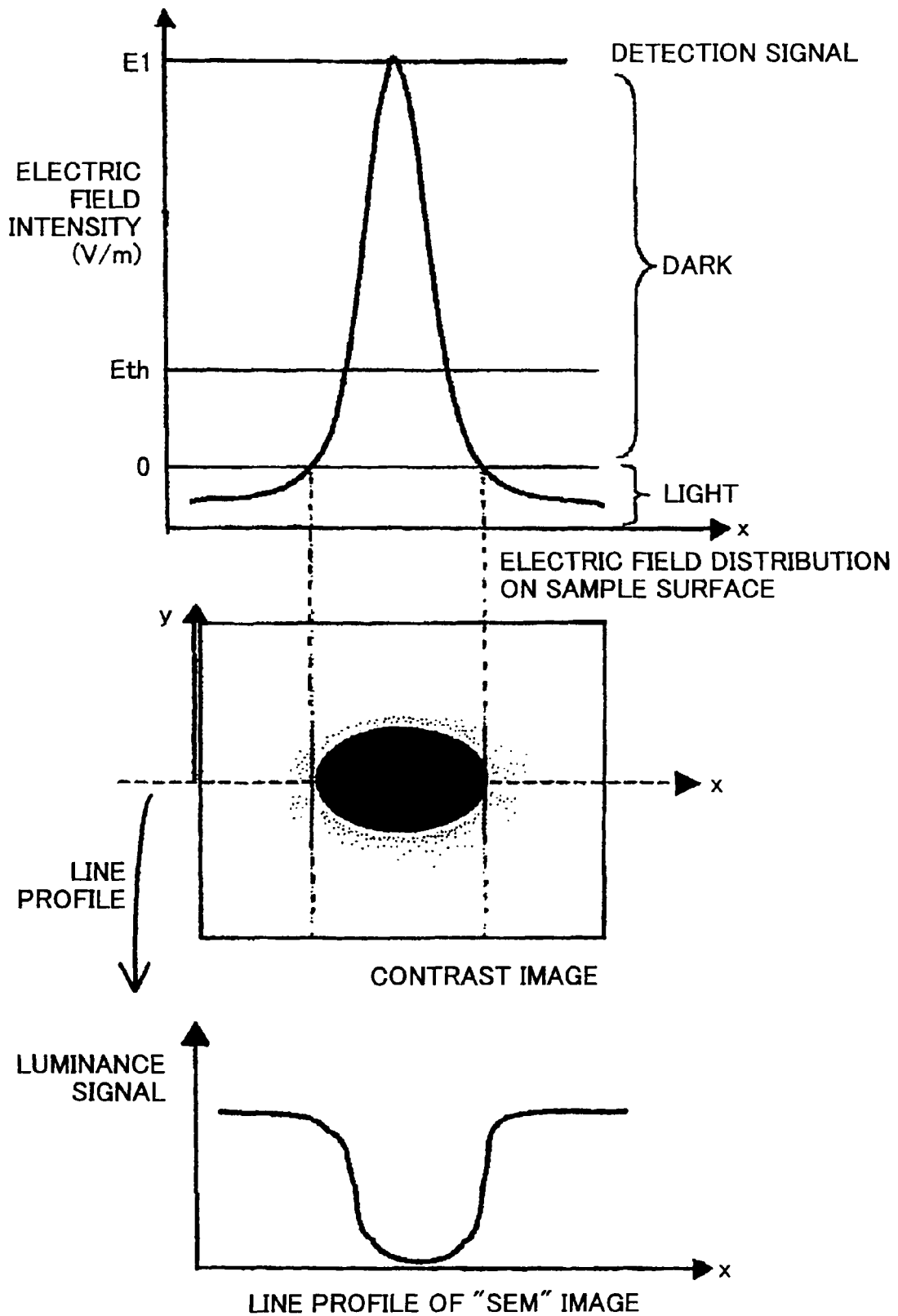
FIG. 13 is a diagram for explaining the relation between the measured electric field intensity obtained by detecting the secondary electron generated by the incident electron and the light-and-dark image produced according to the surface potential distribution.

FIG. 11 shows the composition of the surface potential distribution measurement device in another preferred embodiment of the invention which measures the electrostatic latent image formed in the photoconductor of photoconductivity.

In FIG. 11, the elements which are essentially the same as corresponding elements in FIG. 1 and FIG. 7 are designated by the same reference numerals, and a description thereof will be omitted for the sake of convenience of description.

The electron gun 10 and the aperture 13 which constitute the charged particle beam irradiation unit 11A, the condenser lens 15, the aperture 17, the beam blanker 18, the scanning lens 19, and the objective lens 21 are the same as the corresponding elements in FIG. 1 and FIG. 7. The detector 25 and the signal processing unit which is not illustrated are the same as corresponding elements which are described above with FIG. 7. In FIG. 11, the reference numeral 30A denotes the casing.

The sample 01 which is the electrophotographic photoconductor is formed in the shape of a drum, and uniform rotation is carried out in the direction of the arrow (counterclockwise rotation) by the drive unit which is not illustrated.

After the sample 01 is set in the casing 30A, the inside of the casing 31A is highly decompressed by the suction unit which is not illustrated.

The charging unit 42 is a contact-type charging unit which includes, for example, the charging brush, the charging roller, etc., and carries out contact charging of the sample 01 uniformly within the casing under pressure reduction.

At this time, uniform rotation of the sample 01 is carried out in the direction of the arrow (counterclockwise rotation). As described above with FIG. 7, the sample 01 can also be charged by using the electron beam.

The exposure unit 41 carries out exposure by irradiating the optical image to the uniformly charged surface of the sample 01.

The image can be irradiated by the optical writing using the known optical scanning device in the laser printer etc. as the exposure unit 41.

Thus, if the image is irradiated in the optical writing, the form of the pattern of the electrostatic latent image formed in the writing can be changed arbitrarily, and the pattern of the request of the electrostatic latent image can be formed easily.

In addition, when installation into the casing 31A is difficult, the optical scanning device is formed in the exterior of the casing 31A, the transparent window unit is prepared in the casing 31A, and it may be made for the optical scanning device to become large when using the optical scanning device as the exposure unit 41, and to irradiate the image from the outside to the photoconductive sample 01 through this window unit.

Although the scan of the electron beam by the charged particle beam irradiation unit 11A may be performed by deflecting the electron beam in two-dimensional manner similar to the embodiments of FIG. 1 and FIG. 7, since the scan is received the sample 01 carrying out uniform rotation in the direction of the arrow, the electron beam can be deflected in one dimension in the direction which intersects perpendicularly with the drawing, and the two-dimensional scanning can also be realized combining this deviation and rotation of the sample 01.

As described in the foregoing, by using the embodiments of FIG. 7 to FIG. 1, the surface potential distribution measurement device can be realized. In the measurement device, the measurement sample may be an electrophotographic photoconductor, and the surface potential distribution of the sample is measured as a surface potential distribution concerning an electrostatic latent image formed on the photoconductor, wherein the measurement device comprises the charging unit 11A charging the photoconductor uniformly, and the exposure unit irradiating an optical image to the uniformly charged photoconductor.

Moreover, by using the embodiments of FIG. 7 and FIG. 10, the exposure unit in the above-mentioned measurement device may be provided to carry out projection exposure of the mask patterns 37 and 37A. Moreover, by using the embodiment of FIG. 7, the above-mentioned measurement device may be provided so that the optical path for exposure is arranged outside the region which the charged particle beam passes through for the two-dimensional scanning of the photoconductor performed by the exposure unit.

Moreover, by using the embodiment of FIG. 1, in the surface potential distribution measurement device, the exposure unit 41 may be provided to optically write an electrostatic latent image pattern to the photoconductor by the two-dimensional scanning.

Moreover, by using the embodiments of FIG. 7 to FIG. 1, the exposure unit in the above-mentioned measurement device may be provided to include the semiconductor laser 34 which is used as a light source for the exposure. Moreover, by using the embodiments of FIG. 7 to FIG. 1, the exposure unit in the above-mentioned measurement device may be provided so that an exposure time of the exposure unit is controllable.

Moreover, by using the embodiments of FIG. 7 and FIG. 10, in the surface potential distribution measurement device, the charged particle beam scanning unit 11A may be provided to charge the photoconductor sample 01 uniformly by using an electron beam for the two-dimensional scanning, and to serve as the charging unit of the photoconductor sample 01.

Figure 15:
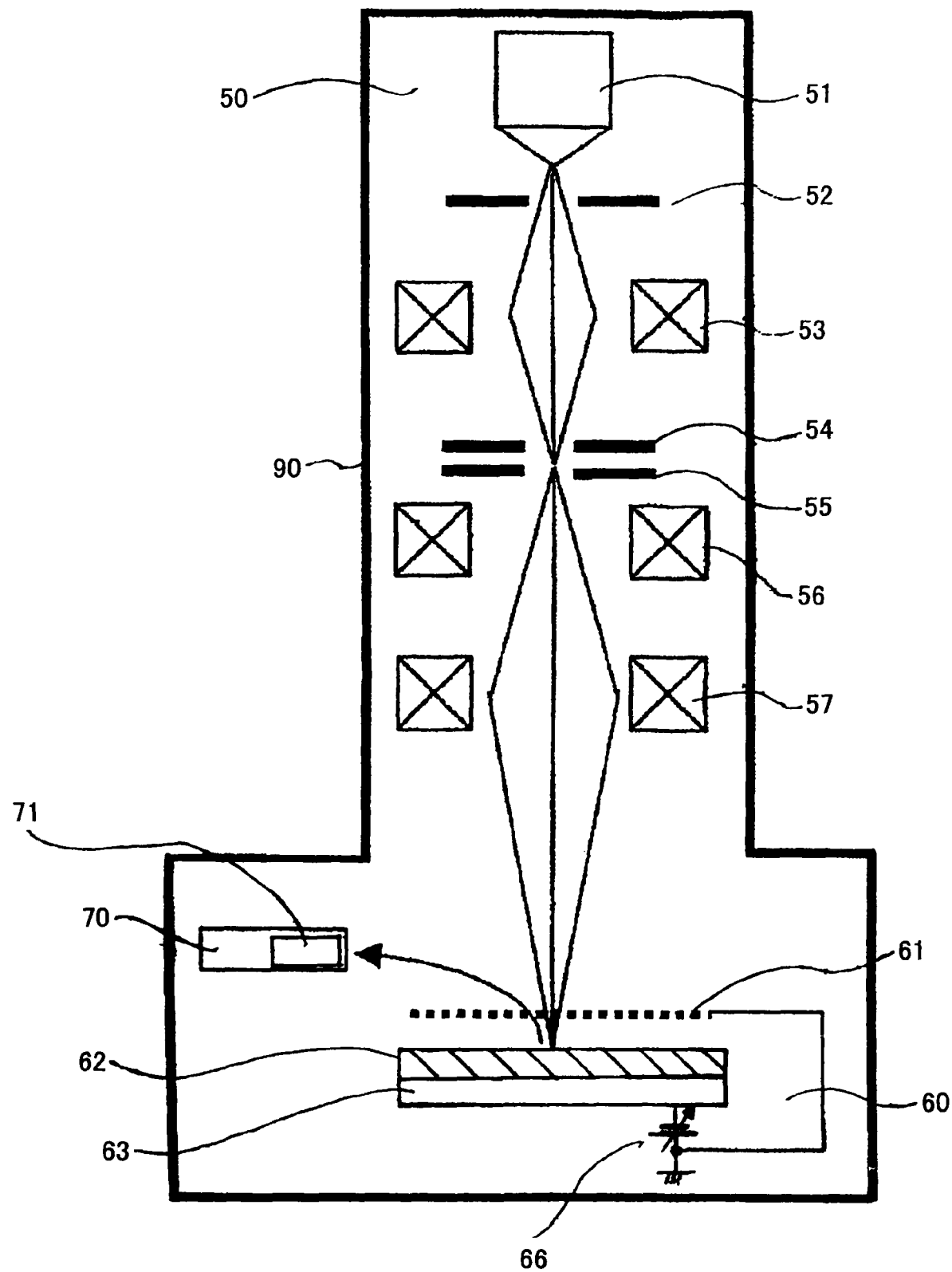
FIG. 15 is a diagram showing the composition of the surface potential distribution measurement device in the preferred embodiment of the invention in which the charged particle irradiation unit, the sample installation unit, and the secondary electron detecting unit are arranged.

Next, FIG. 15 shows the composition of the surface potential distribution measurement method and device in another preferred embodiment of the invention, in which the charged particle irradiation unit, the sample installation unit, and the secondary electron detecting unit are provided.

As shown in FIG. 15, the surface potential distribution measurement device in this embodiment comprises the charged particle irradiation unit 50 which irradiates the charged particle beam, the sample installation unit 60, and the secondary electron detecting unit 70.

Figure 14:
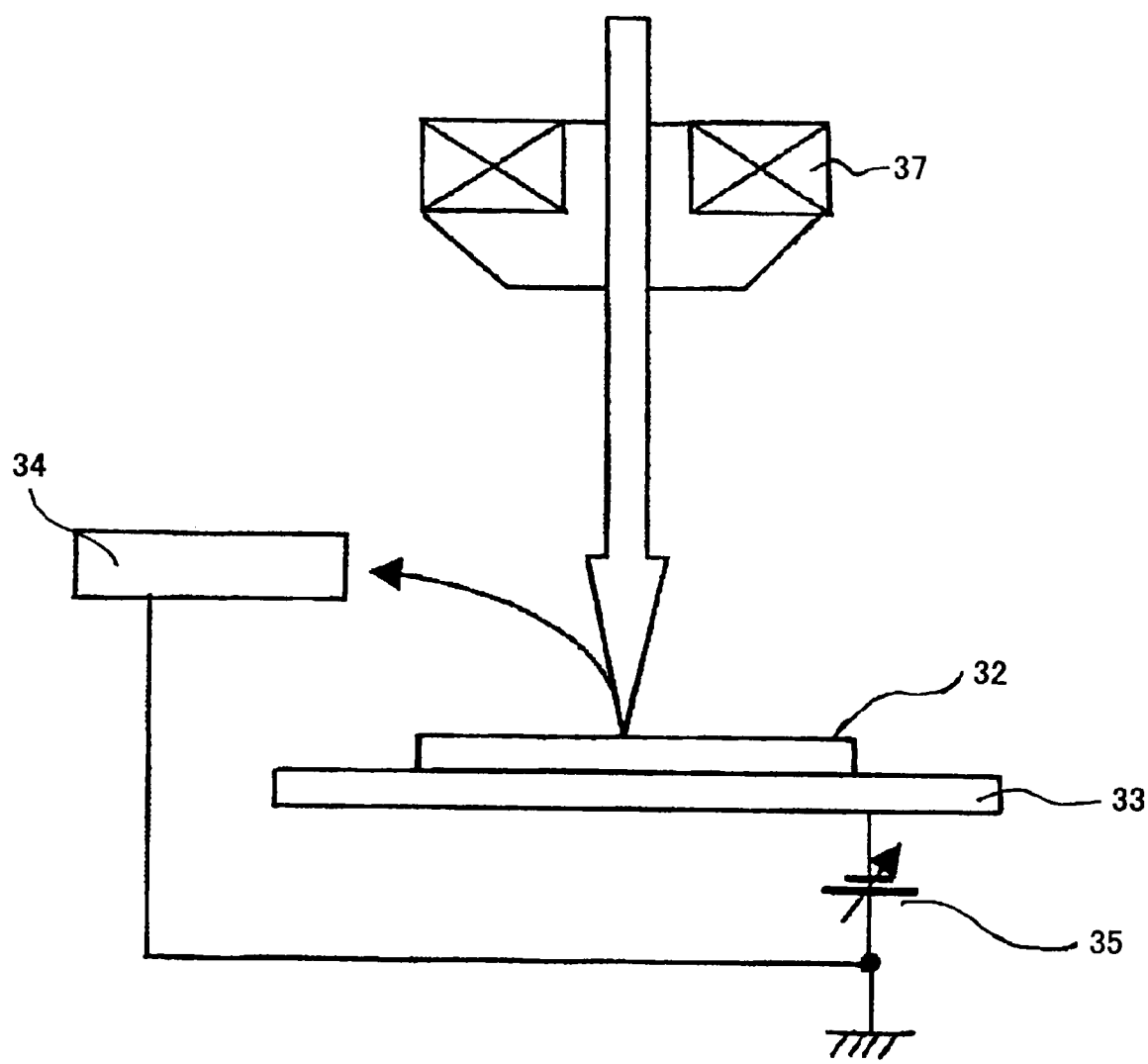
FIG. 14 is a diagram for explaining the method of applying the back bias voltage in the conventional method.

In addition, the connection of the sample and the electrode in the sample installation unit 60 shown in FIG. 14 is illustrated notionally, and a description thereof will be given later (see FIG. 16 or FIG. 17).

Each of the respective components is arranged in the same chamber 90, and the chamber 90 is maintained in the vacuum at the time of measurement.

Moreover, the charged particles in this embodiment mean the particles that are influenced by the electric field or the magnetic field, such as the electron beam or the ion beam. Hereafter, the preferred embodiment which irradiates the electron beam will be explained.

The charged particle irradiation unit 50 (which is the electron beam irradiation unit in the present embodiment) comprises the electron gun 51 for generating the electron beam, the beam monitor 52 for monitoring the electron beam generated by the electron gun 51, the capacitor lens 53 for converging the electron beam, the aperture 54 for controlling the irradiation current of the electron beam, the beam blanker 55 for switching on and off the irradiation of the electron beam, the scanning lens (deflecting coil) 56 for scanning of the electron beam from the beam blanker 55, and the objective lens 57 for focusing the electron beam from the scanning lens 56 again. The power supply for driving of each lens which is not illustrated is connected to each of the respective lenses.

In FIG. 15, the reference numeral 61 denotes the grid mesh electrode, 62 denotes the sample, 63 denotes the conductor (conductive material), 66 denotes the power supply, and 71 denotes the secondary electron detector, respectively.

In addition, when installing the sample on the sample support part, it is desirable to insert the insulator so that the back surface of the sample may not be grounded.

Moreover, the charged particle irradiation unit 50 has also the function as the charging unit for charging of the sample (photoconductor etc.) as well as the function of measurement of the electrostatic latent image.

Figure 22:
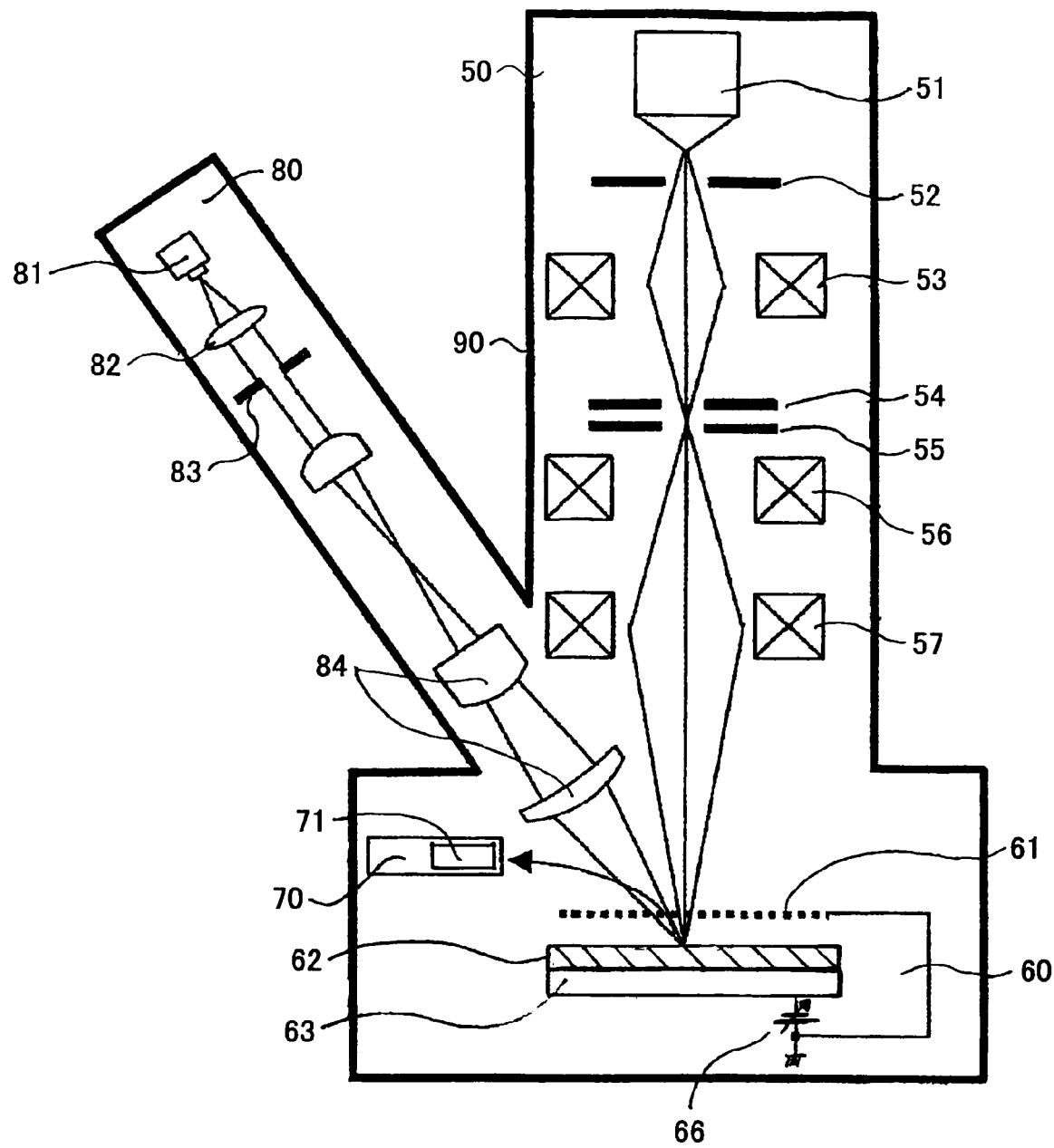
FIG. 22 is a diagram showing the composition of the surface potential distribution measurement device in another preferred embodiment of the invention which can carry out the charging, the exposure, and the electrostatic latent-image measurement.

Moreover, the exposure unit which includes the optical system may be provided in the composition of the surface potential distribution measurement device as in the following embodiment (FIG. 22).

The scintillator, the photo multiplier tube, etc. are used in the secondary electron detector 71 of the secondary electron detecting unit 70. On the other hand, in the case of the ion beam being used, the liquid-metal ion gun can be used instead of the electron gun.

Figure 16:
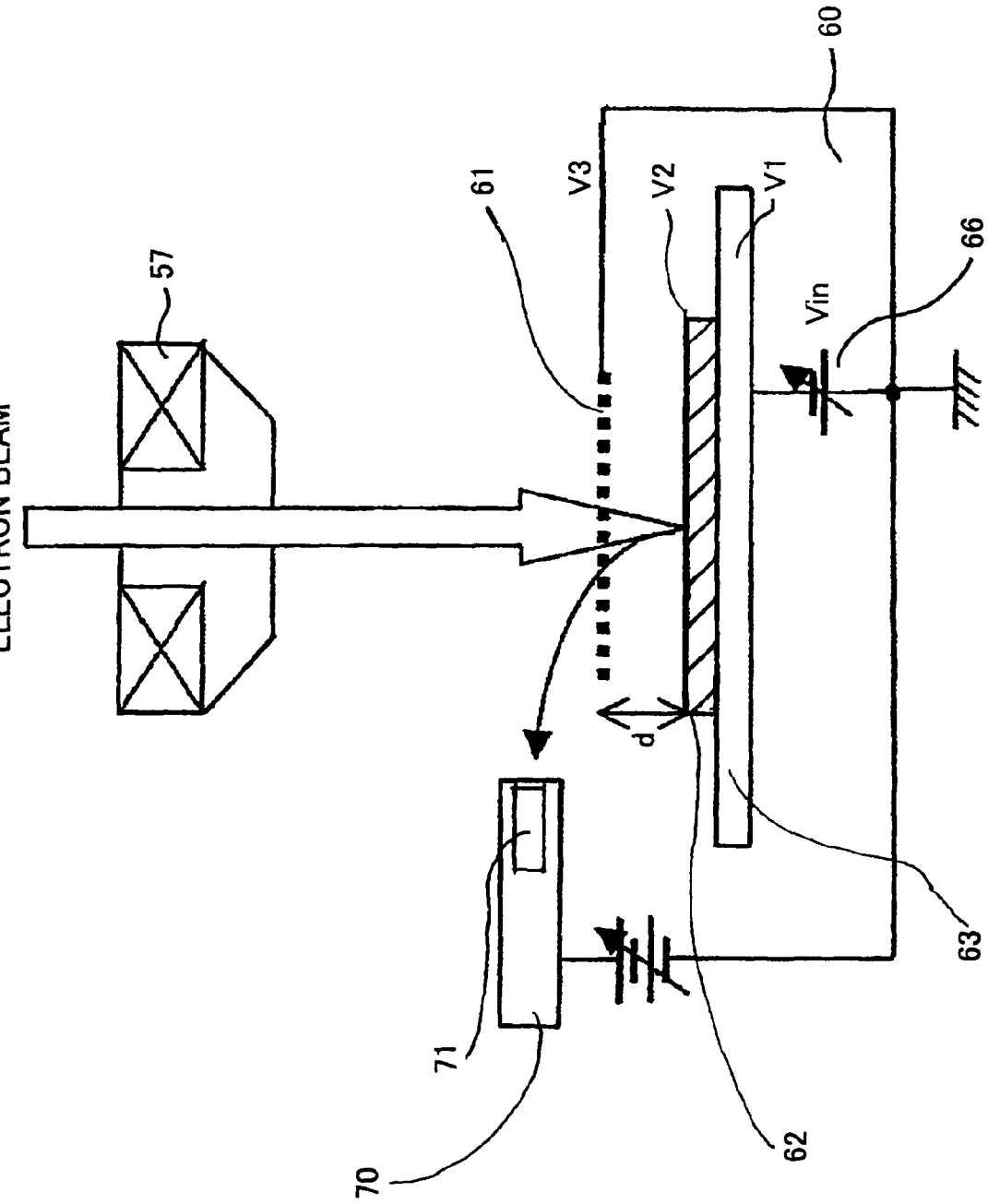
FIG. 16 is a diagram showing an example of the connection of the sample and the electrode installed in the sample installation unit in the surface potential distribution measurement device of the present embodiment.

FIG. 16 shows an example of the connection of the sample 62 (for example, photoconductor) and the electrode installed in the sample installation unit 60 in the surface potential distribution measurement device of the present embodiment.

The conductor (conductive material) 63 to which the voltage is applied is arranged on the back surface of the sample 62, and the grid mesh electrode 61 which is made of the conductive member is arranged above the sample 62. The conductor (conductive material) 63 may be a part of the sample itself.

Moreover, the grid mesh electrode 61 is grounded. The power supply 66 is the power supply which is capable of generating a high voltage in the order of several tens kV. The power supply 66 is provided so that it can set up arbitrarily the voltage value.

In FIG. 16, the potential (V1) of the back surface of the sample 62 is equal to the applied voltage (Vin). That is, assuming that V1 (=Vin) is the potential of the back surface of the sample 62, V2 is the potential of the front surface of the sample 62, V3 is the potential of the grid mesh electrode 61, and d is the distance between the sample 62 front surface and the grid mesh electrode 61, the average electric field intensity E that is generated between the sample 62 and the grid mesh electrode 61 is approximately represented by the following formulas:

$$E=(V3-V2)/d,\ V2=V1+Vc$$

where Vc is the equivalent for the potential accompanied with the charging electric charge. Therefore, the average electric field intensity E may be varied by varying the V1.

If the potential V3 of the grid mesh electrode is set to 0V or the potential near zero volt even when V1 is a high voltage which is equal to the acceleration voltage of the incidence electron, it is possible to control the influences on the incidence electron course. Moreover, it is also possible to change the sample electric field.

In this way, by arranging the grid mesh electrode as a conductive member for applying voltage, the bias component of the electric field intensity can be changed without interrupting the incidence charged particle beam (for example, the electron beam), and the problem, such as the bending of the incidence electron beam, can be overcome.

Figure 17:
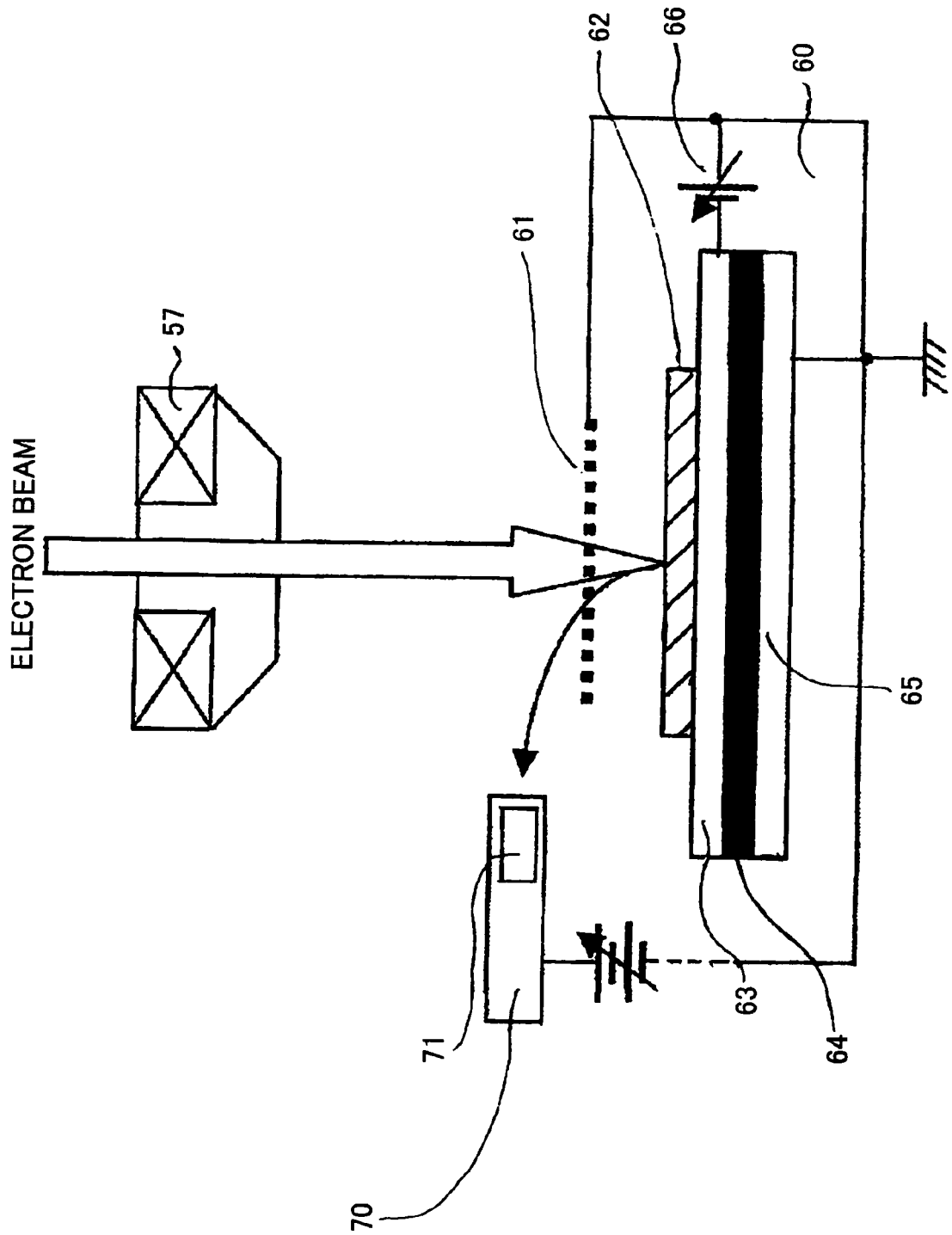
FIG. 17 is a diagram showing another example of the connection of the sample and the electrode installed in the sample installation unit through the insulator in the surface potential distribution measurement device of the present embodiment.

FIG. 17 shows another example of the connection of the sample and the electrode in the sample installation unit in the surface potential distribution measurement device of the present embodiment.

As shown in FIG. 17, in this composition, the insulator 64 is inserted between the back surface of the conductor (conductive material) 63 as shown in FIG. 16 and the sample support part 65.

In addition, the conductor (conductive material) 63 may be a part of the sample itself. Generally the sample support part 65 is grounded. For this reason, when the sample 62 lower part is made of the conductive material, it is desirable to insert the insulating material, such as a plastic resin, as the insulator 64 between the sample support part 65 and the sample 62. Thereby, the potential bias component can be varied so that the desired electric field intensity is obtained.

It is desirable that the grid mesh electrode 61 according to the invention is made of the conductive material, such as aluminum or stainless steel, and it is the non-magnetism or weak magnetism which does not affect the course of the incidence charged particles (electron etc.).

Without affecting the course of the incidence charged particle beam (for example, electron beam) by using the non-magnetic substance, the potential bias component can be changed so that the desired field intensity is obtained, and the surface potential distribution can be measured correctly.

Figure 18C:
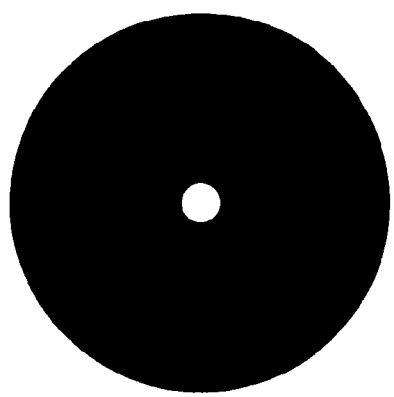
FIG. 18A, FIG. 18B and FIG. 18C are diagrams showing examples of the grid mesh electrode which is arranged above the beam incidence side surface of the sample.
Figure 18B:
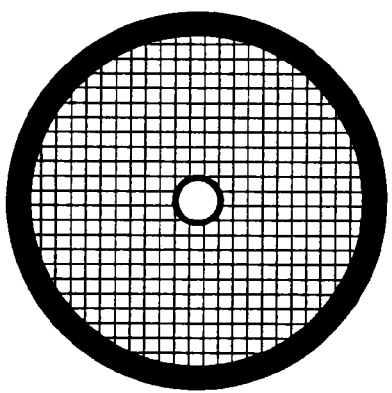
Figure 18A:
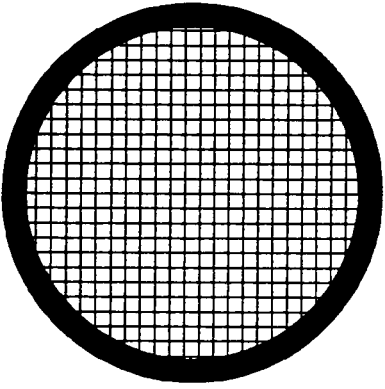

Moreover, FIG. 18A to FIG. 18C show some examples of the grid mesh electrode which is arranged above the beam incidence side surface of the sample.

As shown, any of the normal grid mesh electrode (FIG. 18A), the grid mesh electrode with hole (FIG. 18B), and the hole plate (FIG. 18C) may be used as the grid mesh electrode according to the invention.

Such grid mesh electrodes are suitable because they do not interrupt the incidence charged particles (for example, electrons), and can shift the bias level of the electric field distribution uniformly. The pitch and form of the grid mesh are decided according to the measurement subject or imaging magnification, and the grid mesh electrode can be made suitable and can be used properly.

On the other hand, the bias component of the electric field intensity in the sample surface can be shifted to the desired value by applying the bias voltage to the sample upper surface.

For example, what is necessary is just to arrange the grid mesh electrode 1 mm above the upper part of the sample surface, and to apply the voltage of −2000V to the lower electrode of the sample surface, in order to shift the field intensity of $2\times10^6$ V/m as the bias component.

Figure 19A:
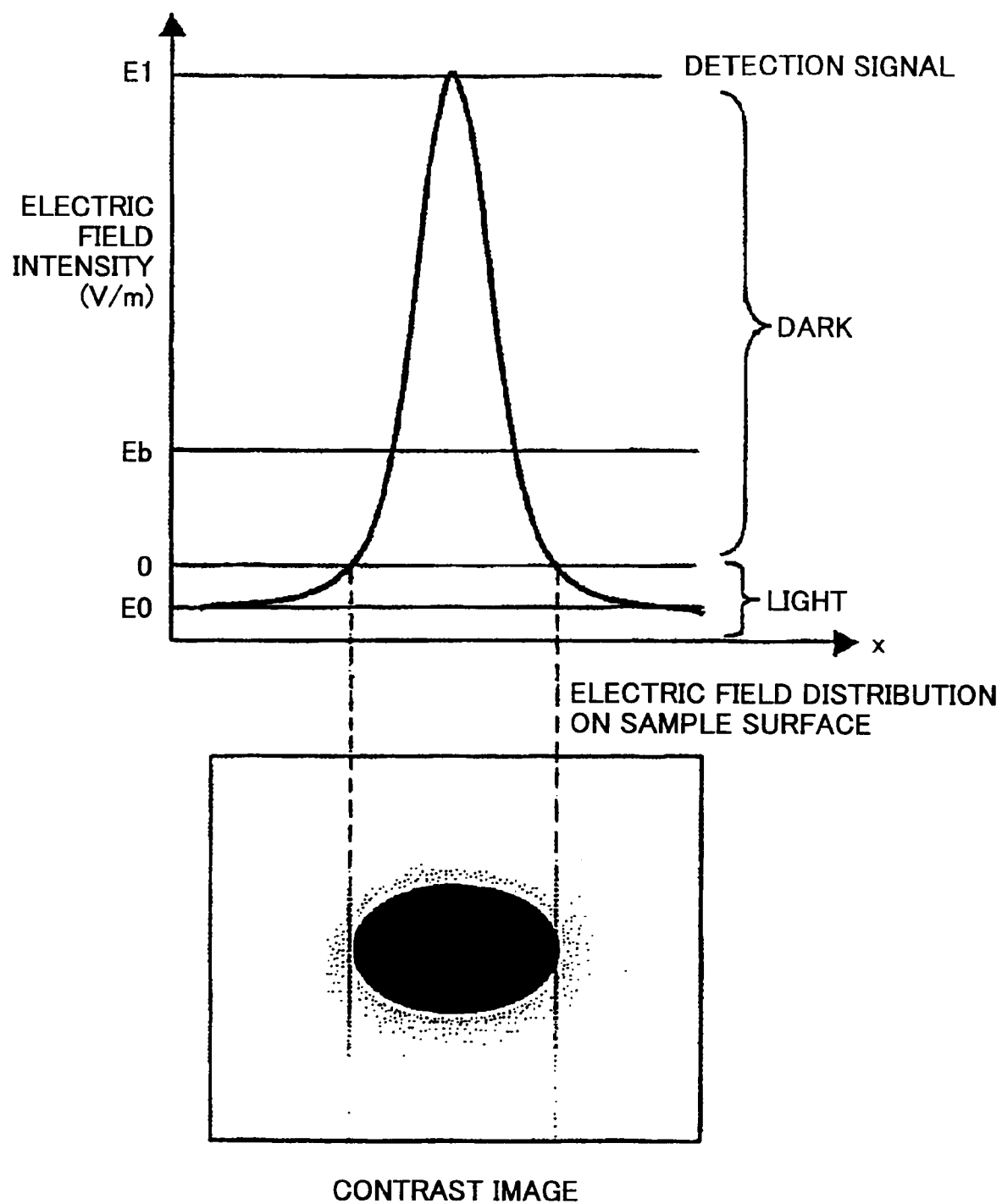
FIG. 19A and FIG. 19B are diagrams for explaining the difference in the contrast image between the case where there is no field intensity bias and the case where there is the electric field bias Eb applied.
Figure 19B:
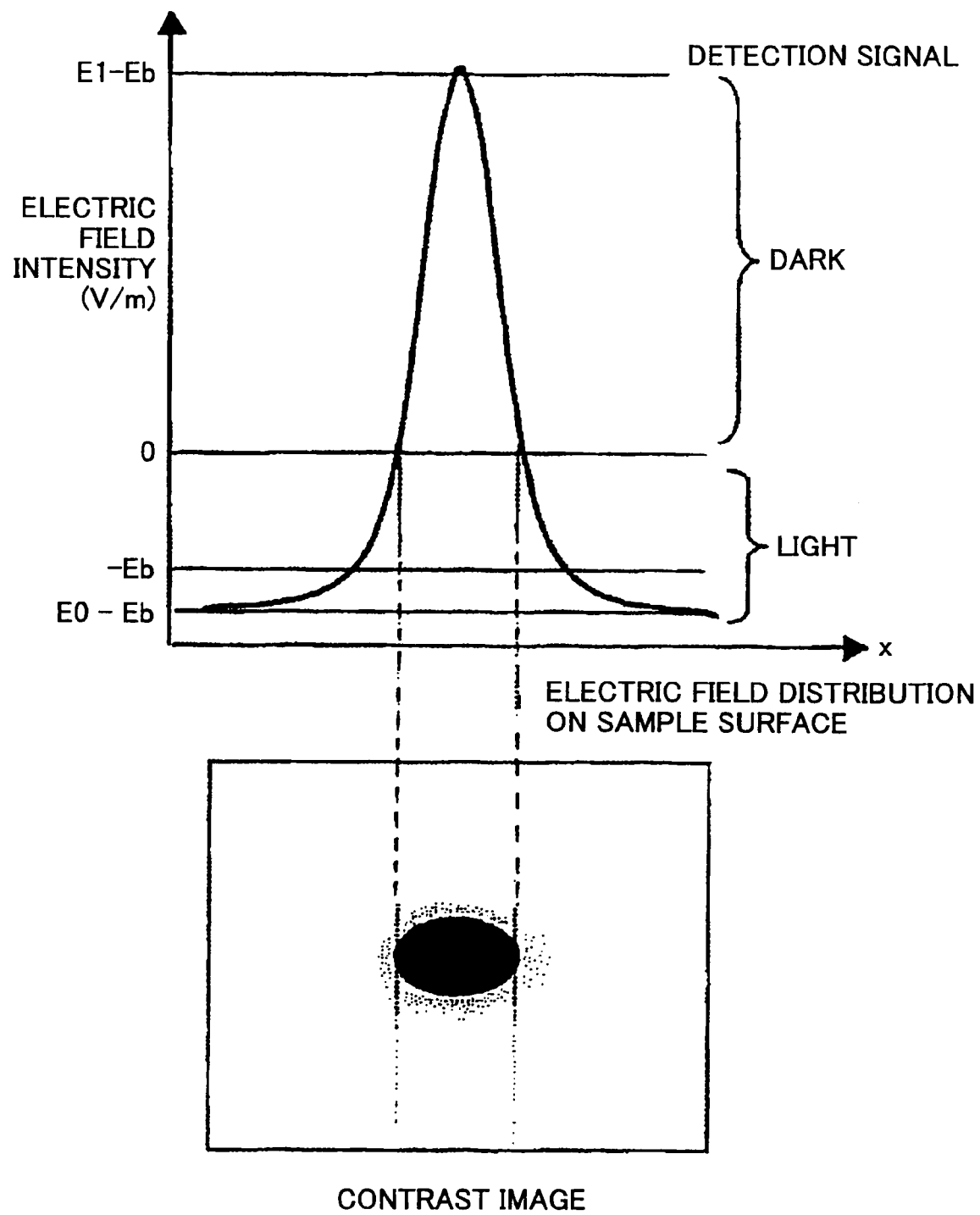

FIG. 19A and FIG. 19B are diagrams for explaining notionally the difference in the contrast image between the case where there is no field intensity bias (FIG. 19A) and the case where there is the bias electric field (Eb) applied (FIG. 19B).

As shown in FIG. 19A and FIG. 19B, the light and darkness are made by the contrast image on bordering on the field intensity of Eb before the bright portion increases and carries out the bias shifting as a result of the electric field bias shifting.

Accordingly, since the portion of the electric field intensity E=Eb in the original state is set to E=0 by the bias shifting, it is possible to obtain the electrostatic latent-image distribution of the approximately binary image by setting that electric field intensity to the threshold level. By carrying out the image processing of the measurement result, the diameter of the latent image can be computed.

According to the present embodiment, the contrast image when setting an arbitrary electric field intensity to the threshold level is obtained by changing the potential bias and the electric field intensity formed on the sample surface as mentioned above.

Moreover, the measurement in which the potential bias component Eb of the electric field intensity is varied to the sample upper surface is repeated for a plurality of times, and it is possible to compute the latent-image profile (the profile of the electrostatic latent-image distribution) of the surface potential distribution by acquiring the data (latent-image data) and carrying out computation processing of the obtained data on the computer.

Figure 20:
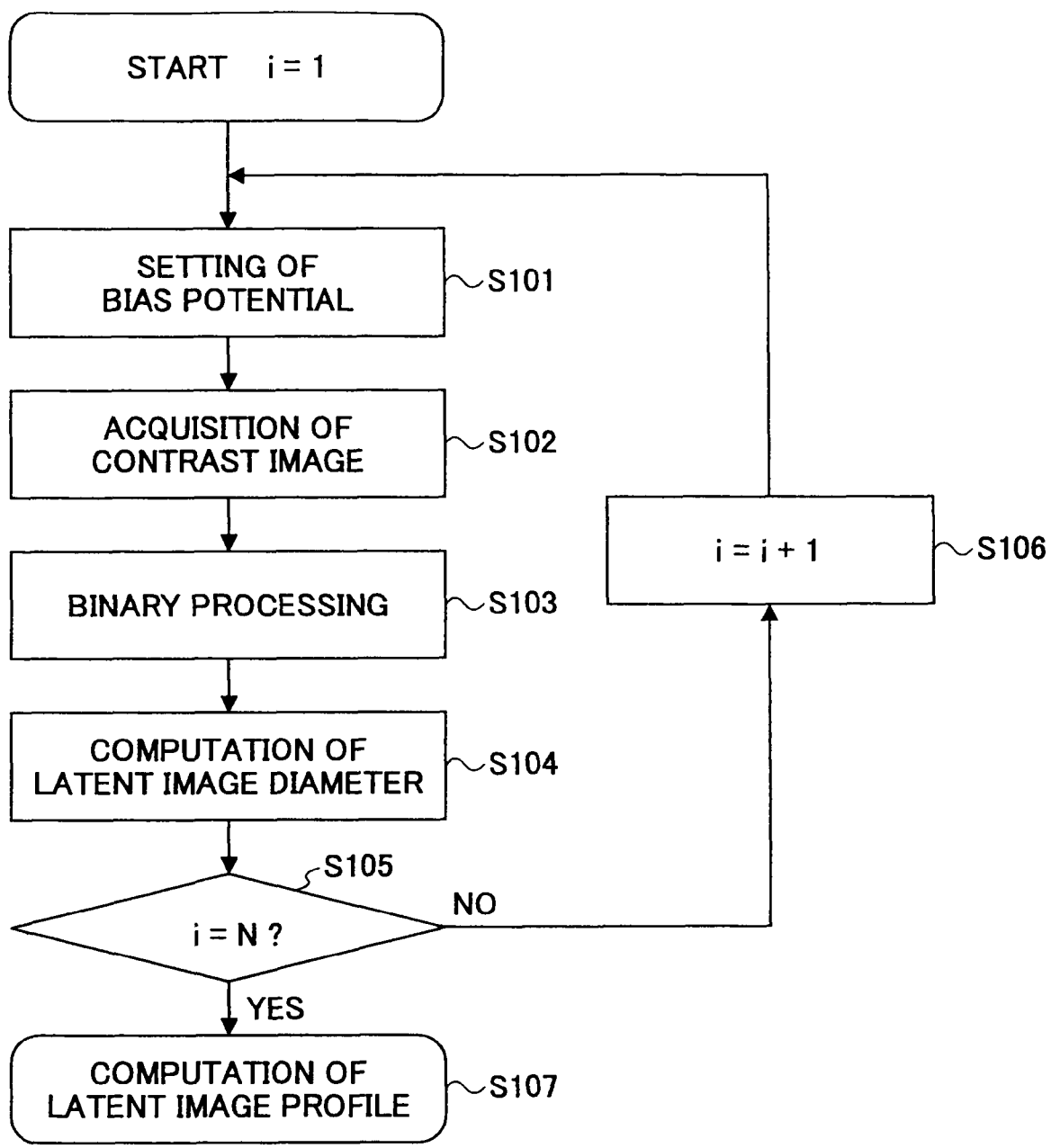
FIG. 20 is a flowchart for explaining the procedure which computes the latent-image profile of the surface potential distribution based on the plurality of measurement results which are obtained by measuring the surface potential distribution repeatedly every time the electric field intensity is varied.

FIG. 20 shows the procedure which computes the latent-image profile of the surface potential distribution (electrostatic latent-image distribution) based on the plurality of measurement results which are obtained by measuring the surface potential distribution repeatedly every time the electric field intensity is varied (the value of Eb is varied N times).

Upon starting of the procedure of FIG. 20, the sample is placed in the measurement device, and the bias potential Eb (i=1) of the 1st step (i=1) is set by using the parameter i which indicates the number of times of measurement as i=1 (step S101).

Then, the acquisition of the contrast image is performed (step S102). The contrast image means the region into which the surface potential distribution is divided for every threshold and for every measurement. The contrast image is subjected to the binary processing, and the resulting digital data is obtained, and it is transferred to the computer which is the computation unit (step S103).

Then, the diameter D1 of the latent image, i.e., the diameter of the contrast image in the direction of x, is computed based on the received digital data (step S104).

Next, it is determined at step S105 whether the value of the parameter i exceeds the maximum number N of times of measurements (i=N?).

When the result at the step S105 is negative, the parameter i is incremented (step S106). The control is returned to the above steps S101 to S105, and a new measurement threshold is set up, and the acquisition of the contrast image and the calculation of the diameter of the latent image are performed.

When the result at the step S105 is affirmative, the plurality of values of the latent image diameters D1 to DN are obtained in correspondence with the plurality of measurement thresholds Eb (1) to Eb (N) at the N stages. Thus, the latent-image profile is computed based on the plurality of measurements results using the computer (step S107).

Furthermore, there is the method of changing the drawing-in voltage of the detector as another method of changing the bias component of the electric field intensity.

The secondary electron detector is prepared in the secondary electron detecting unit of the present invention. Since the secondary electron which this secondary electron detector combined the scintillator (phosphor) and the photoelectron multiplier tube, and was generated from the sample detected has low energy, it accelerates under the influence of the electric field of the high voltage applied on the surface of the scintillator, and it is changed into light.

Through the light pipe, with the photoelectron multiplier tube (PMT), this light is amplified as the current and taken out as a current signal.

As mentioned above, in the present invention, secondary electronic images are observable by irradiating and scanning the electron beam on the sample, for example.

Usually, the drawing-in voltage from the scintillator is about 10 kV, and the electric field near the sample is only about $1 \times 10^4$-$10^5$ V/m. For this reason, when the electric field generated by the potential distribution of the sample is larger, it is easy to be influenced of the sample electric field.

Therefore, the bias component of the electric field intensity is changeable by enlarging the drawing-in voltage of the detector or bringing the detector close to the sample.

The profile of the electrostatic latent-image distribution can be measured by repeating the measurement in which the bias component of the electric field intensity on the sample upper surface is varied two or more times.

Moreover, the bias shifting of the electric field intensity can also be more effectively realized by a combination of enlarging of the drawing-in voltage of the detector and bringing of the detector close to the sample.

Moreover, it is possible to use the MCP (micro channel plate) instead of the scintillator. The current is collected by the current collection electric field applied to the input side of MCP, the secondary electron inputted into MCP is amplified, and it is increased by the thousands times. The signal components of the secondary electron is increased sharply and such amplification enables it to raise the S/N ratio of the image signal.

According to the measuring method and device of the surface potential distribution of the present embodiment, the potential bias component of the sample and the electric field intensity formed on the sample surface are varied, the contrast image in which the arbitrary field intensity is set to the threshold level can be obtained, and the electric field distribution in the vertical direction near the sample surface which is formed by the surface potential distribution or its potential distribution of the dielectric-substance sample can be measured with high resolution.

By measuring the electrostatic latent image of the photoconductor, it becomes possible to improve the process quality and improvement in quality, such as high resolution, the raise in the durability, high stabilization, and energy saving, can be attained.

In the present embodiment, while making easy device composition of surface potential distribution measurement by using the electron beam as a charged particle beam to irradiate, it is easy to consider as the suitable composition for electrostatic latent-image measurement of the electrophotographic photoconductor.

Figure 21:
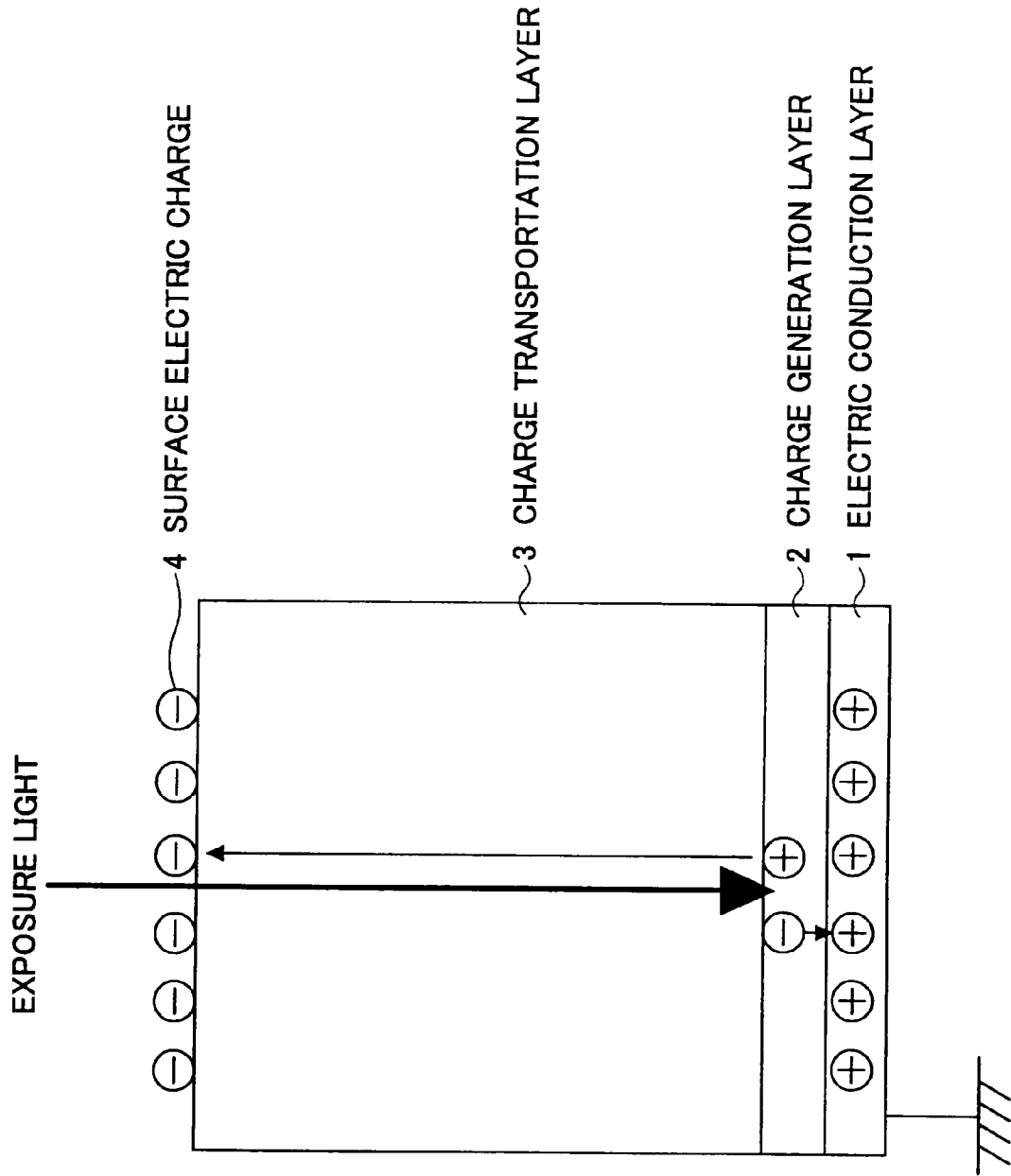
FIG. 21 is an enlarged diagram showing the composition of the principal part of the photo conductor.

Next, an example of the method of forming the electrostatic latent image in the photoconductor sample will be described. FIG. 21 shows the composition of the principal part of the photoconductor.

As shown in FIG. 21, the photoconductor usually comprises the electric charge generation layer (CGL) 2 and the electric charge transportation layer (CTL) 3 on the electric conduction layer (conductive support object) 1.

When exposure is carried out in the state where the electric charge (surface electric charge 4) is charged on the surface of the photoconductor of FIG. 21, light will be absorbed by the electric charge generation material (CGM) of the electric charge generation layer (CGL) 2, and the charge carriers of positive/negative polarity will occur.

One side of the carriers is poured into the electric charge transportation layer (CTL) 3, and the other side is poured into the electric conduction layer 1 by the electric field. By the electric field, the carriers poured into the electric charge transportation layer 3 move even to the CTL surface, combines the inside of CTL with the surface electric charge 4 of the photoconductor, and disappears. This forms the potential distribution of the electrostatic latent image on the photoconductor surface.

Specifically, the surface of the photoconductor will be charged by irradiation of the electron beam to the photoconductor. The acceleration voltage E1 in this case is set to an acceleration voltage higher than the acceleration voltage E0 at which the ratio (delta) of the secondary-electron-emission from the surface of the photoconductor is set to 1.

Thus, when the setting occurs, the amount of incidence electrons may exceed the amount of discharge electrons, the electron is accumulated on the photoconductor and the excessive charging occurs. Consequently, the sample can be charged to the negative polarity. The desired charging potential can be formed by setting the acceleration voltage and the irradiation time appropriately.

Next, the exposure of the charged photoconductor is performed using the exposure unit including the optical system, and the electrostatic latent image is measured.

FIG. 22 shows the composition of the surface potential distribution measurement device in another preferred embodiment of the invention which can carry out the charging, the exposure, and the electrostatic latent-image measurement.

The charged particle irradiation unit 50 of FIG. 22 has the function as the charging unit which electrifies the sample other than the measurement function of the surface potential distribution, as described above with FIG. 14.

And the exposure unit 80 of FIG. 22 includes the light source 81 which has sensitivity about the photoconductor, the collimator lens 82, the aperture 83, the imaging lens 84, etc., and it is possible to create the desired beam diameter and the beam profile on the sample 62 installed in the sample installation unit 60.

Moreover, the suitable exposure time and exposure energy can be irradiated by the LD control unit as described below.

In order to form the pattern of the line, it is possible to attach the scanning mechanism which uses the galvano mirror and the polygon mirror for the optical system.

Figure 23:
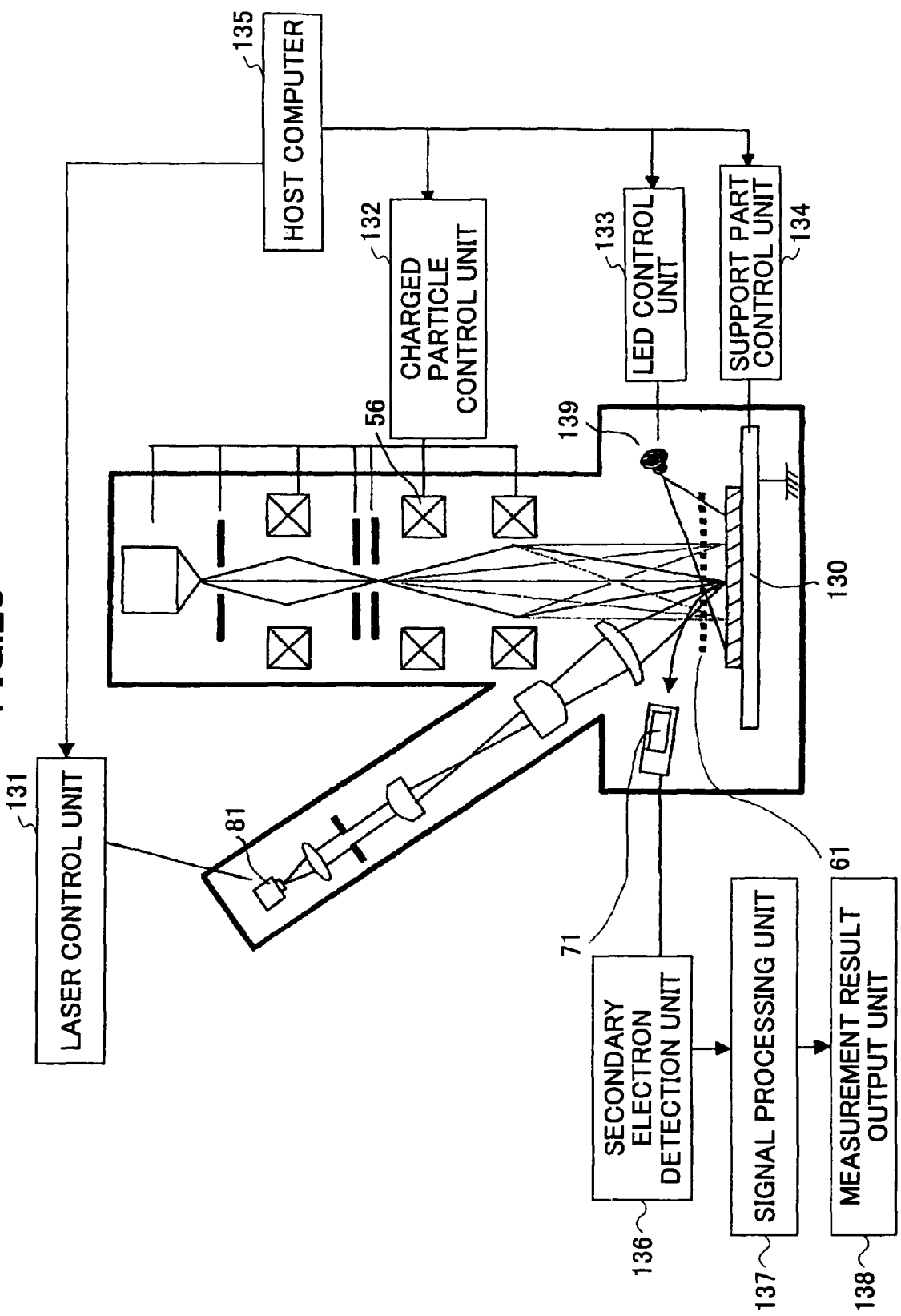
FIG. 23 is a diagram showing the composition of the respective control units used for the preferred embodiment of FIG. 22.

FIG. 23 shows the composition of the respective control units used in the embodiment of FIG. 22.

As shown in FIG. 23, there are provided the LD control unit 131 which controls the light source 81, the charged particle control unit 132 which controls the scanning lens 56, the LED control unit 133 which controls the light source 139 for electric charge erasing, and the sample support part control unit 134 which controls movement of the sample support part 130. The LD control unit 131, the charged particle control unit 132, the LED control unit 133, and the sample support part control unit 134 are controlled by the host computer 135.

Moreover, the output of the secondary electron detector 71 is detected by the secondary electron detecting unit 136, and this detection signal is processed by the signal processing unit 137 and the secondary electronic measurement result is outputted from the measurement result output unit 138.

Figure 24:
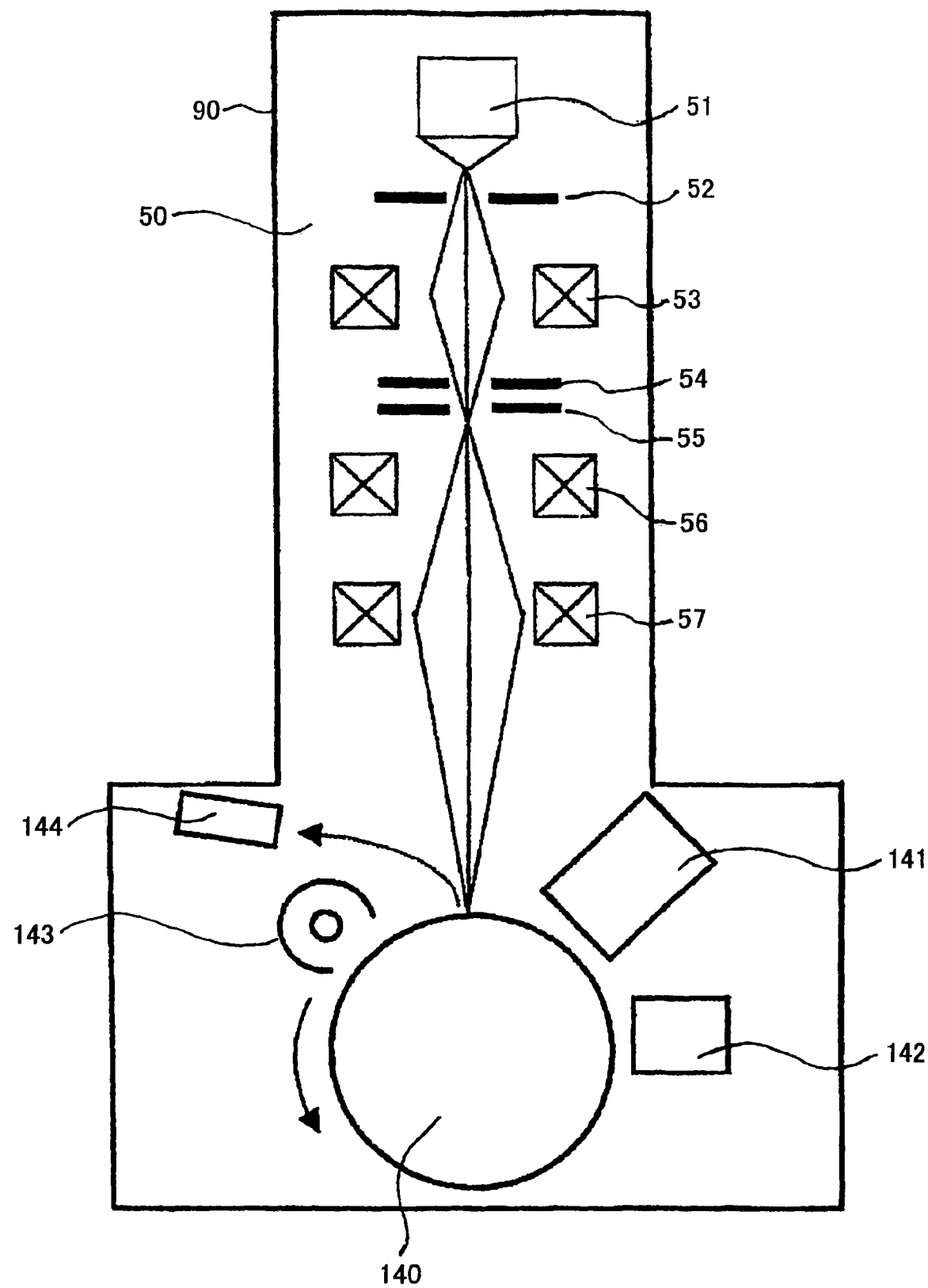
FIG. 24 is a diagram showing the composition of the surface potential distribution measurement device in the preferred embodiment of the invention which enables the measurement of the cylindrical-form sample.

Furthermore, FIG. 24 shows the composition of the surface potential distribution measurement device (photoconductor electrostatic latent-image distribution measurement device) in the preferred embodiment which enables measurement when the sample is in the cylindrical form.

Especially the embodiment that enables the measurement of the cylindrical form sample is suitable for the non-destructive measurement of the electrostatic latent image on the electrophotographic photoconductor on the practical application level.

As shown in FIG. 24, in the one chamber 90, in order to measure the exposure unit 141 for exposing the charging unit 142 for forming the potential distribution in the surface of the sample (photoconductor) 140 which includes the cylindrical form, and the photoconductor 140, and the charged sample surface, and the potential distribution, the charged particle irradiation unit 50 (the present embodiment electron beam irradiation unit) which irradiates and scans the charged particle, and the detecting element 144 which detects the secondary electron which created are arranged.

In addition, the electric discharge unit 143 for electric discharge of the residual charge is formed.

The electron beam irradiation unit 50 is similarly comprised with that shown in FIG. 15 or FIG. 22 from the electron gun 51, the beam monitor 52, the capacitor lens 53, the aperture 54, beam blanker 55, the scanning lens (deflecting coil) 56, and the objective lens 57. The power supply for the drive which is not illustrated is connected to each lens.

The secondary electron detector, such as the scintillator and the photo multiplier tube, is used for the detecting element 144 of the secondary electron.

In addition, when irradiating the ion beam, the liquid-metal ion gun etc. can be used instead of the electron gun.

As mentioned above, the process quality of each process can be raised by attaining real-time measurement, becoming possible to measure the electrostatic latent image of the photoconductor which the amount of surface electric charges decreases with time to the high resolution of the micron order, and feeding back the electrostatic latent image of the measured photoconductor to the design by having the charging unit required in order to form the electrostatic latent image, and the exposure unit.

Accordingly, high resolution, the raise in the durability, high stabilization, and energy saving can be attained.

The scanning mechanism can be attached to the optical system of the charged particle irradiation unit (electron beam irradiation unit) in the present embodiment.

By adding the scanning mechanism, arbitrary latent-image patterns including the line pattern can be measured in the direction of the main scanning of the cylindrical-form sample (photoconductor).

Figure 25:
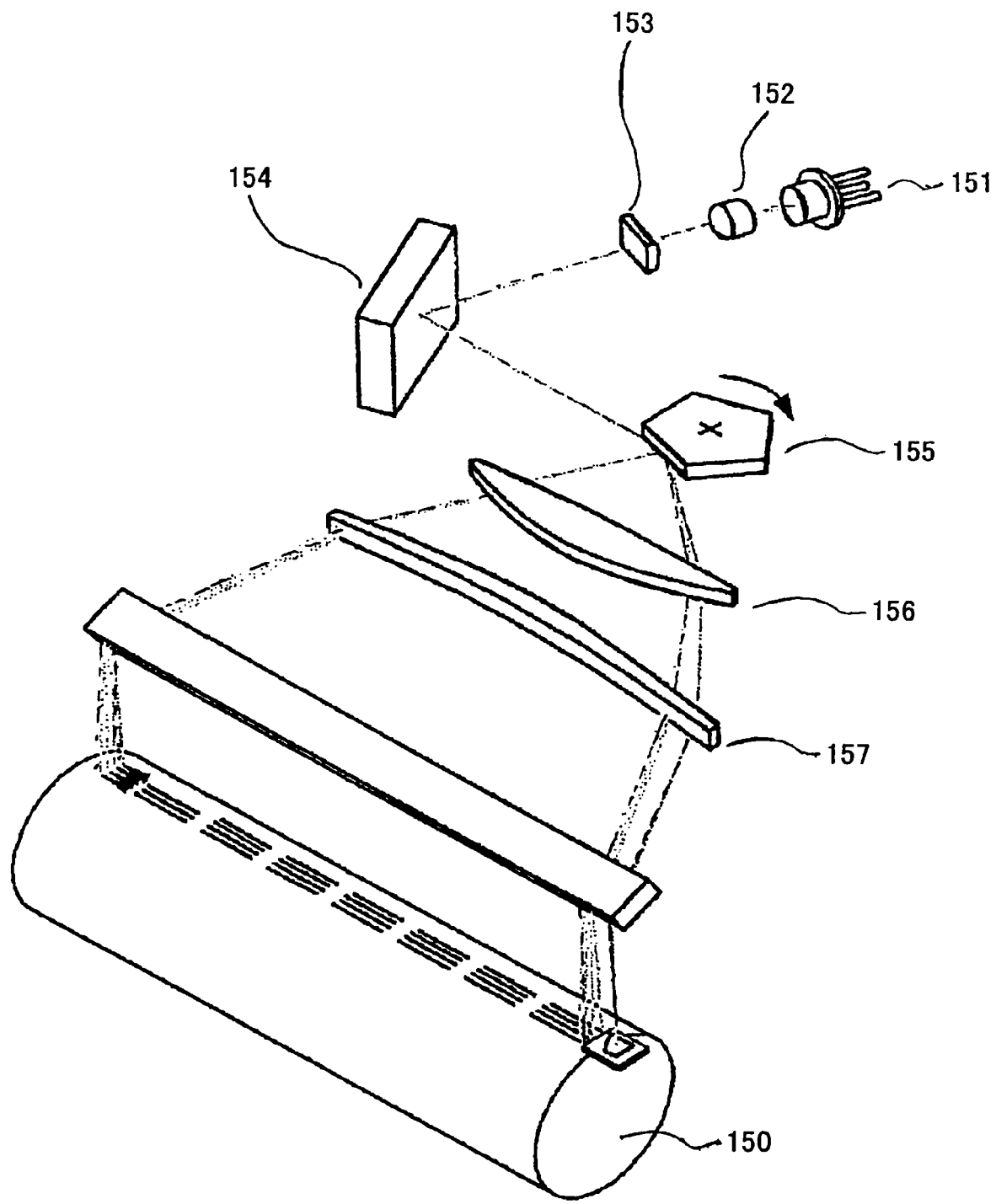
FIG. 25 is a diagram showing the composition of the exposure optical system in which the scanning mechanism is provided in the optical system of the charged particle irradiation unit (electron beam irradiation unit) according to the invention.

The example of composition of the exposure optical system which prepared the scanning mechanism in the optical system of the charged particle irradiation unit (electron beam irradiation unit) in the present embodiment is shown in FIG. 25.

The optical system of FIG. 25 comprises the light source 151 which includes the semiconductor laser (LD) of the wavelength which is sensitive to the photoconductor 150 in the cylindrical form, the collimator lens 152, the cylinder lens 153, the reflector mirror 154, the polygon mirror 155 as a deflector, the scanning lens L1 (156), and the scanning lens L2 (157), etc.

The light source 151 is controlled by LD control unit which is not illustrated, and can be irradiated now on the suitable conditions. Therefore, the arbitrary electrostatic latent images which include the line pattern to the direction of the main scanning line can be measured as mentioned above.

As a light source, by using the semiconductor laser (LD), it can contain efficiently and control of the exposure time can be made easy into the limited installation space.

Next, a description will be given of the insulation resistance measurement device according to the invention with reference to FIG. 26A through FIG. 31.

The insulation resistance measurement device according to the invention is provided to measure an insulation resistance of a sample such as a photoconductor with high precision in the order of micrometers.

Figure 26A:
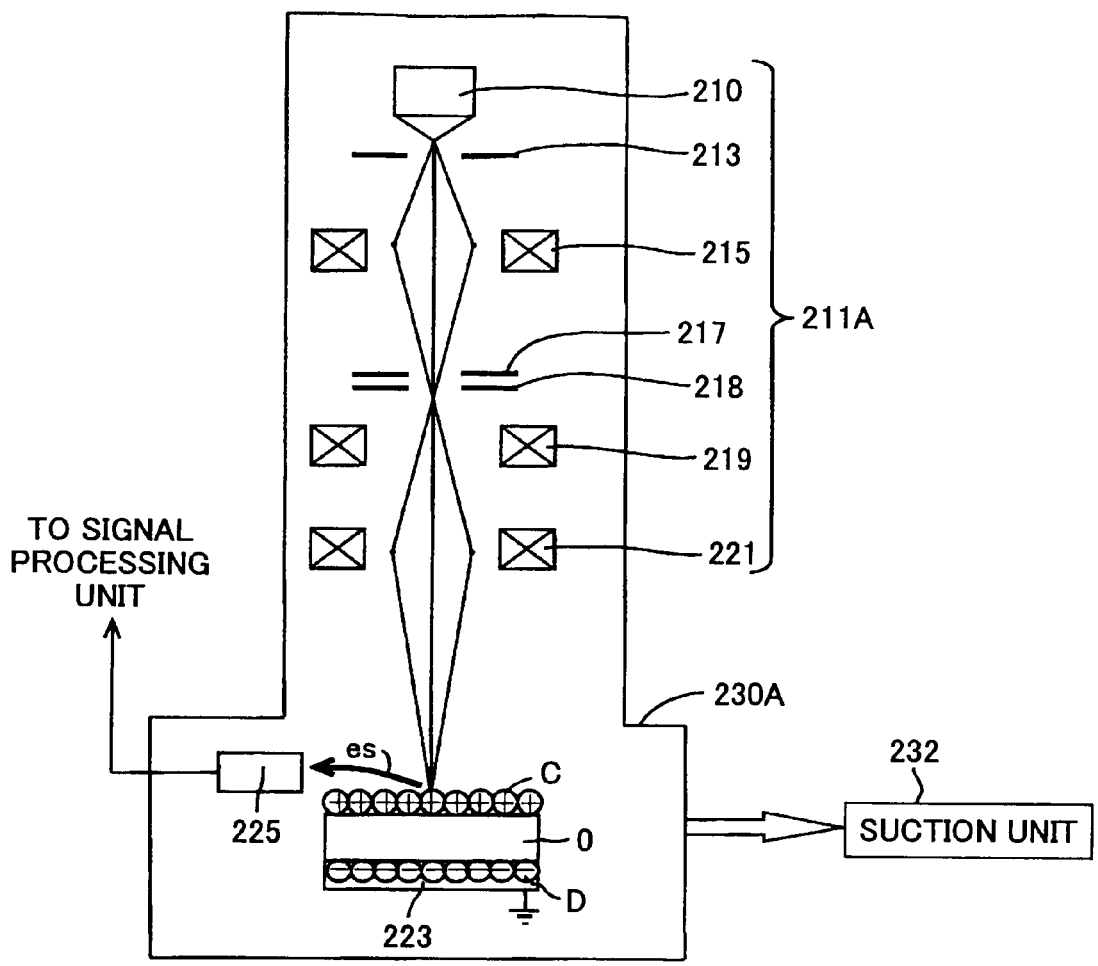
FIG. 26A, FIG. 26B and FIG. 26C are diagrams showing the insulation resistance measurement device in the preferred embodiment of the invention.

FIG. 26A shows the composition of the insulation resistance measurement device in the preferred embodiment of the invention, which measures the dielectric intensity of a dielectric-substance sample 0.

In the composition of FIG. 26A, the dielectric-substance sample 0 having a dielectric intensity being measured is placed on the conductive plate-like support unit 223 which is grounded. In the upper part by the side of the surface of the dielectric-substance sample 0, the electron beam irradiation unit 211A is arranged.

The electron beam irradiation unit 211A comprises the electron gun 210 which emits the electron beam, the beam monitor 213, the condenser lens 215, the aperture 217, the beam blanker 218, the scanning lens 219, and the objective lens 221. These elements are connected to the power supply which is not illustrated and are controlled by the control unit (not shown) such as the computer.

The beam monitor 213 is provided for monitoring of the intensity of the electron beam emitted by the electron gun 210, and the condenser lens 215 is provided as the electron lens for converging the electron beam from the electron gun 210. The aperture 217 is provided for controlling the current density (the quantity of irradiation potential per unit time) of the irradiation current by the electron beam, and the beam blanker 218 is provided for switching ON/OFF of the irradiation of the electron beam to the dielectric-substance sample 0.

The scanning lens 219 is provided as the deflecting coil for making the electron beam which passed the beam blanker 218 scan in a two-dimensional manner, and the objective lens 221 is provided for converging the scanning electron beam onto the surface of the dielectric-substance sample 0.

That is, the electron beam emitted from the electron gun 210 passes the beam monitor 213, and is converged at the position of the aperture 217 and the beam blanker 218 with the condenser lens 215, and deflected in two-dimensional manner with the scanning lens 219 as the deflecting coil. Thus, the deflected electron beam is converged toward the surface of the dielectric-substance sample 0 with the objective lens 221.

The electron beam which is deflected in two-dimensional manner with the scanning lens 219 scans the surface of the dielectric-substance sample 0 in two-dimensional manner as mentioned above. That is, electron beam irradiation unit 211A and the control unit constitute the scanning unit.

In FIG. 26A, the reference numeral 225 denotes the charged particle capture unit. The signal outputted from the charged particle capture unit 225 is sent to the signal processing unit which is not illustrated. For example, the signal processing unit may be provided as a part of function of the computer which constitutes the control unit. According to the information inputted, the signal processing unit performs the predetermined processing and evaluates the dielectric intensity of the dielectric-substance sample 0.

That is, the charged particle capture unit 225 constitutes the signal-detection unit. Moreover, the signal processing unit which is not illustrated may constitute the evaluation unit.

The electron beam irradiation unit 211A, the plate-like support unit 223, and the charged particle capture unit 225 are accommodated in the sealed casing 230A, and the inside of the sealed casing 230A may be decompressed to the substantial vacuum state by the suction unit 232. The suction unit 232 is controlled by the above-mentioned control unit which is not illustrated.

Therefore, the plate-like support unit 223, the sealed casing 230A, the suction unit 232, and the control unit constitute a support unit which holds the sample whose dielectric intensity is to be measured.

In the present embodiment, the scanning unit may be provided also as the charging unit.

An example of the measurement by the insulation resistance measurement device of FIG. 26A which evaluates the dielectric intensity of the sample 0 when the dielectric-substance sample 0 is a thin-plate polycarbonate (PC) will be explained.

If the dielectric intensity of PC is the case where the thickness of the dielectric-substance sample is 50 micrometers when this is made into this evaluation value since it is about 20 V/micrometer, it should just give 1 kV or the charging potential beyond it in the thickness direction.

First, the dielectric-substance sample 0 is charged in the scan of the electron beam. That is, the dielectric-substance sample 0 is charged as an charging unit using the scanning unit.

Electrification is performed so that the surface side of the dielectric-substance sample 0 may become negative polarity.

In the case where using the scanning unit, making it into the charging unit is carried out the irradiation current at the time of charging the irradiation current at the time of the signal detection large carrying out and shortening charging time leads to shortening of the measuring time. In order to change the amount of irradiation current (current density) electrically, it is good to change the amount of current which changes the focal length of the condenser lens 215 electrically, and passes the aperture 217.

Figure 26B:
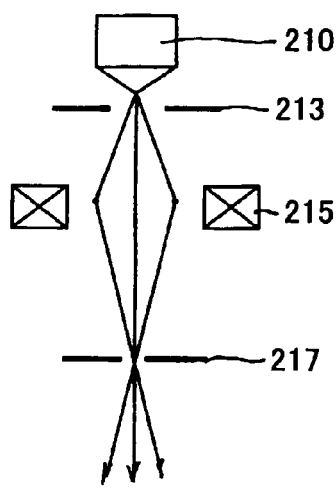
Figure 26C:
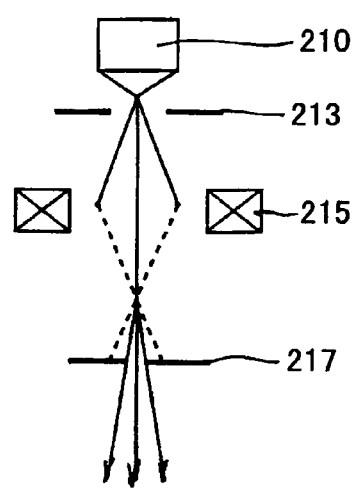

That is, the irradiation current which a part of electron beam is intercepted by the aperture 217 since incidence is carried out to the aperture 217, the electron beam converging before the aperture 217 and emitting if the focal length of the condenser lens 215 is shortened as it is shown in FIG. 26C, although irradiation current is large if the electron beam is converged on the opening of the aperture 217 with the condenser lens 215 as shown in FIG. 26B, and goes to the dielectric-substance sample 0 becomes small.

Even if it makes the focal length of the condenser lens 215 longer than the case of FIG. 26B, irradiation current can be made small as mentioned above.

It is possible also by changing the diameter of the aperture 217 to change the size of irradiation current. In addition, by adjustment with the aperture 217 and the condenser lens 215, irradiation current can be changed or can be changed.

Although the condenser lens 215 is the electromagnetic lens in the example under explanation, the same is said of the electrostatic lens.

When charging the dielectric-substance sample 0, the irradiation current is made larger than the time of the signal detection, and the measurement region (for example, 1 mm around) of the surface of the dielectric-substance sample 0 is scanned in two-dimensional manner.

At this time, the charging polarity of the dielectric-substance sample 0 changes with the magnitude of acceleration voltage E of the electron beam. Namely, the secondary-electron-emission ratio (delta) is represented by the formula delta=Not/Nin, where Not is the secondary electron number discharged and Nin is the incidence electron number irradiated.

If the acceleration voltage is gradually increased from 0 and energy of the electron beam is enlarged, the secondary electron number emitted will increase initially, but, with increase of the acceleration voltage, the secondary electron number reaches the maximum and it will decrease after the maximum is reached.

That is, the secondary-electron-emission ratio delta increases initially with increase of the acceleration voltage, and it is set to delta=1 by the acceleration voltage E1, and if the acceleration voltage increases after that, after greeting the maximum, it decreases to one or less more than by acceleration voltage E2.

Therefore, if acceleration voltage E is set as the range of E1<=E<=E2, the surface of the dielectric-substance sample 0 will be charged in positive polarity with the scan of the electron beam.

The acceleration voltage set to one in the example under explanation after secondary-electron-emission ratio delta exceeds the maximum. It is set as acceleration voltage (E>E2) higher than E2, and negative charging of the dielectric-substance sample 0 is carried out. Thus, if the two-dimensional scan is performed, in order that the amount of incidence electrons by the scan may exceed the amount of discharge electrons, the electron will be accumulated at the surface of the dielectric-substance sample 0, and uniform charging of the surface side of the dielectric-substance sample 0 will be carried out at negative polarity. In FIG. 26A, the letter C denotes the accumulated electron.

Moreover, since the plate-like support unit 223 close to the back surface of the dielectric-substance sample 0 is grounded by the conductivity, the positive charge (indicated by the letter D in FIG. 26A) which balances with the minus electric charge by the side of the surface of the dielectric-substance sample 0 will be excited on the border plane with the dielectric-substance sample 0, and field intensity will be given in the thickness direction of the dielectric-substance sample 0.

The acceleration voltage the desired charging potential can be formed by setting up E and irradiation time appropriately.

If charging is continued after the dielectric-substance sample 0 reaches the charging potential of 1 kV, charging voltage increases, and partially, by the bad part of the dielectric intensity, the breakdown will arise, the hole will flow into the dielectric-substance sample 0 from the plate-like support unit 223, and it will offset the minus electric charge by the side of the sample surface.

Such electric offset arises locally and the electric charge distribution arises in the surface side of the dielectric-substance sample 0. And the electric field distribution according to the surface electric charge distribution is formed in the space by the side of the surface of the dielectric-substance sample 0.

In this state, the amount of current of the irradiation current by the scanning unit is changed to the signal detections, and the two-dimensional scan for the signal detections is performed.

And the secondary electron "es" is captured with the charged particle capture unit 225. The charged particle capture unit 225 is what combined the scintillator (phosphor) and the photoelectron redoubling pipe, and the secondary electrones applied and drawn to the surface of the scintillator by power supply (not shown), is captured by the scintillator by the electric field of voltage, and is changed into scintillation light. Through the light pipe, with the photo multiplier tube, this light is amplified as the current and taken out as a detection signal (current signal).

Figure 27A:
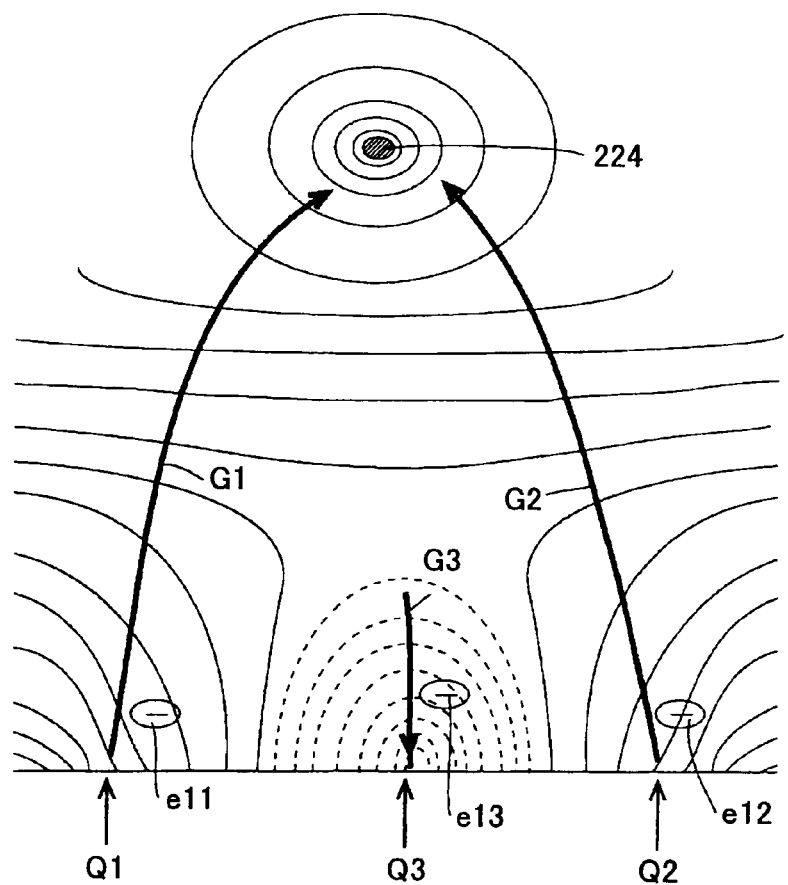
FIG. 27A and FIG. 27B are diagrams for explaining the detection of the secondary electron.
Figure 27B:
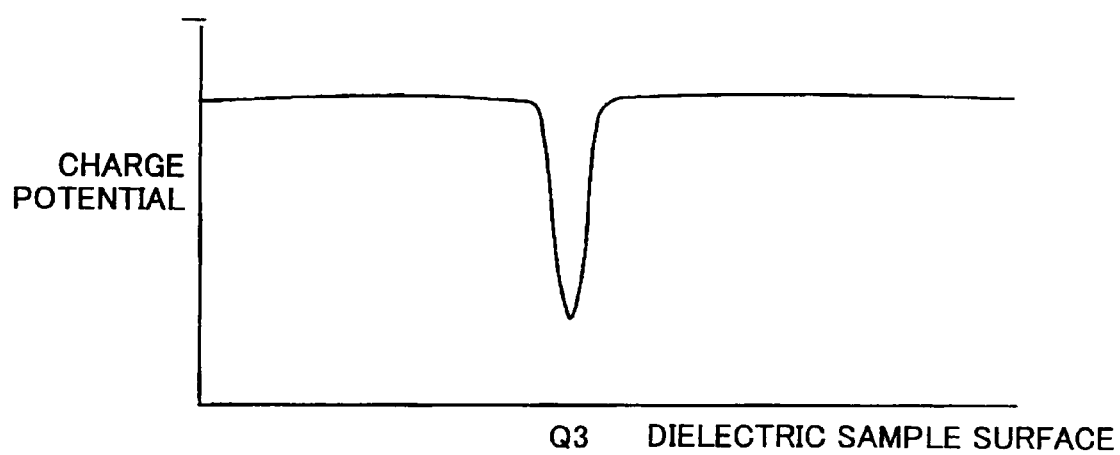

FIG. 27A shows the potential distribution in the space between the scintillator 224 and the dielectric-substance sample 0 in the charged particle capture unit 225 wherein the distribution is indicated by the contour line display. The surface of the dielectric-substance sample 0 is in the state uniformly charged in negative polarity, if the portion which potential decreased by the breakdown is removed, and it becomes as it approaches the scintillator 224 from the surface of the dielectric-substance sample 0 in the potential contour line group shown as the solid line, since the potential of positive polarity is given to the scintillator 224 of the charged particle capture unit 225.

Therefore, the secondary electrons e11 and e12 generated in Q1 point of FIG. 27A, which is the portion which carries out uniform charging at negative polarity in the dielectric-substance sample 0, or Q2 point are pulled to the right potential of the charged particle capture unit 224, as shown in the arrow G1 or G2, they are displaced, and they are captured by the scintillator 224.

The portion into which the negative potential decreased Q3 point by breakdown in FIG. 28A on the other hand it is about Q3 point the arrangement of the potential contour line, so that it is as the dashed line shows, and it is close to Q3 point in this partial potential distribution potential becomes high. If it puts in another way, as the arrow G3 shows, the electric force restrained to the dielectric-substance sample 0 side will act on the secondary electron e13 generated in Q3 point near.

For this reason, the secondary electron e13 is captured in the potential hole which the potential contour line of the dashed line shows, and does not move toward the charged particle capture unit 224. FIG. 28B shows the potential hole typically.

The intensity (secondary electron number) of the secondary electron detected with the charged particle capture unit 225 includes the portion with large intensity the normal portion by which the breakdown is not carried out (it is the portion which carries out negative charging uniformly). It will correspond to the portion represented by the point Q1 or Q2 of FIG. 28A, and the portion with small intensity will be equivalent to the portion (which is represented by the point Q3 of FIG. 28A) into which the negative potential decreased as an absolute value by the breakdown.

At this time, 2-dimensional coordinates express region (evaluation region) S scanned by the electron beam in two-dimensional manner by S (x y). For example, the region is 0 mm$\leq$x$\leq$1 mm. 0 mm$\leq$y$\leq$1 mm.

This region where the surface potential distribution currently formed in S (x y) is set to V (x y)(<0). If the time to result from the start of the two-dimensional scan of the dielectric-substance sample 0 by the electron beam in the end is made into T0<=T<=TF, the time T when the scan is performed corresponds to each scanning position in scanning region S (x y), and there is the one-to-one correspondence.

Therefore, the electric signal (detection signal) acquired by the secondary electronic detecting element 225 is sampled by the suitable sampling time, and, with the signal processing unit, the surface potential distribution V (X, Y) can be determined for every minute region corresponding to the sampling time by making the sampling instant (tau) into the parameter. In the signal processing unit, the surface potential distribution V (X, Y) is constituted as the two-dimensional image data, and it is outputted to the output device (not shown). The output device is formed as a part of the evaluation unit is made. Thus, the state of the breakdown in the evaluation region will be obtained by using the output device as a visible image.

For example, if the intensity of the secondary electron captured is represented by the intensity of brightness of the image, the image portion of the normal portion where negative charging is made uniformly becomes bright, and the portion (the portion of potential damping) where the breakdown arises becomes dark, and it can be outputted as a light-and-dark image.

In addition, even if the actual evaluation region is minute, the image outputted from the output device is suitably expandable to the size of the request suitable for observation.

Thus, it can determine whether the dielectric-substance sample 0 starts the breakdown or where the breakdown occurs, as a result the insulation resistance can be evaluated.

The insulation resistance measurement device described above with FIG. 26A comprises the support unit 223 and 230A which holds the sample 0 whose dielectric intensity is to be measured, the charging unit 211A which charges the sample 0 held by the support unit and gives electric field intensity in the thickness direction of the sample, the scanning unit 211A which scans the surface of the charged sample 0 with the charged particle beam, the signal-detection unit 225 which obtains the detection signal by the scanning of the scanning unit, and the evaluation unit (signal processing unit which is not illustrated) which evaluates the dielectric intensity of the sample 0 based on the signal detected by the signal-detection unit.

Moreover, in the above-described insulation resistance measurement device, the electric field intensity of 10 V/micrometer or more is given in the thickness direction of the sample 0, the electron beam is used as the charged particle beam which scans the surface of the sample 0, and the scanning unit 211A which irradiates the electron beam is used as the charging unit which charges the sample 0.

Moreover, in the above-described insulation resistance measurement device, the scanning unit which irradiates the electron beam comprises the condenser lens 215 and the aperture 217, and selectively changes the amount of irradiation current between the time of acquiring the detection signal and the time of charging the sample 0 by using the condenser lens 215 and/or the aperture 217. And the secondary electron of the electron beam is detected and the detection signal is acquired.

Moreover, in the above-described embodiment, the electric charge leak location (the portion where potential damping arises due to electric charge leaking caused by the breakdown) in the sample is detected based on the detection signal which is obtained by detecting the secondary electron.

According to the insulation resistance measurement device of FIG. 26A, the surface of the sample 0 which is charged and gave the electric field intensity in the thickness direction is scanned in two-dimensional manner with the charged particle beam, and the insulation resistance measurement in which the dielectric intensity of the sample 0 is evaluated is carried out based on the detection signal acquired by the scanning.

Moreover, in the insulation resistance measurement device of FIG. 26A, the latent-image support object may be used as the sample whose dielectric intensity is to be measured. Hereafter, a description will be given of such insulation resistance measurement device.

In the following embodiment, as a latent-image support object, the photoconductor of function separation type mentioned above is taken for an example.

FIG. 28A shows the structure of the photoconductor 01 of function separation type.

As is well known, the photoconductor 01 is formed in the composition so that the lower coat layer 310 is formed on the conductive substrate 300, and the laminating of the electric charge generation layer 320 and the electric charge transportation layer 330 is performed on the lower coat layer 310.

In FIG. 28A, there is shown the photoconductor (which is a latent-image support object) as the dielectric-substance sample 01. In the state of FIG. 28A, the sample 01 is placed on the plate-like support unit 223 of FIG. 26A, and negative charging of the surface layer is performed with the electrons C by the scanning of the electron beam similar to the previous embodiment.

At this time, the positive charge D is injected into the conductive substrate 300 from the plate-like support unit 223, and it is excited on the boundary with the lower coat layer 310.

The upper figure of FIG. 28B shows typically the state where the breakdown arose into the portion shown with the signs DM1 and DM2 of the photoconductor 01. In these portions DM1 and DM2, the hole (electron hole) is poured into the lower coat layer 310 from the substrate 300 side, the electric charge generation layer 320 and the electric charge transportation layer 330 are moved, and the minus electric charge by the side of the photoconductor surface is canceled. The charged potential of the portion is damped by the cancellation.

The lower figure of FIG. 28B shows the state of this potential damping typically. If the visible conversion to signals of the state (electric charge leak location) where scanned by the electron beam, captured the secondary electron generated with the scan with the charged particle capture unit 225, acquired the detection signal, and processed this in the signal processing unit, for example, the breakdown is carried out is carried out as such a state was explained previously, as shown in FIG. 28C will be obtained.

Specifically, the absolute value EA of the field intensity acting in the thickness direction of the photoconductor is set to EA=|V/d|=30 V/micrometer, where the film thickness of the photoconductor 300 (the total thickness of the lower coat layer 310, the electric-charge generation layer 320, and the electric-charge transportation layer 330) is d=30 micrometer, and the charging potential is V=−900V.

If the lower coat layer 310 does not withstand the electric field intensity EA, the electric charge leak occurs with hole blocking from the location of the lower coat layer 310 where the dielectric intensity is the weakest, and the hole arrives at even the photoconductor surface, which cancels the minus electric charge on the surface of the photoconductor and causes the electric charge distribution to arise on the surface. The secondary electron in this state is detected by the scanning of the electron beam, and it is possible to determine the electric charge leak location (FIG. 28C) by the breakdown with high precision in the order of micrometers.

It is desirable that the total amount of electric charges irradiated to the sample per unit area is larger than 1E-8 coulomb/mm in the case where the dielectric intensity is evaluated by making the latent-image support object into the dielectric-substance sample. The total electric charge per unit area (charge density) Cm is represented by the formula Cm=A t/S where A is the irradiation current A, S is the irradiation area, and t is the irradiation time. For example, the appropriate condition is the irradiation current 5E-10 A, the irradiation area 1 mm$^2$, and the irradiation time 20 seconds. It is appropriate that the irradiation time t is lengthened in proportion to the irradiation area S. If the irradiation current A is enlarged, the irradiation time t becomes shorter accordingly.

If the irradiation time is lengthened and the total amount of electric charges irradiated to the sample is increased, the electric charge leak location will appear notably so much.

For example, if the irradiation is performed for 5 minutes in the conditions of the irradiation current 1E-9 A and the irradiation area 1 mm$^2$, the total amount of electric charges is set to 3E-7 coulomb/mm$^2$, and time will be taken somewhat. However, the electric charge leak location appears notably, which clarifies the difference between a conforming product and a defective product.

Usually, the isolation resistance voltage required for the latent-image support object is usually 30 V/micrometer or more, and for the higher end version is 40 V/micrometer. It is desirable that the percentage of the electric charge leak region (which is the ratio of the area s of the electric charge leak region to the whole surface area SA of the evaluation region) is 1% or less under the conditions. It is known by experience that it is not conspicuous as ground dirt in the output image if the percentage of the electric charge leak region is 1% or less.

Therefore, the conditions for the latent-image support object being a conforming product are that the isolation resistance voltage is above 30 V/micrometer and below 40 V/micrometer, the amount of electron irradiated to the sample is above 1 nano-coulomb/mm$^2$, and the percentage of the insulation resistance region (which the ratio of the area of the region where the breakdown does not occur to the whole area of the evaluation region) is 99% or more.

Figure 29A:
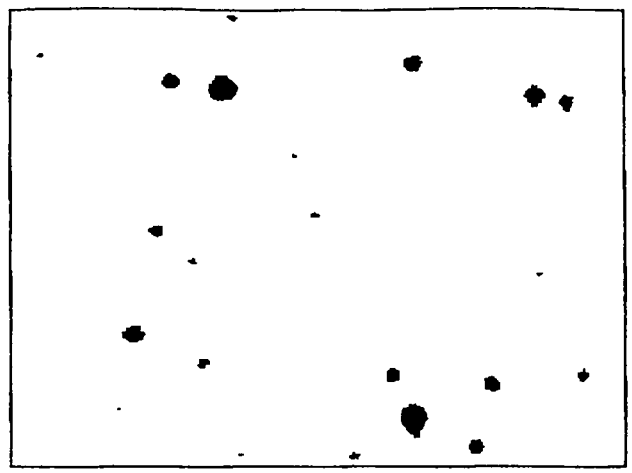
FIG. 29A and FIG. 29B are diagrams showing examples of the measurement result.

FIG. 29A shows the result of measurement when the irradiation to the latent-image support object is continued for the irradiation time t=4 minutes by the irradiation current A=1E−9 A and the irradiation area S=1.47 mm$^2$.

The charge density Cm irradiated in this example is Cm=At/S=1.6E-7 coulomb/mm$^2$. The insulation resistance is so high that the ratio of the area of the region where the electric charge leak occurs is small at this time.

In the example of FIG. 29A, the electric charge leak area ratio 1.2%, and the insulation resistance region ratio is 98.8%, and it is found that this sample is a defective product in which ground dirt tends to appear. On the other hand, in the example of FIG. 29B, the electric charge leak area ratio is 0.4%, and it is found that this sample is a conforming product in which the hole size is sufficiently small.

In the case of the latent-image support object, as far as electric charge leak is concerned, the photoconductor sample with the insulation resistance high and there are few leak regions is better. However, if the insulation resistance is high too much, there is a possibility that the potential does not fully fall when it is made to exposure may arise. By taking into consideration this matter, it can be said that the photoconductor with the electric charge leak region percentage in the range of between 0.05% and 1.0% is a conforming product.

Figure 30:
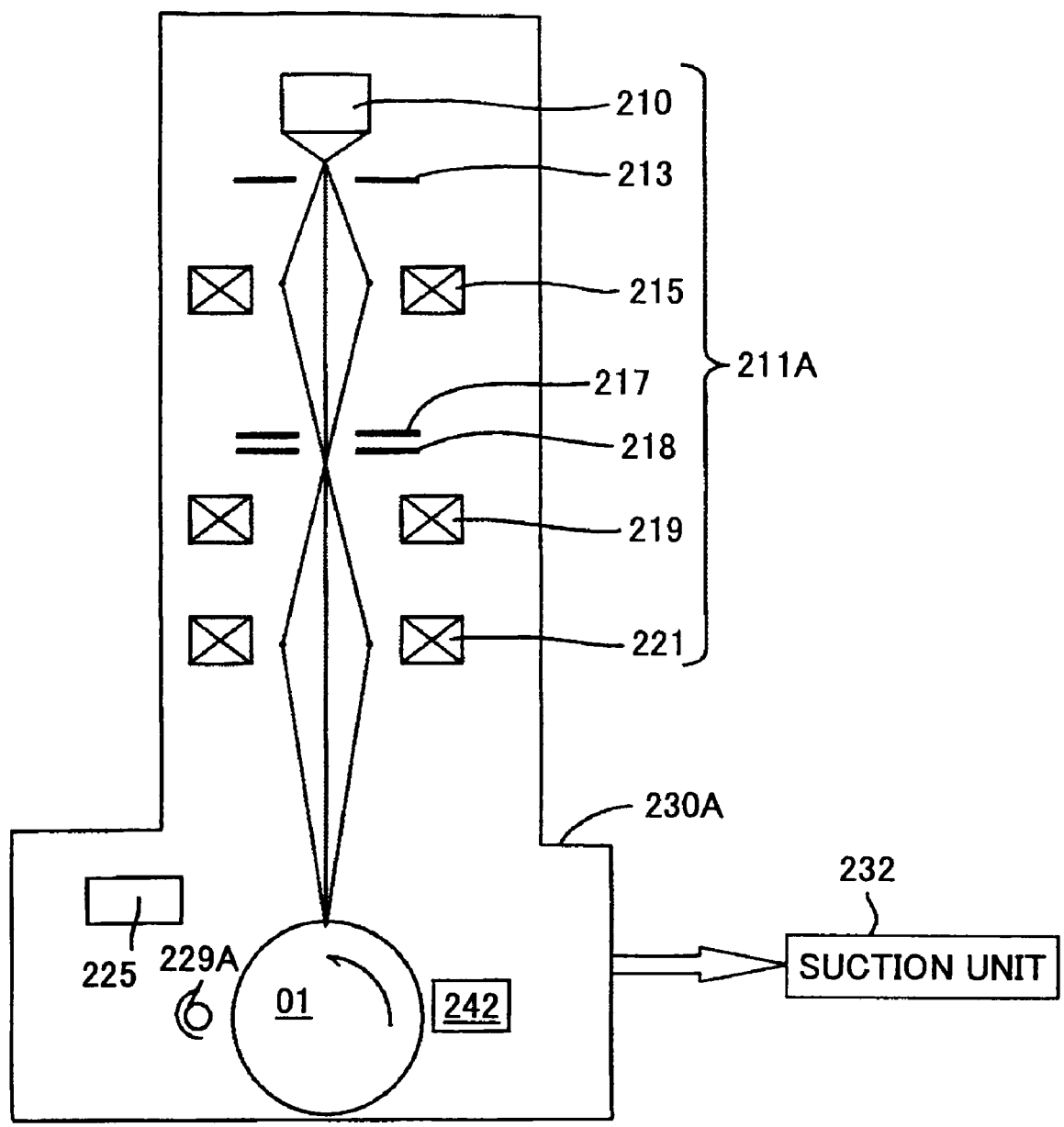
FIG. 30 is a diagram for explaining the insulation resistance measurement device in another preferred embodiment of the invention.

FIG. 30 shows another embodiment of the insulation resistance measurement device.

In FIG. 30, the elements which are the same as corresponding elements in FIG. 26A are designated by the same reference numerals, and a description thereof will be omitted for the sake of convenience of explanation.

In the embodiment of FIG. 30, the dielectric-substance sample 01 is the latent-image support object, and is the photoconductor of function separation type mentioned above with FIG. 28A.

The dielectric-substance sample 01 is formed in the shape of a photoconductor drum, and uniform rotation is carried out in the direction of the arrow (counterclockwise rotation) by the drive unit which is not illustrated. After the sample 01 is set in the casing 230A, the inside of casing 230A is highly decompressed by the suction unit 232.

The charging unit 242 is, for example, a contact type charging unit having the charging brush, the charging roller, etc., and carries out contact charging of the dielectric-substance sample 01 uniformly within the casing under pressure reduction.

At this time, uniform rotation of the sample 01 is carried out in the direction of the arrow (counterclockwise rotation).

Of course, the dielectric-substance sample 01 can also be charged by charging using the electron beam as in the example of FIG. 26A.

Although the scan of the electron beam by electron beam irradiation unit 211A may be performed by deflecting the electron beam in two-dimensional manner as in the embodiment of FIG. 26A, since the scan is received the dielectric-substance sample 01 carrying out uniform rotation in the direction of the arrow, the electron beam can be deflected in one dimension in the direction which intersects perpendicularly with the drawing, and the two-dimensional scanning can also be realized combining this deviation and rotation of the dielectric-substance sample 01.

The electric discharge lamp 229A, preceding measuring the dielectric intensity, irradiates uniformly the surface of the dielectric-substance sample 01 which is uniformly rotated, and makes the state of the dielectric-substance sample 01 suitable for measurement.

In addition, what is necessary is to be able to use other charged particle beam, for example, the ion beam, and just to, use the liquid-metal ion gun etc. instead of the electron gun in that case, of course, although each form of the operation explained above explained the case where the electron beam was used as a charged particle beam.

Figure 31:
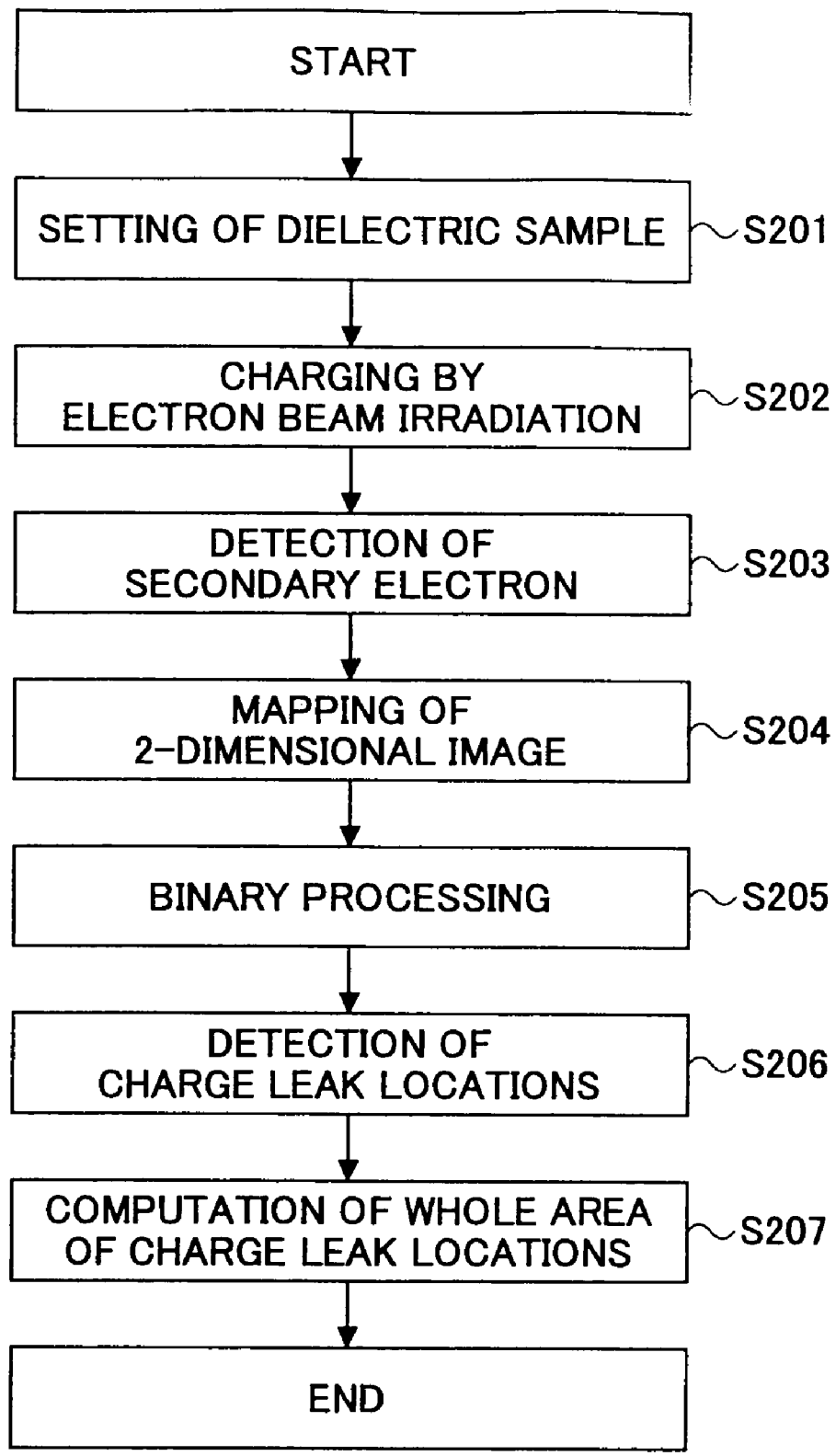
FIG. 31 is a flowchart for explaining the procedure of insulation resistance measurement.

FIG. 31 is a flowchart for explaining the procedure of insulation resistance measurement the measurement in the preferred embodiment of the invention.

As shown in FIG. 31, the dielectric-substance sample (for example, the latent-image support object.) is set in the measurement device (it is held by the support unit) (S201), and it is charged by the electron beam irradiation (S202).

Subsequently, the secondary electron which performs electronic line scanning and is generated by the dielectric-substance sample is detected (S203), and the 2-dimensional image is mapped based on the detection result (S204).

Figure 29B:
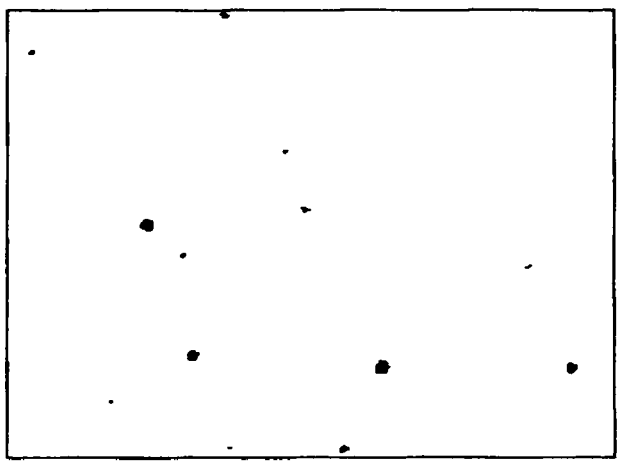

Subsequently, the data in each pixel of the mapped 2-dimensional image is converted into the binary value with a predetermined threshold level (S205). In this state, as shown in FIG. 29A or FIG. 29B, the monochrome image is obtained.

Then, the electric-charge leak location is determined (S206), and the gross area (computed as the sum of the number of the black pixels) of the electric-charge leak location (black portion) (S207). Then, the area percentage to the evaluation region is computed, and it is determined whether the latent-image support object is a conforming product based on the result of computation.

Figure 32:
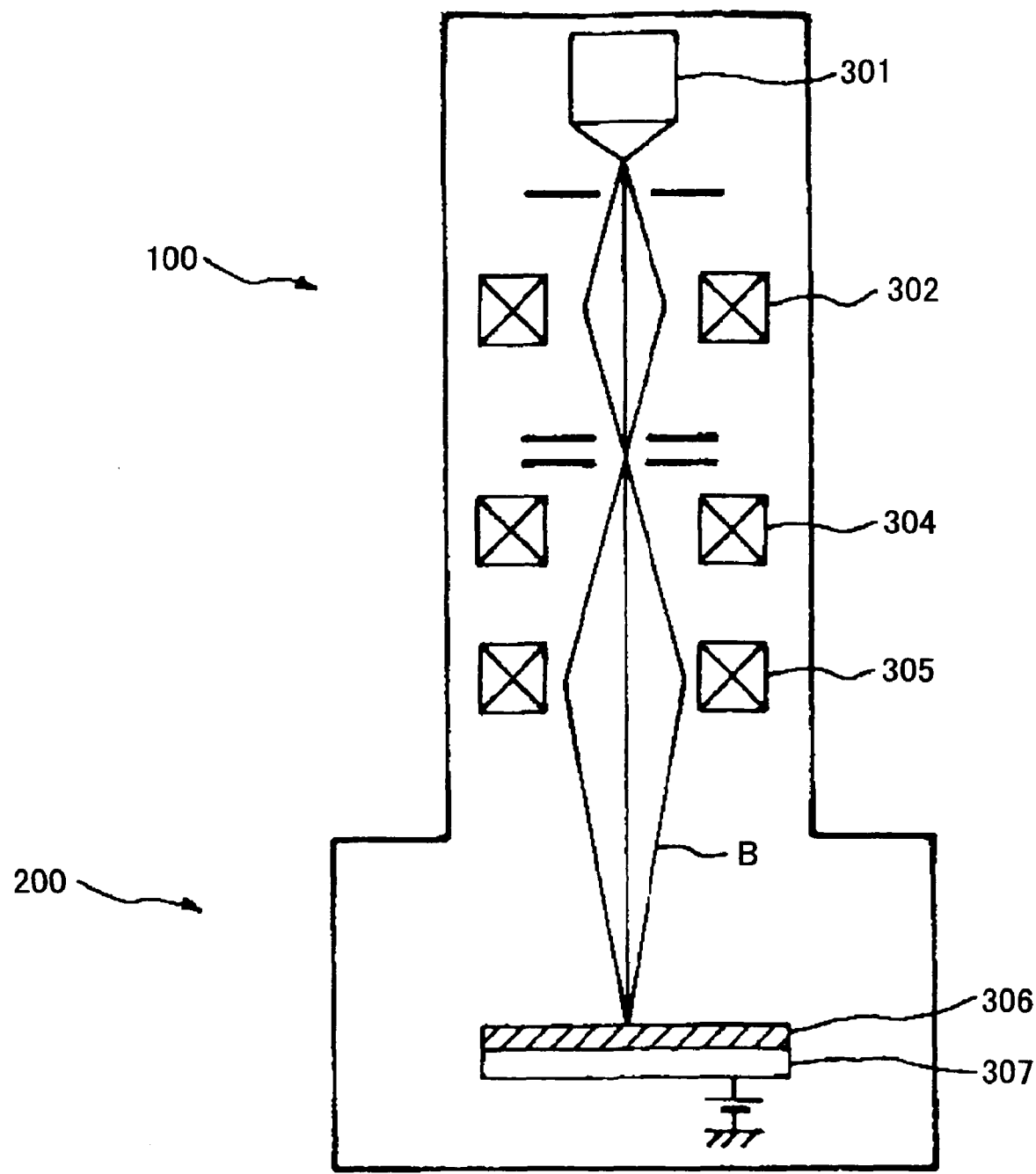
FIG. 32 is a diagram showing the composition of the electrostatic latent image measurement device in the preferred embodiment of the invention.

Next, FIG. 32 shows the composition of the electrostatic latent image measurement in the preferred embodiment of the invention.

In FIG. 32, the reference numeral 301 denotes the electron gun, 302 denotes the condenser lens, 303 denotes the beam blanker, 304 denotes the scanning lens, 305 denotes the objective lens, 306 denotes the sample, such as a photoconductor, 307 denotes the conductor, 100 denotes the charged particle irradiation unit, 200 denotes the sample installation unit, 306, and B denotes the electron beam or the ion beam, respectively.

The measurement device in this embodiment comprises the charged particle irradiation unit 100 which irradiates the charged particle beam, and the sample installation unit 200.

The charged particle in this embodiment is the particle which is influenced in the electric field, such as the electron beam or the ion beam, or the magnetic field.

In the following, the embodiment which irradiates the electron beam will be explained.

The electron beam irradiation unit 100 comprises the electron optical system, such as the beam blanker (not shown) for making ON/OFF the condenser lens 302 and electron beam for converging the electron beam generated from the electron gun 301 for generating the electron beam, and the electron gun 301, and the objective lens 305 for making the scanning lens 304 and scanning lens for making the inside of the charging region scan by the electron beam condense again. The power supply for the drive which is not illustrated is connected to each lens.

In addition, when the beam diameter is equivalent to the charging region, there may not be the scanning lens 304. It has the field which charges the sample, and composition which can impress potential Vg to the sample back surface.

The electron optics system and the sample unit are arranged in the vacuum so that the orbit where the electron is exact may be progressed.

The electron beam B is generated to irradiate the photoconductor sample 306. By setting the acceleration voltage E1 (>0) higher than the acceleration voltage E0 (>0) at which the secondary-electron-emission ratio delta is set to 1, so that the amount of incidence electrons exceeds the amount of discharge electrons, the electrons are accumulated in the sample and the charge increasing starts. Consequently, the sample 306 is charged in negative polarity. The desired charging potential can be formed by setting the acceleration voltage and the irradiation time appropriately.

In the present embodiment, the secondary-electron-emission ratio (delta) is represented by the formula delta=discharge electron/incidence electron. More strictly speaking, it is necessary to take into consideration the penetration electron and the reflection electron, and, in such a case, it is appropriate to consider the discharge electron in the above formula as the discharge electron=penetration electronic+reflection electron+secondary electron.

In this respect, E0 is an acceleration voltage of electrons at which the secondary-electron-emission ratio of the sample is equal to 1 when the back surface of the sample is grounded (GND). E0 is equivalent to charging starting potential.

Figure 33:
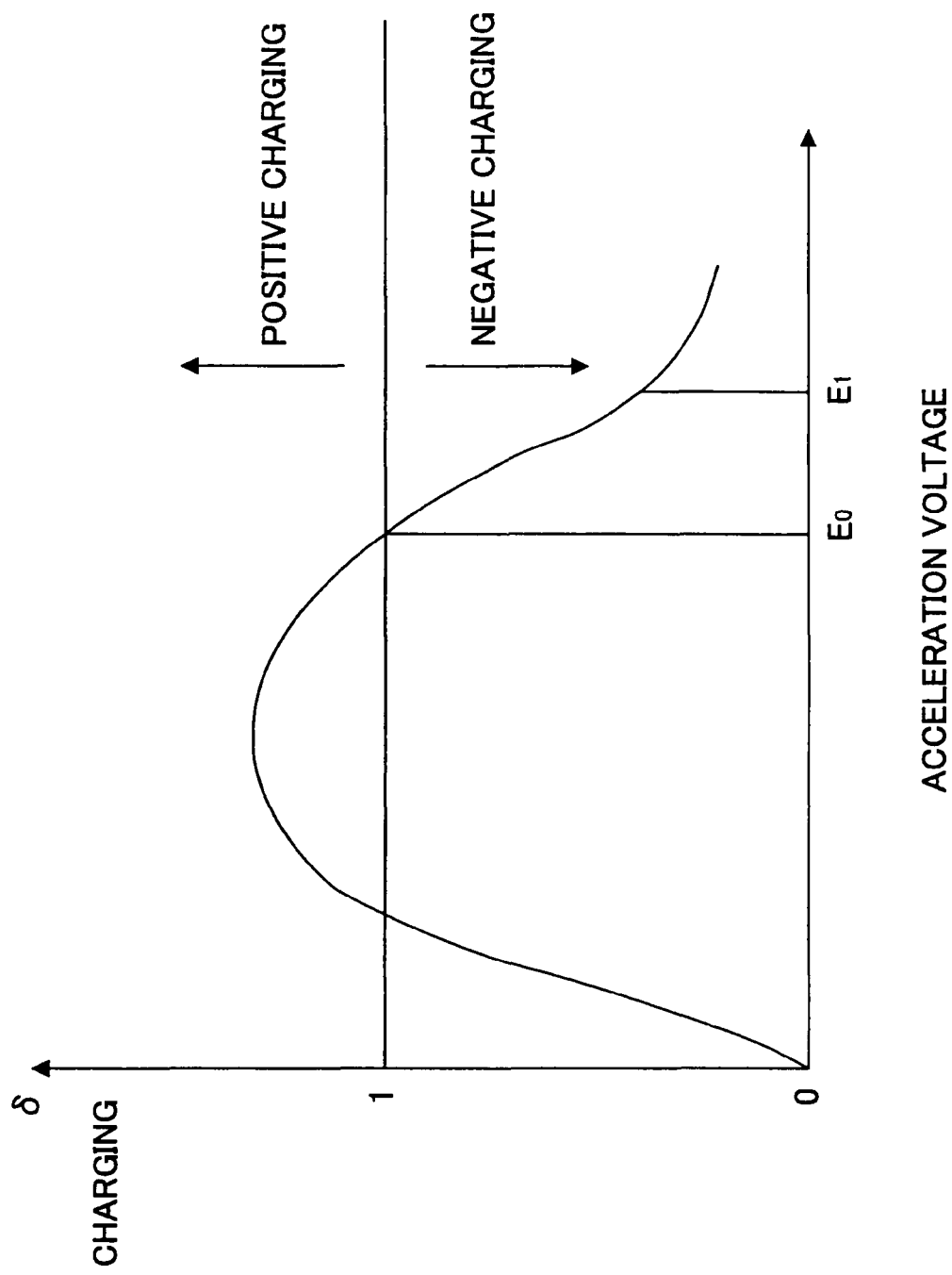
FIG. 33 is a diagram for explaining the relation between acceleration voltage and charging.
Figure 34:
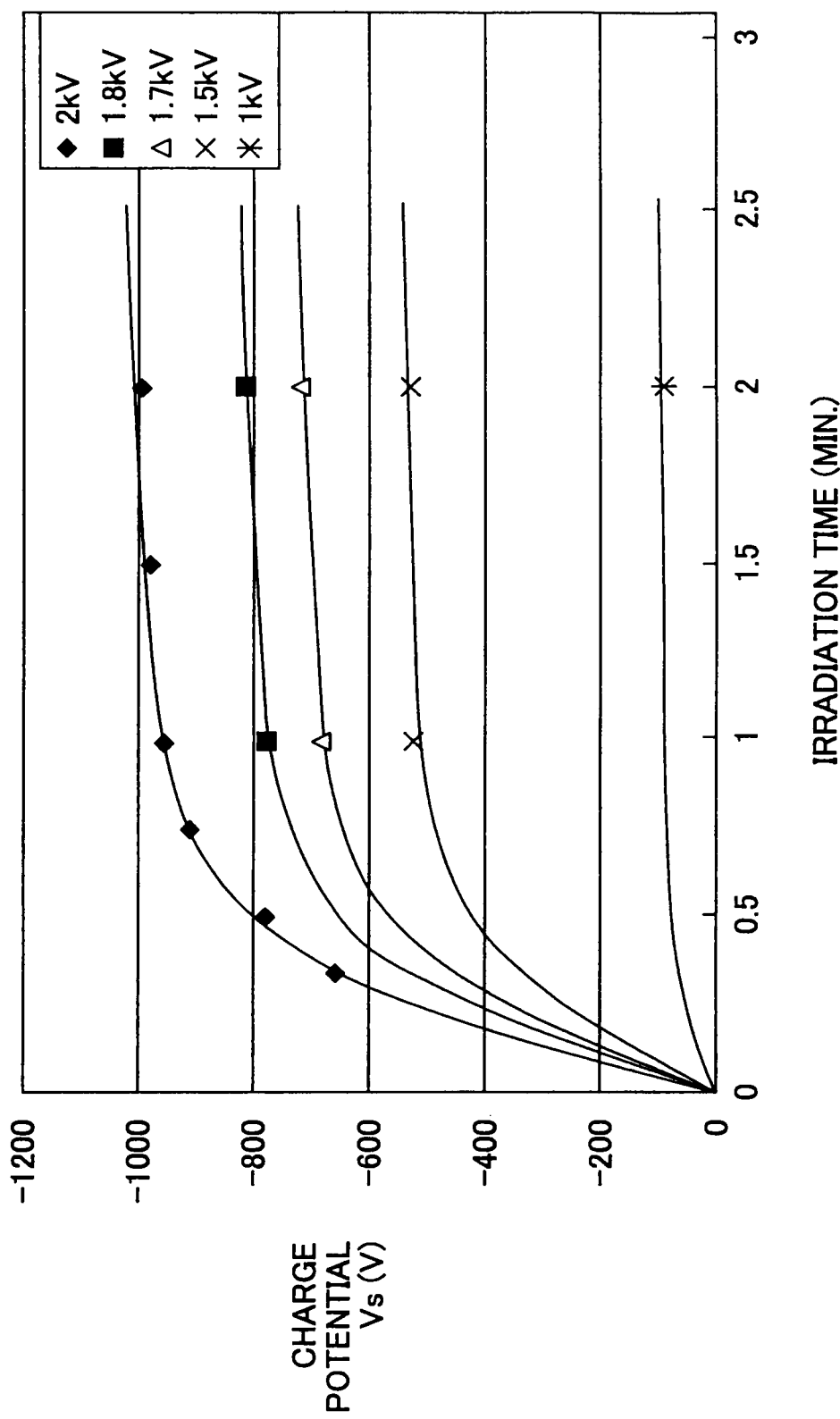
FIG. 34 is a diagram for explaining the relation between the irradiation time of the electron beam and the charging potential.
Figure 35:
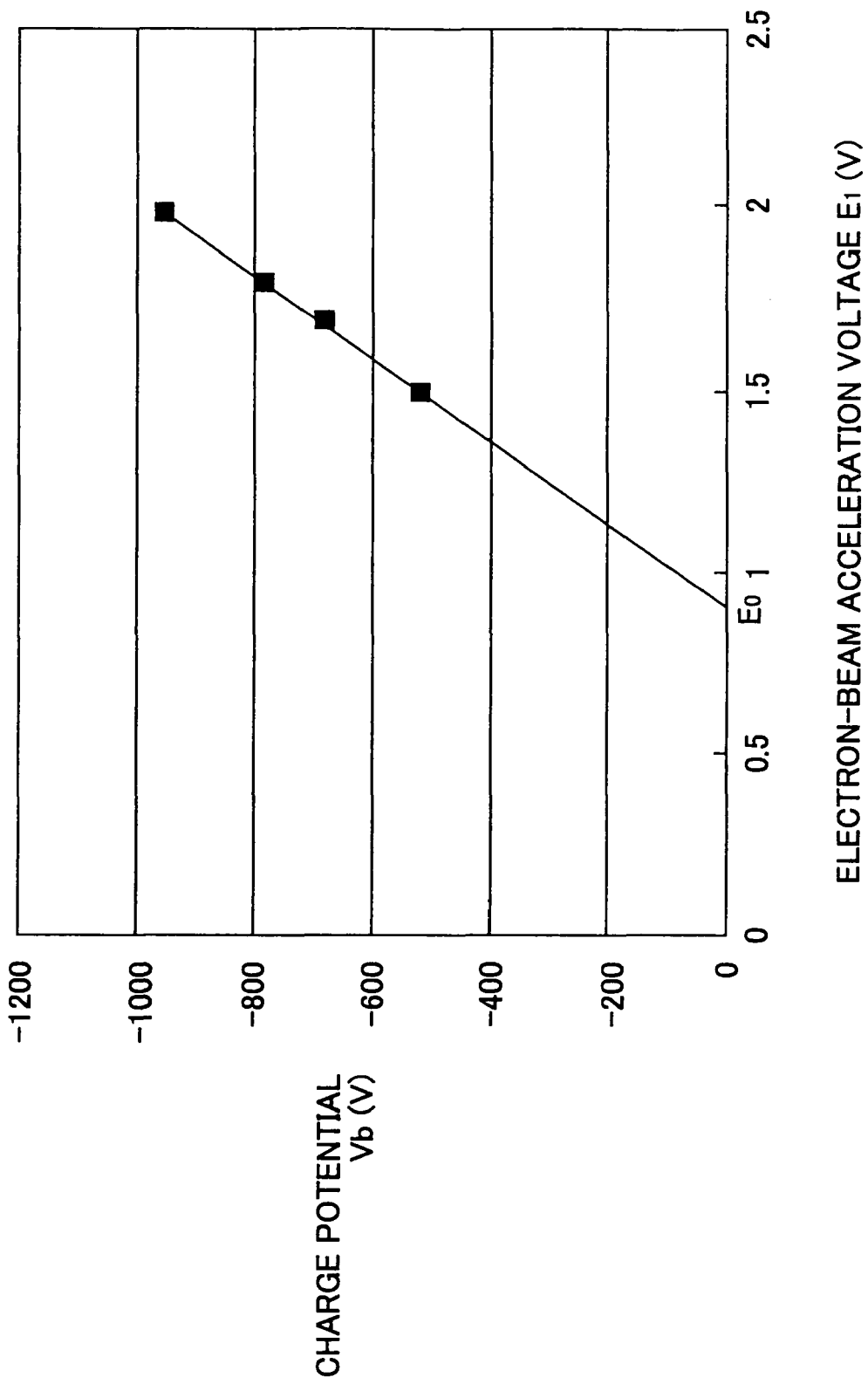
FIG. 35 is a diagram for explaining the relation between acceleration voltage and charging potential.

FIG. 33 shows the relation between acceleration voltage and charging. FIG. 34 shows the relation between the irradiation time of the electron beam and the charging potential. FIG. 35 shows the relation between acceleration voltage and charging potential.

Generally the secondary-electron-emission ratio delta is the relation like FIG. 33 depending on the energy of the electron beam, i.e., acceleration voltage.

In the acceleration voltage E1 (>0) used as delta=1, charging does not occur but equilibrium is maintained. In the case of the acceleration voltage E1>E0, it is set to delta<1, and there are few discharge electrons compared with the incidence electron number, it becomes negative charging.

The relation between acceleration voltage and irradiation time is shown in FIG. 34.

Although the electric charge is rapidly accumulated immediately after electron beam irradiation, according to progress of time, the incidence electron is slowed down under the influence of the negative charging potential of the sample. If the mass of electrons is set to m and the amount of electric charge is set to e, the speed (landing speed) v at the time of the electron surface attainment in the surface potential voltage Vp (>0) is represented by the formula $v=\{2e(E1+Vp)\}^{1/2}$ in approximation (1).

Therefore, with the electric charge accumulation (negative charging), the landing speed decreases, and the amount of electric charge accumulation per unit time decreases, namely: E1+Vp=E0. If it becomes the condition of Vp=E0−E1 (2), the balanced stable state will be reached and the state Vd, i.e., the saturation charging potential, where it is not charged any more will be reached.

FIG. 35 shows an example of the relation of the saturation charging potential of the acceleration voltage.

The surface potential voltage Vp is represented by the sum of the potential Vs of the sample electric charge accumulation side according to the sample surface charge density Qs and the potential Vg of the sample back surface, namely: Vp=Vs+Vg (3) where Vs=Q/C=d/(S×epsilon'×epsilon0)×Qs, epsilon' is the specific inductive capacity, epsilon0 is the dielectric constant of vacuum, Q is the amount of electric charge accumulation, S is the unit area, and d is the thickness of the sample. In this case, the characteristic values of the sample are fixed, and the relation of Vs∝Qs is materialized.

Figure 36:
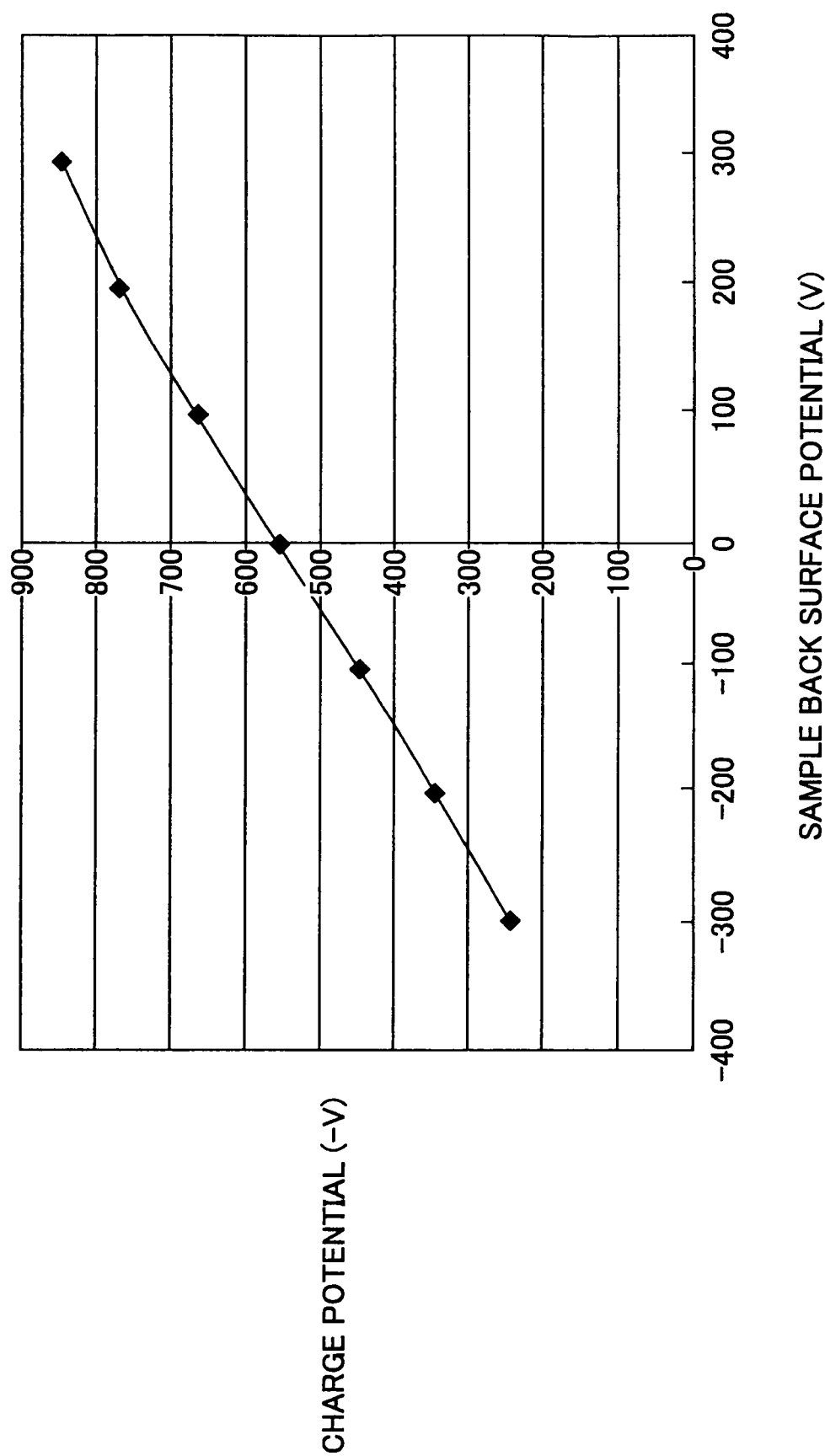
FIG. 36 is a diagram showing the measurement result in the present embodiment.

FIG. 36 shows the measurement result of the present embodiment. It is possible to control the potential Vs produced by the sample surface density of charge Qs by controlling the voltage Vg applied to the sample back surface, etc.

The measurement result of FIG. 36 is the result of measurement of the saturation charging potential when the acceleration voltage is fixed at 1.5 kV and the potential Vg of the back surface of the sample is varied. It is made into Vg=0V at the time of the measurement result. The polarity of the voltage is (−V).

At the time of Vg=0V, the potential is −550V. As a result of this, E0=−950V in this sample. If Vg is changed to the plus side, the incidence electron will be accelerated relatively, it will become easy to be charged, the amount of electric charge accumulation will increase, and charging potential will rise in the minus direction.

Moreover, if Vg is changed to the minus side, the incidence electron will be slowed down relatively, it will be hard coming to be charged, the amount of electric charge accumulation will decrease, and charging potential will fall.

Moreover, the following relation is materialized in the relation between charging potential and applied voltage by approximation: Saturation charging potential Vd (−V)=acceleration voltage E1(V)−charging starting potential E0 (V)+ applied voltage Vg (V) (4).

Therefore, if Vg=0 and the acceleration voltage of 1.5 kV, the sample can be charged only to −550V at the maximum. By applying the voltage of Vg=300V, the same sample can be charged to −850V. By applying a higher voltage for Vg, a higher charging potential can be obtained.

Since the amount of electric charge accumulation changes with time like FIG. 34, it is controlling Vg and charging time. It is possible to obtain the charging potential Vs which fulfills the conditions of |E1−E0+Vg|>=|Vs|. Since the acceleration voltage can stop low compared with the former the feature that there is little power dissipation and it is suitable for the environment and the control is also easy to perform.

It becomes impossible it not only to become difficult to control, since time to reach target charging potential will become short if acceleration voltage becomes large, but to disregard the damage to the sample. Therefore, the conditions which can form desired charging potential are desirable at as small acceleration voltage as possible. |Vs|<=|E1−E0+Vg|<=|Vs|+2 kV(5) is suitable.

Although about E1=1.75-3.75 kV is the proper range in the case of Vg=0 in order to charge Vs=−800V by this sample (E0=−950V), it is realizable by E1=1-3 kV and low acceleration voltage by setting up with Vg=750V.

In addition, what is necessary is just to increase the current density of the electron beam, in order to make it charged in short time.

Although the charging unit by lower voltage impression is applicable with the charging-among the atmosphere method, if it is in the vacuum, since the charged particle will not receive interference by the particle in the atmosphere, it can perform high charging formation of accuracy.

Figure 37:
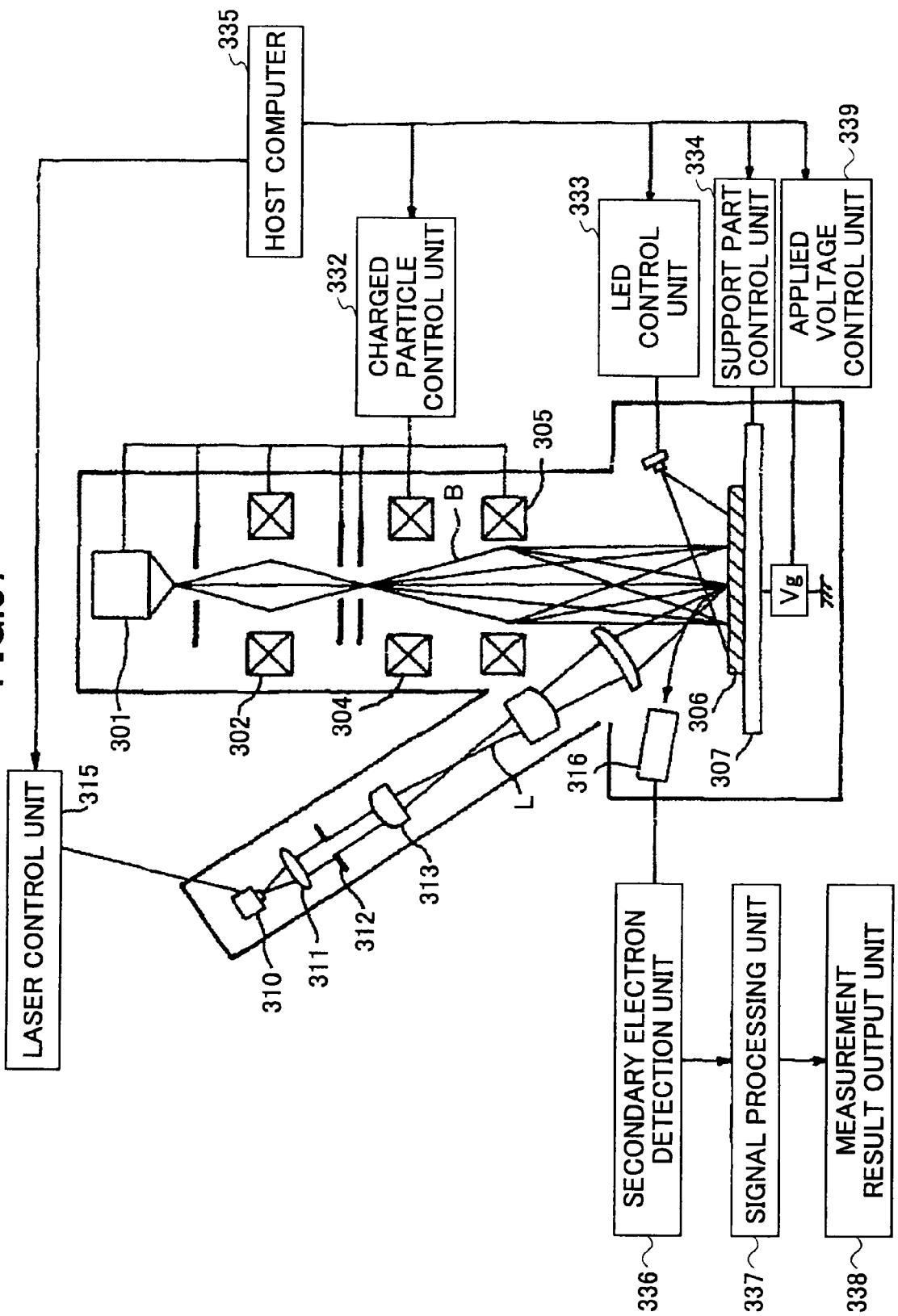
FIG. 37 is a diagram for explaining an example of the latent-image formation and the measurement.
Figure 38:
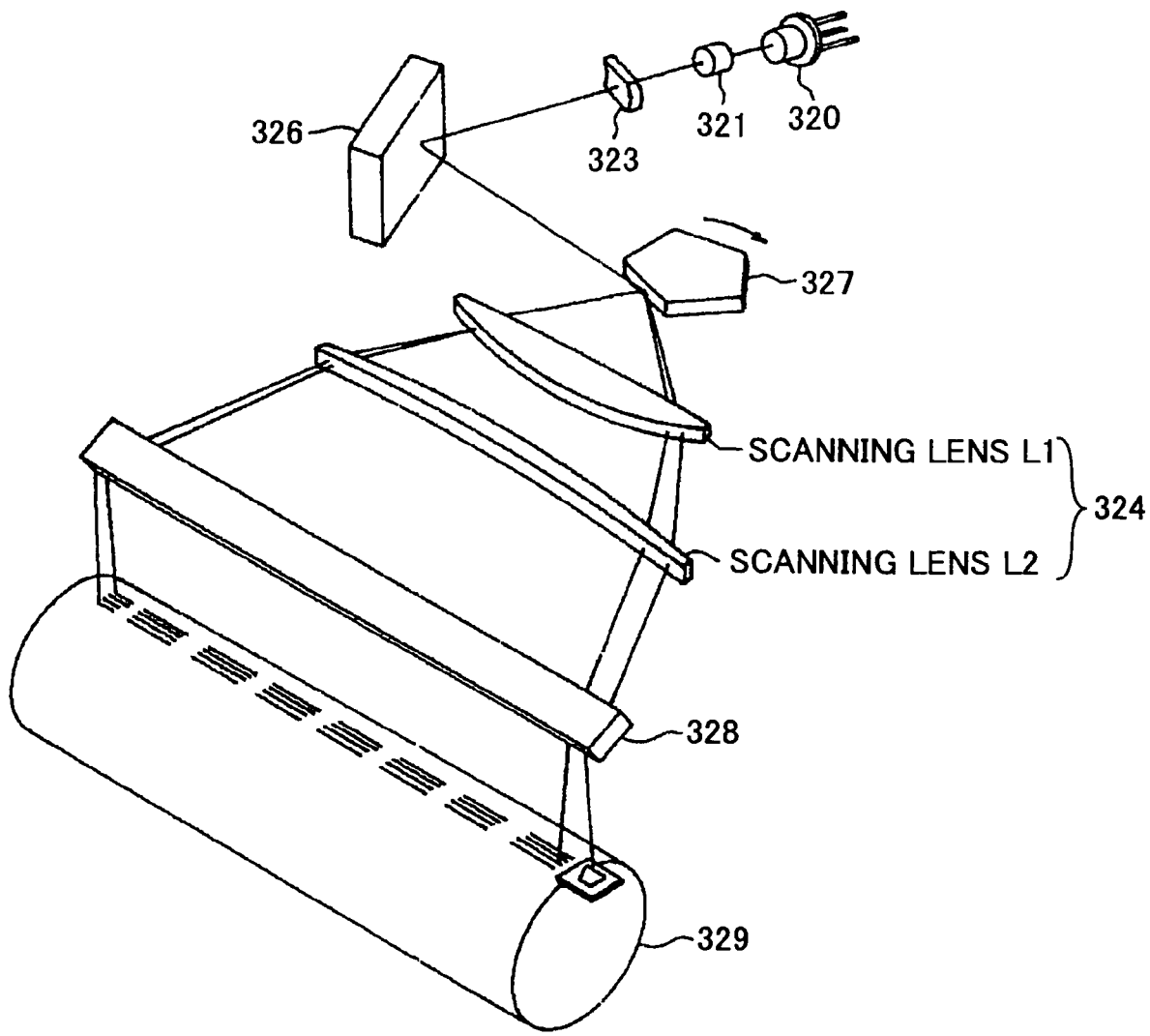
FIG. 38 is a diagram showing an example of the exposure optical system.

FIG. 37 is a diagram for explaining the example of latent-image formation and measurement. FIG. 38 is a diagram showing an example of the exposure optical system.

In FIG. 37, the reference numeral 310 denotes the light source, 311 denotes the collimator lens, 312 denotes the aperture, 313 denotes the scanning lens, 315 denotes the LD control unit, 316 denotes the electric charge detector, and 300 shows the exposure optical system, respectively.

In FIG. 38, the reference numeral 320 denotes the light source, 321 denotes the collimator lens, 323 denotes the cylinder lens, 324 denotes the scanning lens, 326 denotes the 1st reflector mirror, 327 denotes the polygon mirror, 328 denotes the 2nd reflector mirror, and 329 denotes the photoconductor drum, respectively.

The latent-image formation unit will now be explained. It is exposed by the exposure optical system 300 after charging of the predetermined quantity in the photoconductor sample 306 at the photoconductor sample 306.

The exposure optical system 300 is adjusted so that the desired beam diameter and the desired beam profile may be formed.

It comprises the light sources 310, such as LD (laser diode) which has the wavelength of the sensitivity region of the photoconductor sample 306, the collimator lens 311, aperture 312, the cylinder lens 313, the scanning lens 14, etc., and the desired beam diameter and the beam profile are created on the sample 306.

The suitable exposure time and exposure energy can be irradiated now by the LD control unit 315.

As shown in FIG. 38, arbitrary latent-image patterns including the line pattern can be formed to the direction of the main scanning of the photoconductor drum 329 by attaching the scanning mechanism using the polygon mirror 327. Thereby, the electrostatic latent image can be formed in the photoconductor sample.

The conditions are changed into the electrostatic latent image of the photoconductor sample, it scans by the electron beam, and the secondary electron emitted is detected by the electric charge detector (scintillator) 316, it changes into the electric signal, and the potential contrast image is measured.

If the electric charge distribution is shown in the sample surface, the electric field distribution according to the electric charge distribution will be formed in space. For this reason, the secondary electron generated by the incidence electron is put back by this electric field, and the quantity which reaches the detector 316 decreases.

Therefore, the portion with strong field strength is dark, contrast can attach the weak portion brightly and the contrast image according to the surface electric charge distribution can be detected. When it exposes, black and the non-exposing unit serve as the exposure unit white.

Therefore, when the electron beam scans the sample side and carries out the signal detection by it, the formed electrostatic latent image can be measured. When changing with setting conditions, you may rectify the signal strength on the detector.

Moreover, it is possible to carry out the calibration in advance. Moreover, it is possible to detect the reflection electron instead of the secondary electron. After the measurement end can remove the residual charge by using LED etc. and irradiating the whole sample side.

The composition of the control unit of the present invention is shown in FIG. 37.

Figure 39:
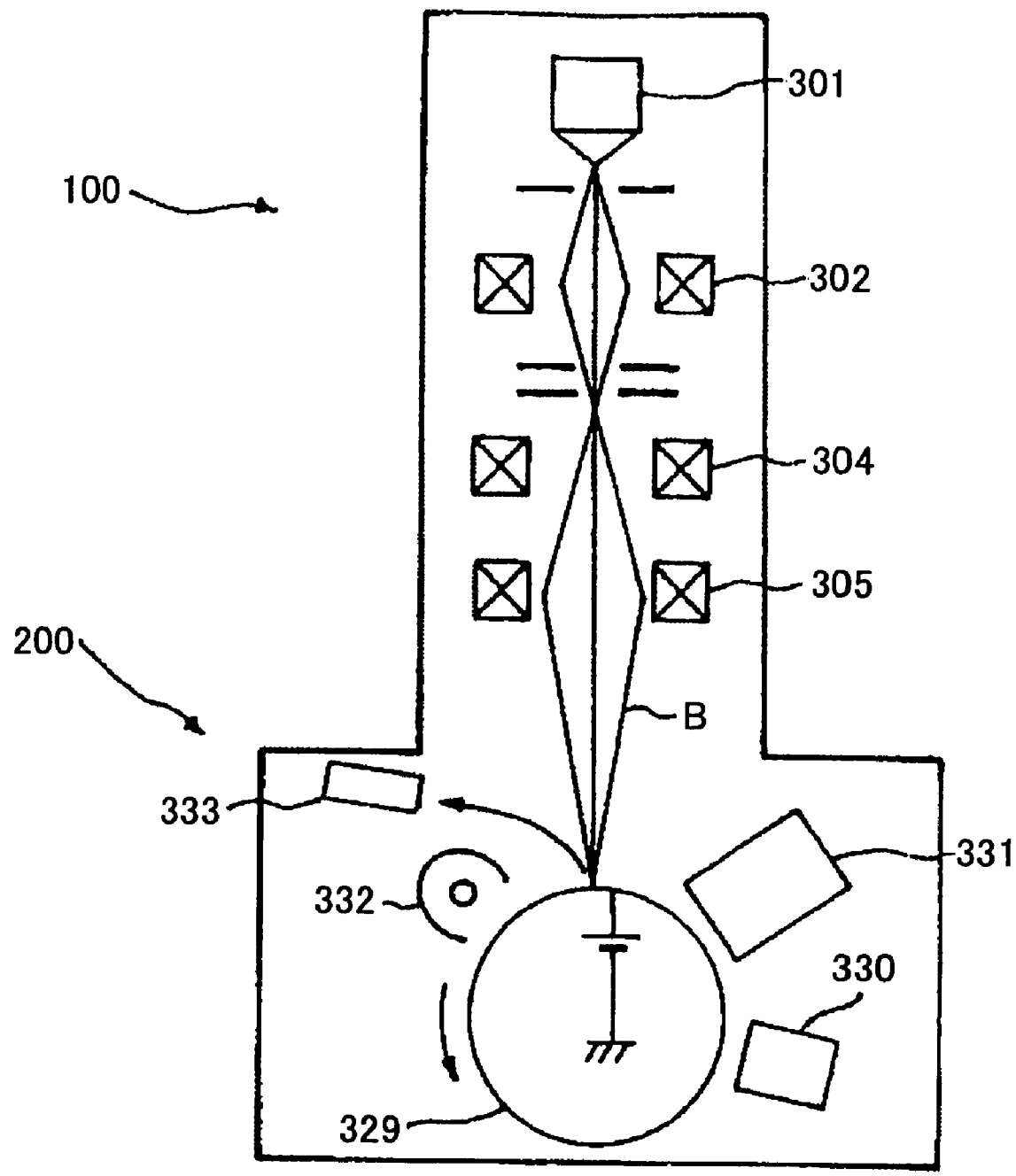
FIG. 39 is a diagram for explaining the embodiment which measures the electrostatic latent image of the photoconductor of cylinder form.

FIG. 39 is a diagram for explaining the embodiment which measures the electrostatic latent image of the photoconductor of cylinder form.

In the chamber, the electric discharge unit 332 for eliminating the exposure unit 331 for making the charging unit 330 for making the electric charge irradiate and the electric charge distribution form around the photoconductor sample 329 of cylinder form and the photoconductor sample and the electric charge is. The drive unit which can be rotated is attached in the photoconductor 329 to the photoconductor center axis.

There are the stepping motor, the DC-servo motor, etc. as the drive unit. As the charging unit 330, there are charging by electron beam irradiation, electric charge pouring charging, such as contact charging, etc. There is the LED etc. as the electric discharge unit. The operation of this embodiment will be described.

In the charging unit, it has the inner side of the photoconductor, i.e., the charging surface, and composition which can impress the voltage Vg of the opposite side, and the photoconductor is uniformly electrified so that the photoconductor surface may serve as desired potential, where the seal of approval of the voltage of Vg is carried out.

The applied voltage of the photoconductor lower electrode is set as the grounding state (GND).

In the exposure unit, light is irradiated to the photoconductor, the electric charge is missed partially, and the electrostatic latent image is formed.

In the measurement unit, the photoconductor sample is scanned by the electron beam, the electron emitted is detected by the scintillator, it changes into the electric signal, and the potential contrast image is observed.

In the electric discharge unit, the residual charge on the photoconductor is erased by irradiating LED etc. By using such a method, even if it is cylinder form, it is possible to measure the electrostatic latent image of the photoconductor. In addition, although the applied voltage of the photoconductor lower electrode was set as the grounding state (GND), voltage may be impressed depending on the image formation unit.

Figure 40:
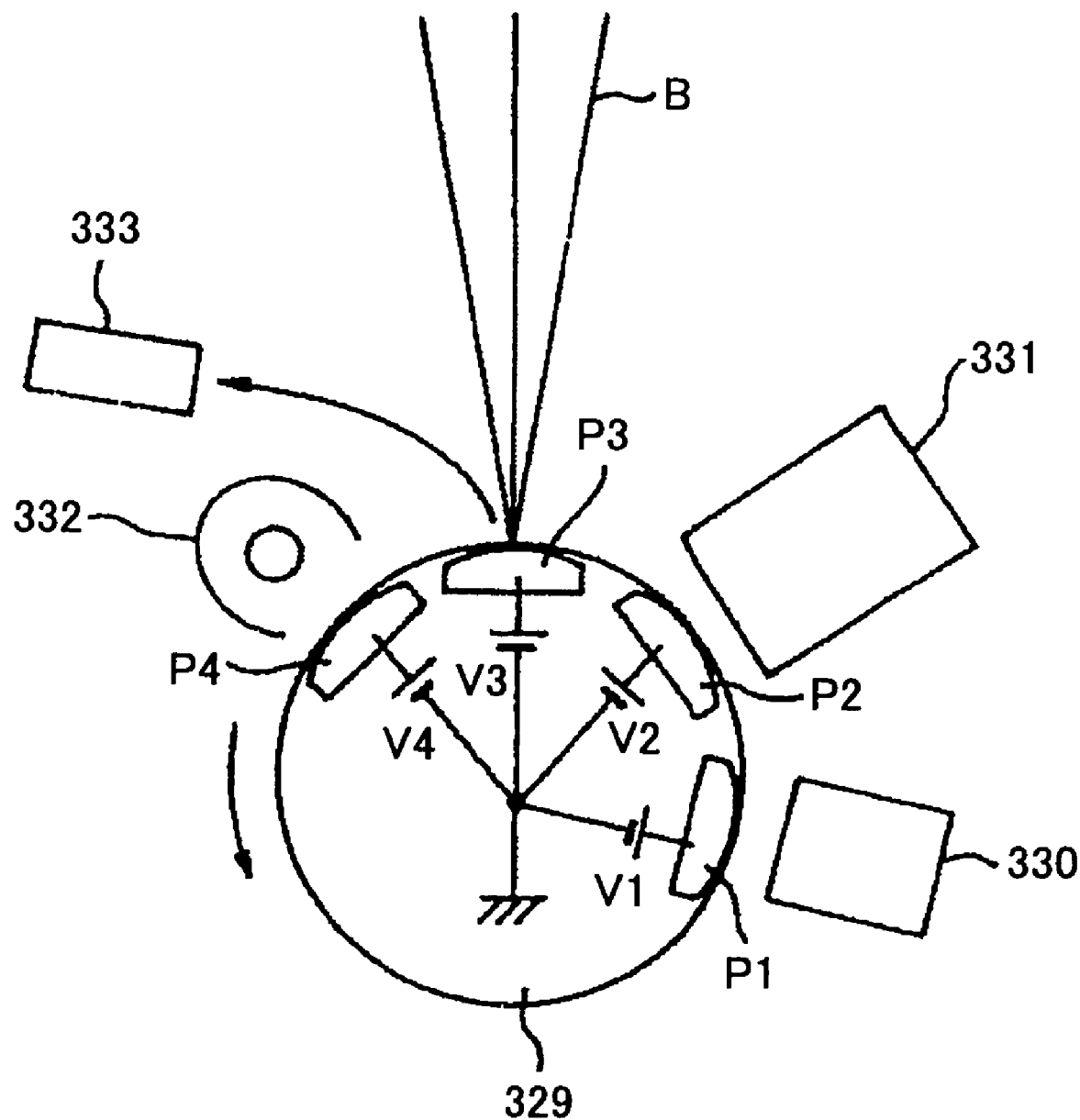
FIG. 40 is a diagram showing another embodiment which measures the electrostatic latent image of the photoconductor of cylinder form.

FIG. 40 is a diagram showing the composition of another embodiment.

In FIG. 40, the letter P denotes the opposite electrode. The photoconductor drum 329 which is the dielectric-substance unit rotates, and since the electric conduction unit to impress is fixed, it can impress the independent voltage by preparing opposite voltage for every impression process. The opposite electrode P is made fixation corresponding to the peripheral device of the photoconductor.

Figure 41:
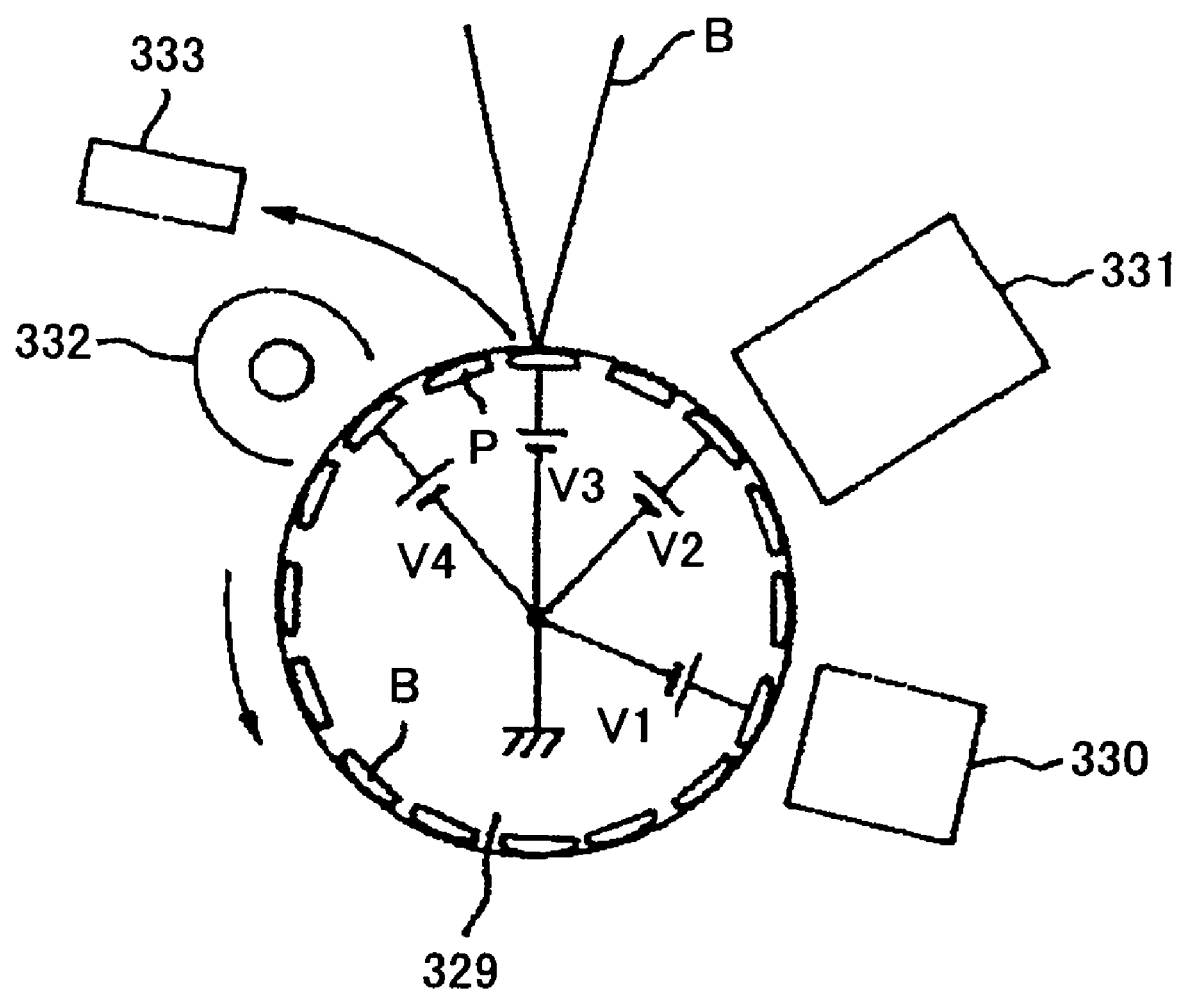
FIG. 41 is a diagram showing another embodiment which measures the electrostatic latent image of the photoconductor of cylinder form.

FIG. 41 is a diagram showing the composition of another embodiment.

In FIG. 41, the letter p denotes the conductor with the opposing electrodes. The inside conductor the portion p and the conductor by preparing the crevice between the insulated units between the portions p, it makes it possible to impress the voltage of the request which became independent in each process in this case, the conductor it may be made to correspond to the peripheral device, you may fix, and the portion p may make it rotate united with the photoconductor.

Figure 42:
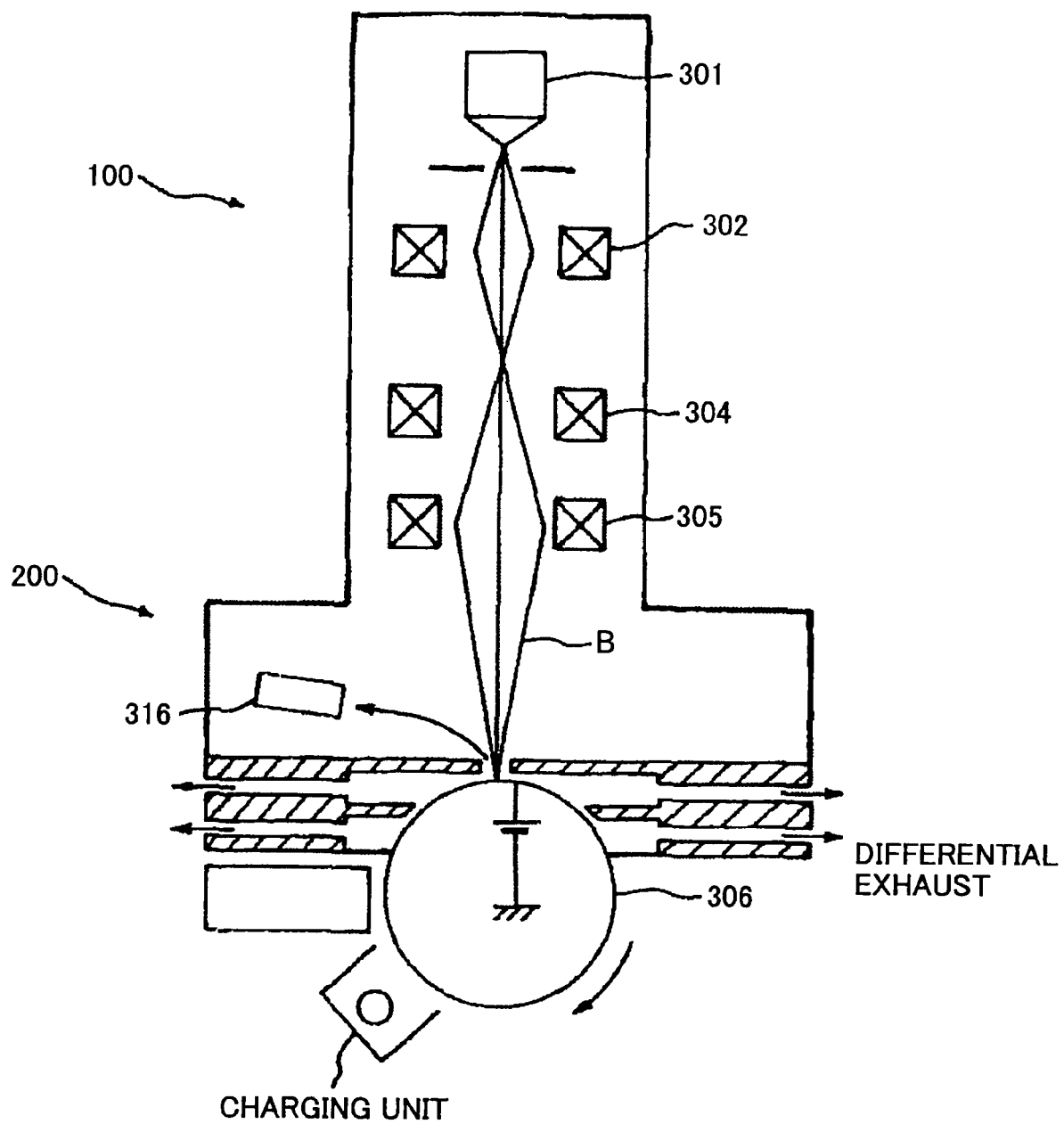
FIG. 42 is a diagram showing another embodiment which measures the electrostatic latent image of the photoconductor of cylinder form.
Figure 43:
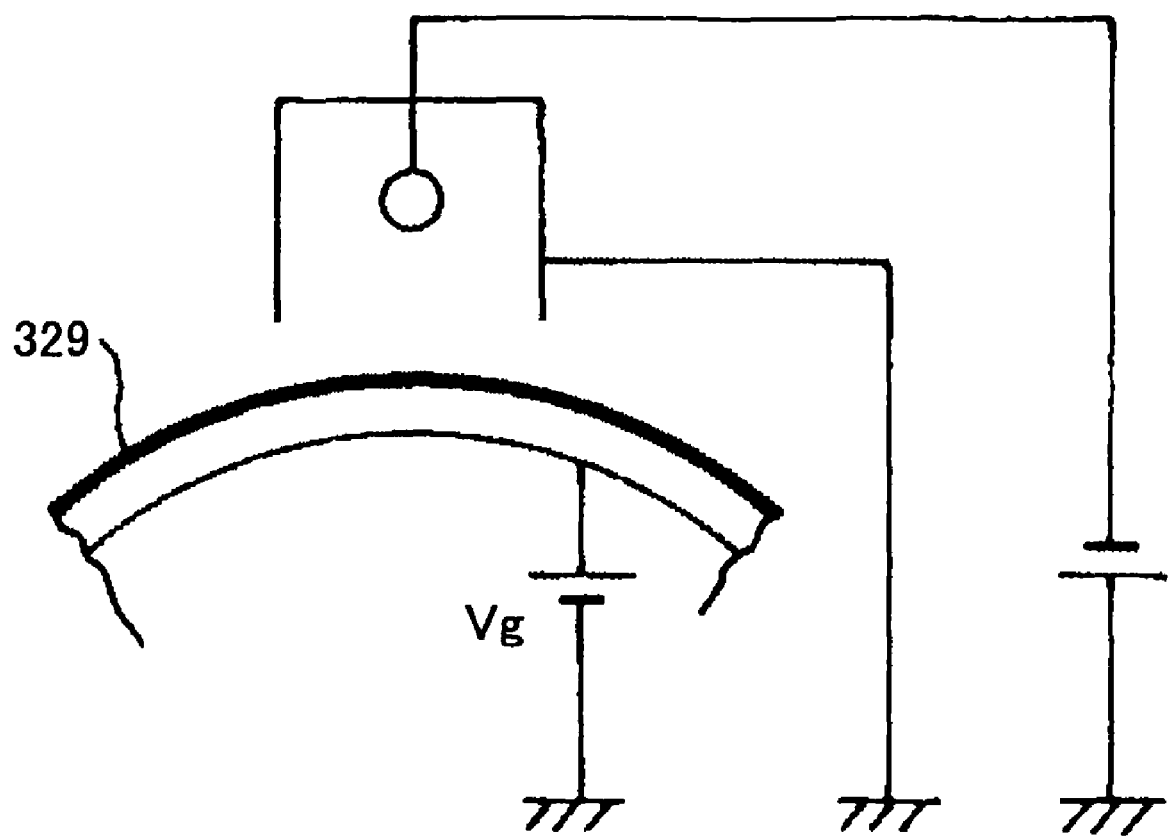
FIG. 43 is a diagram for explaining the charging unit.

FIG. 42 shows another embodiment. FIG. 43 is a diagram for explaining the charging unit which is the corotron changing device.

The photoconductor peripheral device is used for the image forming apparatus. It is charged in the atmosphere, the differential exhaust is used, and the latent image is measured in the vacuum state.

The corona discharging can be used as the charging unit in the atmosphere as shown in FIG. 43, and the corotron charging device or the like can be used, and the same effect as described above can be acquired by supplying the applied voltage to the lower part of the sample. In this case, a small amount of the ozone occurs and it is suitable for the environment.

In addition, it is possible to apply this charging device to the image forming apparatus.

As long as there is the sample by the dielectric substance, latent-image formation units may be the methods which form the electric charge distribution directly, such as the electrostatic recording method. When the sample is the photoconductor, the latent-image formation unit which includes the charging unit and the exposure unit may be used for the method.

Moreover, when the sample measures the photoconductor of cylinder form, it can take the composition shown in FIG. 42. By using such a method, it becomes possible to measure the electrostatic latent image of the photoconductor in the state near real use environment.

Moreover, it becomes possible to measure the distribution state of the electrostatic latent image for hundreds of or less ms equivalent to process speed.

The present invention is not limited to the above-described embodiments, and variations and modifications may be made without departing from the scope of the present invention.

The invention claimed is:

1. An insulation resistance measuring method comprising:
   charging a surface of a sample to give an electric field intensity in a thickness direction of the sample;
   scanning the charged surface of the sample in a two-dimensional manner by irradiating a charged particle beam to the sample;
   obtaining a detection signal generated by the scanning; and
   measuring a dielectric intensity of the sample based on the detection signal obtained,
   wherein the sample is a latent-image support object, and a dielectric intensity of the latent-image support object is measured by the measuring, and
   wherein the latent-image support object has a percentage of an insulation resistance region which is 99% or more when the electric field intensity given in the thickness direction of the latent-image support object is above 30 V/micrometer and below 40 V/micrometer and an amount of electric charge irradiated to the latent-image support object is above 1 E-8 coulomb/mm$^2$.

2. An insulation resistance measurement device comprising:
   a support unit holding a sample whose dielectric intensity is to be measured;
   a charging unit charging a surface of the sample held by the support unit and giving an electric field intensity in a thickness direction of the sample;

a scanning unit scanning the charged surface of the sample in a two-dimensional manner by irradiating a charged particle beam to the sample;

a signal-detection unit obtaining a detection signal generated by the scanning of the scanning unit; and a measurement unit measuring the dielectric intensity of the sample based on the detection signal obtained by the signal-detection unit, wherein the sample is a latent-image support object, and a dielectric intensity of the latent-image support object is measured by the measurement unit, and wherein the latent-image support object has a percentage of an insulation resistance region which is 99% or more when the electric field intensity given in the thickness direction of the latent-image support object is above 30 V/micrometer and below 40 V/micrometer and an amount of electric charge irradiated to the latent-image support object is about 1 E-8 coulomb/mm².

3. The insulation resistance measurement device according to claim 2 wherein the scanning unit is provided to irradiate an electron beam as the charged particle beam to scan the charged surface of the sample.

4. The insulation resistance measurement device according to claim 3 wherein the scanning unit which irradiates the electron beam performs the functions of the charging unit which charges the surface of the sample.

5. The insulation resistance measurement device according to claim 4 wherein the scanning unit which irradiates the electron beam is provided to include a condenser lens and an aperture, and change an amount of irradiation current selectively for one of acquisition of the detection signal and charging of the sample surface, by using the condenser lens and/or the aperture.

6. The insulation resistance measurement device according to claim 3, wherein the signal-detection unit is provided to obtain the detection signal by detecting secondary electrons generated by the scanning of the sample with the electron beam.

7. The insulation resistance measurement device according to claim 6 wherein an electric charge leak location in the sample is detected based on the detection signal which is obtained by detecting the secondary electrons.

8. A latent-image support object having a dielectric intensity measured by an insulation resistance measuring method, wherein the insulation resistance measuring method comprises:

charging a surface of the latent-image support object to give an electric field intensity in a thickness direction of the latent-image support object;

scanning the charged surface of the latent-image support object in a two-dimensional manner by irradiating a charged particle beam to the latent-image support object;

obtaining a detection signal generated by the scanning; and measuring the dielectric intensity of the latent-image support object based on the detection signal obtained, wherein the latent-image support object has a percentage of an insulation resistance region which is 99% or more when the electric field intensity given in the thickness direction of the latent-image support object is above 30 V/micrometer and below 40 V/micrometer and an amount of electric charge irradiated to the latent-image support object is above 1 E-8 coulomb/mm².

9. The latent-image support object according to claim 8 wherein the latent-image support object has a percentage of an electric charge leak region which is above 0.05% and below 1.0% when the electric field intensity given in the thickness direction of the latent-image support object is above 30 V/micrometer and below 40 V/micrometer and an amount of electric charge irradiated to the latent-image support object is above 1 E-8 coulomb/mm².

10. A latent-image support object having a dielectric intensity measured by an insulation resistance measurement device, wherein the insulation resistance measurement device comprises:

a support unit holding the latent-image support object; a charging unit charging a surface of the latent-image support object held by the support unit and giving an electric field intensity in a thickness direction of the latent-image support object;

a scanning unit scanning the charged surface of the latent-image support object in a two-dimensional manner by irradiating a charged particle beam to the latent-image support object; a signal-detection unit obtaining a detection signal generated by the scanning of the scanning unit; and a measurement unit measuring the dielectric intensity of the latent-image support object based on the detection signal obtained by the signal-detection unit, wherein the latent-image support object has a percentage of an insulation resistance region which is 99% or more when the electric field intensity given in the thickness direction of the latent-image support object is above 30 V/micrometer and below 40 V/micrometer and an amount of electric charge irradiated to the latent-image support object is above 1 E-8 coulomb/mm².

* * * * *